US011723211B2

(12) United States Patent
Seki et al.

(10) Patent No.: US 11,723,211 B2
(45) Date of Patent: Aug. 8, 2023

(54) SEMICONDUCTOR MEMORY DEVICE HAVING FERROELECTRIC FIELD EFFECT TRANSISTOR

(71) Applicant: Kioxia Corporation, Tokyo (JP)

(72) Inventors: Harumi Seki, Kawasaki (JP); Masumi Saitoh, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 38 days.

(21) Appl. No.: 17/194,591

(22) Filed: Mar. 8, 2021

(65) Prior Publication Data

US 2022/0093615 A1    Mar. 24, 2022

(30) Foreign Application Priority Data

Sep. 18, 2020 (JP) ................................. 2020-157961

(51) Int. Cl.
*H10B 51/30* (2023.01)
*H10B 51/10* (2023.01)
*H10B 51/20* (2023.01)

(52) U.S. Cl.
CPC ............. *H10B 51/30* (2023.02); *H10B 51/10* (2023.02); *H10B 51/20* (2023.02)

(58) Field of Classification Search
CPC ......... H01L 27/11585; H01L 27/11587; H01L 27/1159; H01L 27/11597; H01L 29/41741; H01L 29/41775; H01L 29/511; H01L 29/512; H01L 29/516; H01L 29/6684; H01L 29/78391; H10B 51/10; H10B 51/20; H10B 51/30
See application file for complete search history.

(56) References Cited

U.S. PATENT DOCUMENTS

| | | | |
|---|---|---|---|
| 9,954,167 B2 * | 4/2018 | Fujii | ...................... H01L 45/14 |
| 10,403,815 B2 | 9/2019 | Ino | |
| 10,446,749 B1 | 10/2019 | Yoshimura et al. | |
| 2019/0296234 A1 * | 9/2019 | Yoshimura | ......... G11C 13/0026 |
| 2020/0066868 A1 | 2/2020 | Ino et al. | |

(Continued)

FOREIGN PATENT DOCUMENTS

| | | |
|---|---|---|
| JP | 6121819 B2 | 4/2017 |
| JP | 6193828 B2 | 9/2017 |

(Continued)

*Primary Examiner* — Matthew E Warren
(74) *Attorney, Agent, or Firm* — Oblon, McClelland, Maier & Neustadt, L.L.P.

(57) ABSTRACT

A semiconductor memory device of an embodiment includes a first gate electrode layer and a second gate electrode layer extending parallel to each other, a semiconductor layer between the first and the second gate electrode layer intersecting with the first and the second gate electrodes, and a dielectric layer surrounding the semiconductor layer, the dielectric layer containing oxygen and one of hafnium oxide or zirconium, the dielectric layer including a first region containing crystal of orthorhombic or trigonal as a main component between the first gate electrode layer and the semiconductor layer, a second region containing crystal of orthorhombic or trigonal as a main component between the second gate electrode layer and the semiconductor layer, and a third region containing a substance other than crystal of orthorhombic or trigonal as a main component between the first region and the second region.

16 Claims, 55 Drawing Sheets

(56) References Cited

U.S. PATENT DOCUMENTS

| | | | |
|---|---|---|---|
| 2020/0091180 A1 | 3/2020 | Seki et al. | |
| 2020/0119047 A1* | 4/2020 | Yoo | H01L 27/11597 |
| 2021/0082957 A1* | 3/2021 | Sakuma | H01L 27/249 |
| 2021/0280601 A1 | 9/2021 | Kashiyama. et al. | |
| 2021/0358925 A1* | 11/2021 | Takahashi | H01L 27/11587 |
| 2021/0375888 A1* | 12/2021 | Lu | H01L 29/66969 |

FOREIGN PATENT DOCUMENTS

| | | |
|---|---|---|
| JP | 2018-37441 A | 3/2018 |
| JP | 2019-169573 A | 10/2019 |
| JP | 2019-169574 A | 10/2019 |
| JP | 2020-47642 A | 3/2020 |
| JP | 2021-141283 A | 9/2021 |

\* cited by examiner

SEMICONDUCTOR MEMORY DEVICE HAVING FERROELECTRIC FIELD EFFECT TRANSISTOR

CROSS-REFERENCE TO RELATED APPLICATION

This application is based upon and claims the benefit of priority from Japanese Patent Application No. 2020-157961, filed on Sep. 18, 2020, the entire contents of which are incorporated herein by reference.

FIELD

Embodiments described herein relate generally to a semiconductor memory device.

BACKGROUND

A ferroelectric memory attracts attention as a non-volatile memory. For example, there is a ferroelectric FET (FeFET) type three-terminal memory in which a ferroelectric layer is applied to a gate insulating layer of a transistor of field effect transistor (FET) type to modulate a threshold voltage of the transistor. The threshold voltage of the transistor is modulated by changing a polarization state of the ferroelectric layer.

A three-dimensional NAND flash memory in which memory cells are disposed three-dimensionally realizes a high degree of integration and a low cost. In the three-dimensional NAND flash memory, for example, a memory hole penetrating a stacked body is formed in the stacked body obtained by alternately stacking a plurality of insulating layers and a plurality of gate electrode layers. By applying the FeFET type three-terminal memory as the memory cell of the three-dimensional NAND flash memory, the gate insulating layer may be thinned. Therefore, a hole diameter of the memory hole may be reduced, and the memory cell may be scaled-down. Therefore, by applying the FeFET type three-terminal memory, it becomes possible to further increase the degree of integration of the memory.

As the memory cell is scaled-down, for example, control of the polarization state of the ferroelectric layer might become difficult, and an operation of the memory cell might become unstable. Therefore, it is desired to realize the three-dimensional NAND flash memory that operates stably even in a case where the memory cell is scaled-down.

DETAILED DESCRIPTION

Figure 1:
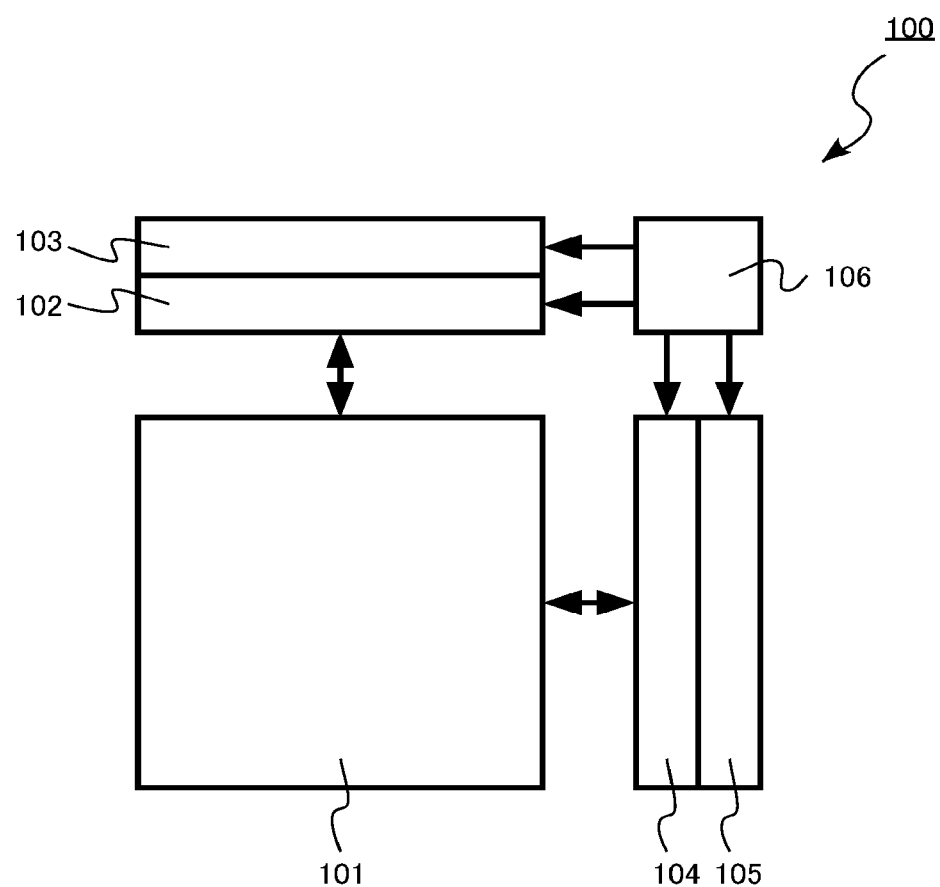
FIG. 1 is a block diagram of a semiconductor memory device of a first embodiment.

A semiconductor memory device of embodiments includes, a first gate electrode layer extending in a first direction; a second gate electrode layer extending in the first direction, and the second gate electrode layer spaced from the first gate electrode layer in a second direction intersecting with the first direction; a semiconductor layer provided between the first gate electrode layer and the second gate electrode layer, the semiconductor layer extending in a third direction intersecting with the first direction and the second direction; and a dielectric layer surrounding the semiconductor layer, the dielectric layer containing oxygen and at least one of hafnium or zirconium, the dielectric layer including a first region containing crystals of an orthorhombic crystal system or a trigonal crystal system as a main component substance, the first region provided between the first gate electrode layer and the semiconductor layer, the dielectric layer including a second region containing at least one crystal of the orthorhombic crystal system or the trigonal crystal system as a main component substance, the second region provided between the second gate electrode layer and the semiconductor layer, the dielectric layer including a third region containing a substance other than at least one crystal of the orthorhombic crystal system or the trigonal crystal system as a main component substance, the third region provided between the first region and the second region.

Hereinafter, embodiments are described with reference to the drawings. Note that, in the following description, the same reference sign is assigned to the same or similar members and the like, and the description of the member and the like described once is appropriately omitted.

In this specification, there is a case where the term "upper" or "lower" is used for convenience. "Upper" or "lower" is the term that merely indicates a relative positional relationship in the drawing, and does not define a positional relationship with respect to the gravity.

Qualitative analysis and quantitative analysis of chemical composition of members forming a semiconductor memory device in this specification may be performed by, for example, secondary ion mass spectrometry (SIMS), energy dispersive X-ray spectroscopy (EDX), electron energy loss spectroscopy (EELS) and the like. For measuring thicknesses of the members forming the semiconductor memory device, a distance between the members and the like, for example, a transmission electron microscope (TEM) may be used. For identification of crystal systems of components of the members forming the semiconductor memory device and comparison of existence ratios of the crystal systems, for example, a transmission electron microscope, X-ray diffraction (XRD), electron beam diffraction (EBD), X-ray photoelectron spectroscopy (XPS), and synchrotron radiation X-ray absorption fine structure (XAFS) may be used.

In this specification, a "ferroelectric" means a substance having spontaneous polarization (spontaneous polarization) without an electric field externally applied in which the polarization is inverted when the electric field is externally applied. In this specification, a "paraelectric" means a substance in which polarization occurs when an electric field is applied and the polarization disappears when the electric field is removed.

In this specification, "metal" is a general term of substances displaying metallic properties, and for example, metal nitride and metal carbide displaying metallic properties are also included in a range of "metal".

First Embodiment

A semiconductor memory device of a first embodiments includes, a first gate electrode layer extending in a first direction; a second gate electrode layer extending in the first direction, and the second gate electrode layer spaced from the first gate electrode layer in a second direction intersecting with the first direction; a semiconductor layer provided between the first gate electrode layer and the second gate electrode layer, the semiconductor layer extending in a third direction intersecting with the first direction and the second direction; and a dielectric layer surrounding the semiconductor layer, the dielectric layer containing oxygen and at least one of hafnium or zirconium, the dielectric layer including a first region containing at least one crystal of an orthorhombic crystal system or a trigonal crystal system as a main component substance, the first region provided between the first gate electrode layer and the semiconductor layer, the dielectric layer including a second region containing at least one crystal of the orthorhombic crystal system or the trigonal crystal system as a main component substance, the second region provided between the second gate electrode layer and the semiconductor layer, the dielectric layer including a third region containing a substance other than at least one crystal of the orthorhombic crystal system or the trigonal crystal system as a main component substance, the third region provided between the first region and the second region.

The semiconductor memory device of the first embodiment is a three-dimensional ferroelectric memory 100. The three-dimensional ferroelectric memory 100 of the first embodiment is a ferroelectric memory to which a FeFET type three-terminal memory is applied as a memory cell MC.

FIG. 1 is a block diagram of the semiconductor memory device of the first embodiment. FIG. 1 illustrates a circuit configuration of the three-dimensional ferroelectric memory 100 of the first embodiment. As illustrated in FIG. 1, the three-dimensional ferroelectric memory 100 is provided with a memory cell array 101, a word line driver circuit 102, a row decoder circuit 103, a sense amplifier circuit 104, a column decoder circuit 105, and a control circuit 106.

Figure 2:
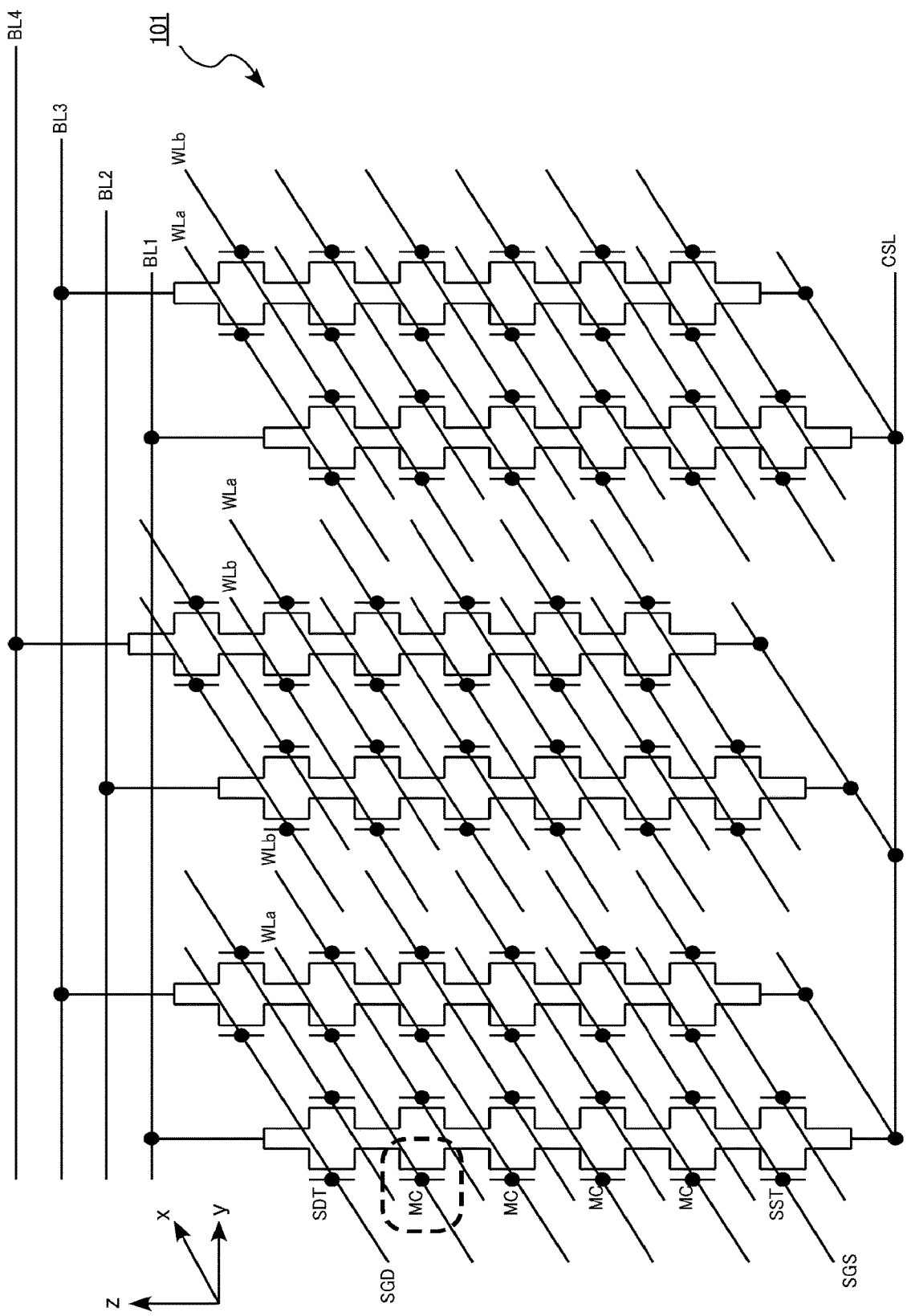
FIG. 2 is an equivalent circuit diagram of a memory cell array of the semiconductor memory device of the first embodiment.

FIG. 2 is an equivalent circuit diagram of the memory cell array of the semiconductor memory device of the first embodiment. FIG. 2 schematically illustrates a wiring structure in the memory cell array 101. The memory cell array 101 of the first embodiment has a three-dimensional structure in which a plurality of memory cells MCs is sterically disposed.

Hereinafter, an x direction illustrated in FIG. 2 is an example of a first direction. A y direction is an example of a second direction. A z direction is an example of a third direction. The y direction intersects with the x direction. The z direction intersects with the x and y directions. For example, the x direction is orthogonal to the y direction. For example, the z direction is orthogonal to the x and y directions.

As illustrated in FIG. 2, the memory cell array 101 is provided with a plurality of memory cells MCs, a source selection transistor SST, a drain selection transistor SDT, a plurality of word lines WLa and WLb, a plurality of bit lines BL1 to BL4, a common source line CSL, a source selection gate line SGS, and a plurality of drain selection gate lines SGD.

A plurality of memory cells MCs is connected in series in the z direction. A plurality of memory cells MCs is connected between the source selection transistor SST and the drain selection transistor SDT.

The memory cell MC is a FeFET a gate insulating layer of which is a ferroelectric. A threshold voltage of a transistor of the memory cell MC changes depending on a polarization state of the gate insulating layer. When the threshold voltage of the transistor changes, an on-current of the transistor changes. For example, when a state in which the threshold voltage is high and the on-current is low is defined as data "0" and a state in which the threshold voltage is low and the on-current is high is defined as data "1", the memory cell MC may store one-bit data of "0" and "1".

The word lines WLa and WLb extend in the x direction. The word lines WLa and WLb are connected to a gate electrode of the memory cell MC. The word lines WLa and WLb control a gate voltage of the memory cell MC.

The word line WLa and the word line WLb are electrically separated from each other. The word line WLa and the word line WLa are electrically connected to each other. The word line WLb and the word line WLb are electrically connected to each other.

The source selection transistor SST is electrically connected to the common source line CSL. The source selection transistor SST is controlled by a voltage applied to the source selection gate line SGS.

The drain selection transistor SDT is connected to BL1 to BL4. The drain selection transistor SDT is controlled by a voltage applied to the drain selection gate line SGD.

A plurality of word lines WLa and WLb is electrically connected to the word line driver circuit 102. A plurality of bit lines BL1 to BL4 is connected to the sense amplifier circuit 104.

The row decoder circuit 103 has a function of selecting the word line WLa or WLb according to an input row address signal. The word line driver circuit 102 has a function of applying a predetermined voltage to the word line WLa or WLb selected by the row decoder circuit 103.

The column decoder circuit 105 has a function of selecting the bit line BL according to an input column address signal. The sense amplifier circuit 104 has a function of applying a predetermined voltage to the bit line BL selected by the column decoder circuit 105. This also has a function of detecting and amplifying a current or a voltage flowing through the selected bit line BL.

The control circuit 106 has a function of controlling the word line driver circuit 102, the row decoder circuit 103, the sense amplifier circuit 104, the column decoder circuit 105, and other circuits not illustrated.

Circuits such as the word line driver circuit 102, the row decoder circuit 103, the sense amplifier circuit 104, and the column decoder circuit 105 are formed of, for example, transistors using semiconductor layers not illustrated and wiring layers.

For example, in FIG. 2, in a case of reading the data stored in the memory cell MC enclosed by a broken line, a read voltage is applied to the word line WLa connected to the gate electrode of the memory cell MC. When the transistor of the memory cell MC is turned on, a current flow between the common source line CSL and the bit line BL1. The data stored in the memory cell MC is determined based on the current flowing between the common source line CSL and the bit line BL1.

For example, the current flowing through the bit line BL1 is amplified by the sense amplifier circuit 104, and the control circuit 106 determines the data stored in the memory cell MC. Alternatively, a change in voltage in the bit line BL1 is amplified by the sense amplifier circuit 104, and the control circuit 106 determines the data stored in the memory cell MC.

FIG. 2 illustrates a case where there are four memory cells MCs connected in series and four bit lines, but the number of memory cells MCs connected in series and the number of bit lines are not limited to four.

Figure 3:
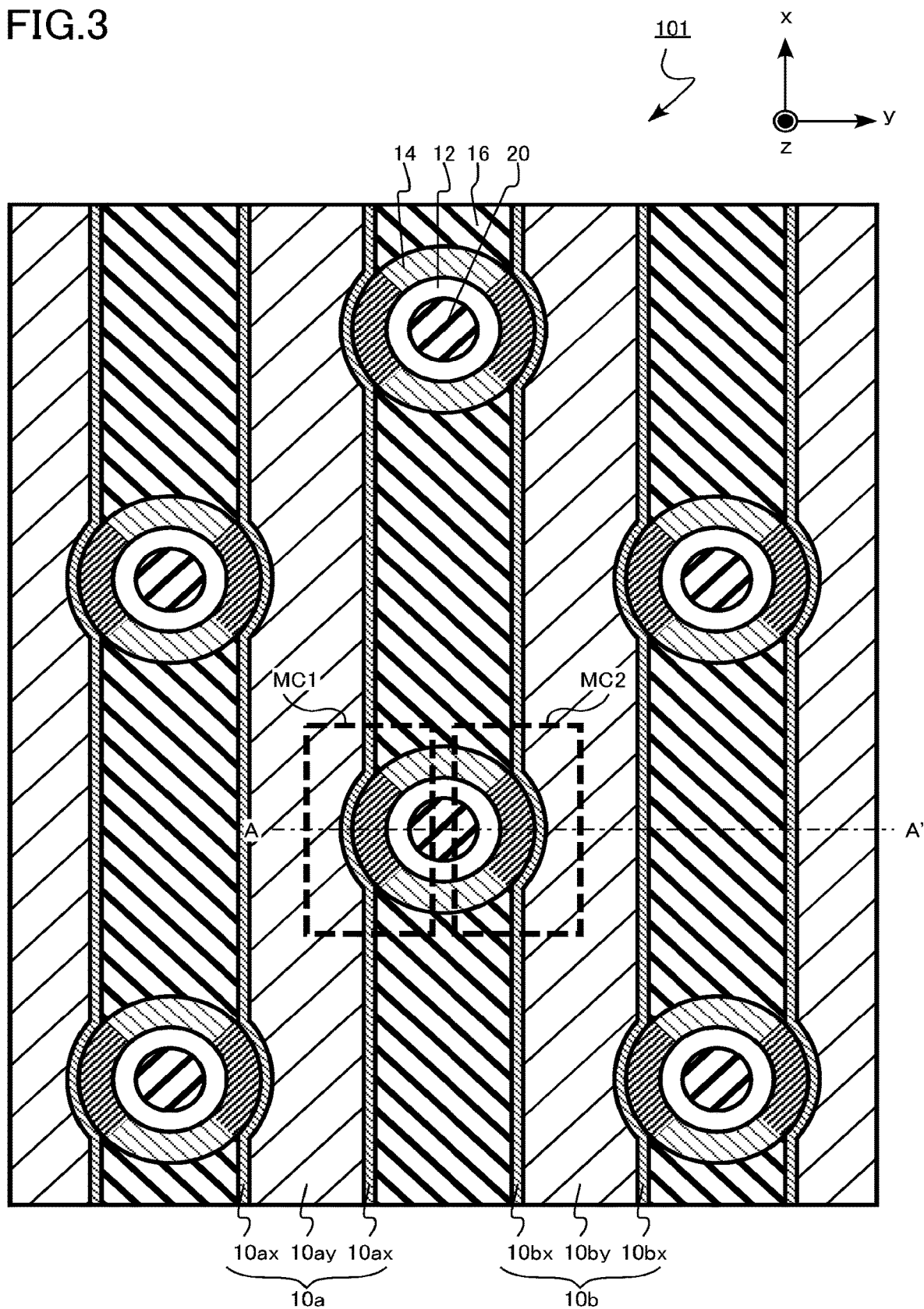
FIG. 3 is a schematic cross-sectional view of a part of the memory cell array of the semiconductor memory device of the first embodiment.
Figure 4:
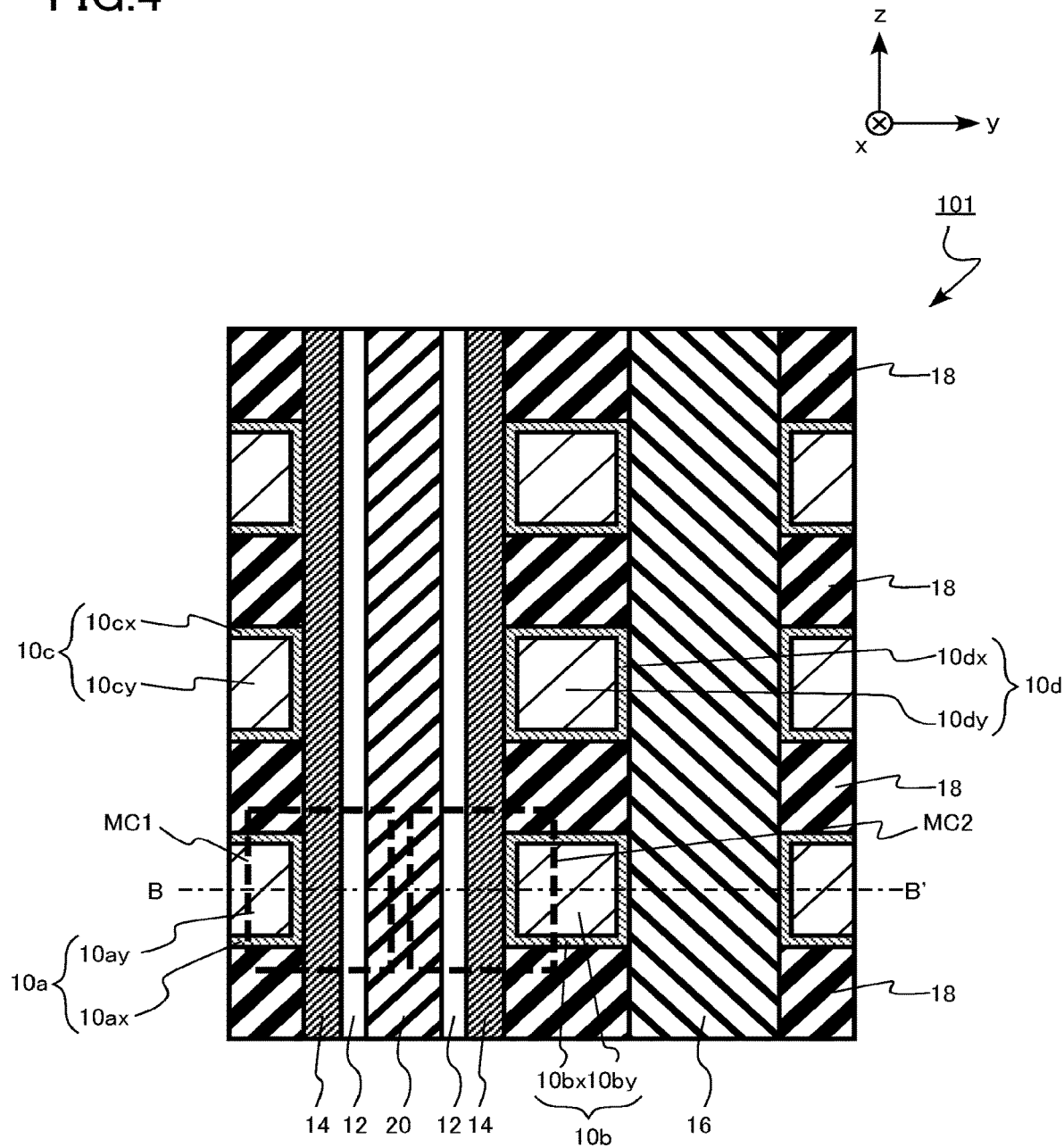
FIG. 4 is a schematic cross-sectional view of a part of the memory cell array of the semiconductor memory device of the first embodiment.

FIGS. 3 and 4 are schematic cross-sectional views of a part of the memory cell array of the semiconductor memory device of the first embodiment. FIG. 3 is an xy cross-section of the memory cell array 101. FIG. 3 is a cross-section including a BB' plane in FIG. 4. FIG. 4 is a yz cross-section of the memory cell array 101. FIG. 4 is a cross-section taken along line AA' in FIG. 3.

In FIGS. 3 and 4, a region enclosed by a broken line is one memory cell MC. FIGS. 3 and 4 illustrate memory cells MC1 and MC2 adjacent to each other in the y direction.

The memory cell array 101 includes a first gate electrode layer 10a, a second gate electrode layer 10b, a third gate electrode layer 10c, a fourth gate electrode layer 10d, a semiconductor layer 12, a dielectric layer 14, a trench insulating layer 16, an interlayer insulating layer 18, and a core insulating layer 20.

The trench insulating layer 16 is an example of a first insulating layer. The interlayer insulating layer 18 is an example of a second insulating layer. The core insulating layer 20 is an example of a third insulating layer.

The first gate electrode layer 10a extends in the x direction. The first gate electrode layer 10a corresponds to, for example, the word line WLa illustrated in FIG. 2. The first gate electrode layer 10a serves as a gate electrode of a transistor of the memory cell MC1.

The first gate electrode layer 10a includes a barrier metal layer 10ax and a metal layer 10ay.

The barrier metal layer 10ax is, for example, metal nitride or metal carbide. The barrier metal layer 10ax contains, for example, titanium nitride. The barrier metal layer 10ax is, for example, a titanium nitride layer.

The metal layer 10ay is, for example, metal. The metal layer 10ay contains, for example, tungsten (W). The metal layer 10ay is, for example, a tungsten layer.

The second gate electrode layer 10b extends in the x direction. The second gate electrode layer 10b is provided so as to be spaced apart from the first gate electrode layer 10a in the y direction. The second gate electrode layer 10b is spaced from the first gate electrode layer 10a in the y direction. The second gate electrode layer 10b is adjacent to the first gate electrode layer 10a in the y direction. The second gate electrode layer 10b corresponds to, for example, the word line WLb illustrated in FIG. 2. The second gate electrode layer 10b serves as a gate electrode of a transistor of the memory cell MC2.

The second gate electrode layer 10b includes a barrier metal layer 10bx and a metal layer 10by.

The barrier metal layer 10bx is, for example, metal nitride or metal carbide. The barrier metal layer 10bx contains, for example, titanium nitride. The barrier metal layer 10bx is, for example, a titanium nitride layer.

The metal layer 10by is, for example, metal. The metal layer 10by contains, for example, tungsten (W). The metal layer 10by is, for example, a tungsten layer.

The third gate electrode layer 10c extends in the x direction. The third gate electrode layer 10c is provided so as to be spaced apart from the first gate electrode layer 10a in the z direction. The third gate electrode layer 10c is spaced from the first gate electrode layer 10a in the z direction. The third gate electrode layer 10c is adjacent to the first gate electrode layer 10a in the z direction. The third gate electrode layer 10c corresponds to, for example, the word line WLa illustrated in FIG. 2. The third gate electrode layer 10c serves as the gate electrode of the transistor of the memory cell MC.

The third gate electrode layer 10c includes a barrier metal layer 10cx and a metal layer 10cy.

The barrier metal layer 10cx is, for example, metal nitride or metal carbide. The barrier metal layer 10cx contains, for example, titanium nitride. The barrier metal layer 10cx is, for example, a titanium nitride layer.

The metal layer 10cy is, for example, metal. The metal layer 10cy contains, for example, tungsten (W). The metal layer 10cy is, for example, a tungsten layer.

The fourth gate electrode layer 10d extends in the x direction. The fourth gate electrode layer 10d is provided so as to be spaced apart from the third gate electrode layer 10c in the y direction. The fourth gate electrode layer 10d is spaced from the third gate electrode layer 10c in the y direction. The fourth gate electrode layer 10d is adjacent to the third gate electrode layer 10c in the y direction. The fourth gate electrode layer 10d is also adjacent to the second gate electrode layer 10b in the z direction. The fourth gate electrode layer 10d corresponds to, for example, the word line WLb illustrated in FIG. 2. The fourth gate electrode layer 10d serves as the gate electrode of the transistor of the memory cell MC.

The fourth gate electrode layer 10d includes a barrier metal layer 10dx and a metal layer 10dy.

The barrier metal layer 10dx is, for example, metal nitride or metal carbide. The barrier metal layer 10dx contains, for example, titanium nitride. The barrier metal layer 10dx is, for example, a titanium nitride layer.

The metal layer 10dy is, for example, metal. The metal layer 10dy contains, for example, tungsten (W). The metal layer 10dy is, for example, a tungsten layer.

The semiconductor layer 12 is provided between the first gate electrode layer 10a and the second gate electrode layer 10b. The semiconductor layer 12 is provided between the third gate electrode layer 10c and the fourth gate electrode layer 10d. The semiconductor layer 12 extends in the z direction. The semiconductor layer 12 has, for example, a cylindrical shape.

The semiconductor layer 12 serves as a channel of the transistor of the memory cell MC.

The semiconductor layer 12 is, for example, a polycrystalline semiconductor. The semiconductor layer 12 contains, for example, polycrystalline silicon. The semiconductor layer 12 is, for example, a polycrystalline silicon layer. A thickness of the semiconductor layer 12 on an xy plane is, for example, 5 nm or more and 30 nm or less.

The dielectric layer 14 surrounds the semiconductor layer 12. The dielectric layer 14 is provided between the first gate electrode layer 10a and the semiconductor layer 12, between the second gate electrode layer 10b and the semiconductor layer 12, between the third gate electrode layer 10c and the semiconductor layer 12, and between the fourth gate electrode layer 10d and the semiconductor layer 12.

The dielectric layer 14 is provided between the trench insulating layer 16 and the semiconductor layer 12, and between the interlayer insulating layer 18 and the semiconductor layer 12. The dielectric layer 14 extends in the z direction. The dielectric layer 14 has, for example, a cylindrical shape.

A part of the dielectric layer 14 is a ferroelectric. A part of the dielectric layer 14 serves as the gate insulating layer of the transistor of the memory cell MC.

The dielectric layer 14 contains oxygen and at least one of hafnium (Hf) or zirconium (Zr). The dielectric layer 14 contains an oxide containing at least one of hafnium oxide or zirconium oxide. The dielectric layer 14 is, for example, a hafnium oxide layer. The dielectric layer 14 is, for example, a zirconium oxide layer. A thickness of the dielectric layer 14 on the xy plane is, for example, 5 nm or more and 40 nm or less.

Note that, for example, an insulating layer having chemical composition different from that of the dielectric layer 14 may be interposed between the dielectric layer 14 and the semiconductor layer 12. The insulating layer having the chemical composition different from that of the dielectric layer 14 is, for example, a silicon oxide layer.

The trench insulating layer 16 is provided between the first gate electrode layer 10a and the second gate electrode layer 10b. The trench insulating layer 16 is provided between the third gate electrode layer 10c and the fourth gate electrode layer 10d. The trench insulating layer 16 is adjacent to the semiconductor layer 12 in the x direction. The trench insulating layer 16 is adjacent to the dielectric layer 14 in the x direction.

The trench insulating layer 16 is, for example, an oxide, an oxynitride, or a nitride. The trench insulating layer 16 contains, for example, silicon oxide or aluminum oxide. The trench insulating layer 16 is, for example, a silicon oxide layer or an aluminum oxide layer.

The interlayer insulating layer 18 is provided between the first gate electrode layer 10a and the third gate electrode layer 10c, and between the second gate electrode layer 10b and the fourth gate electrode layer 10d.

The interlayer insulating layer 18 is, for example, an oxide, an oxynitride, or a nitride. The interlayer insulating layer 18 contains, for example, silicon oxide. The interlayer insulating layer 18 is, for example, a silicon oxide layer. A thickness of the interlayer insulating layer 18 in the z direction is, for example, 5 nm or more and 30 nm or less.

The core insulating layer 20 is surrounded by the semiconductor layer 12. The core insulating layer 20 extends in the z direction. The core insulating layer 20 has, for example, a cylindrical shape.

The core insulating layer 20 is, for example, an oxide, an oxynitride, or a nitride. The core insulating layer 20 contains, for example, silicon oxide. The core insulating layer 20 contains, for example, silicon oxide or aluminum oxide. The core insulating layer 20 is, for example, a silicon oxide layer or an aluminum oxide layer. A material of the core insulating layer 20 is different from a material of the trench insulating layer 16, for example. Chemical composition of the core insulating layer 20 is different from the chemical composition of the trench insulating layer 16, for example.

Figure 5:
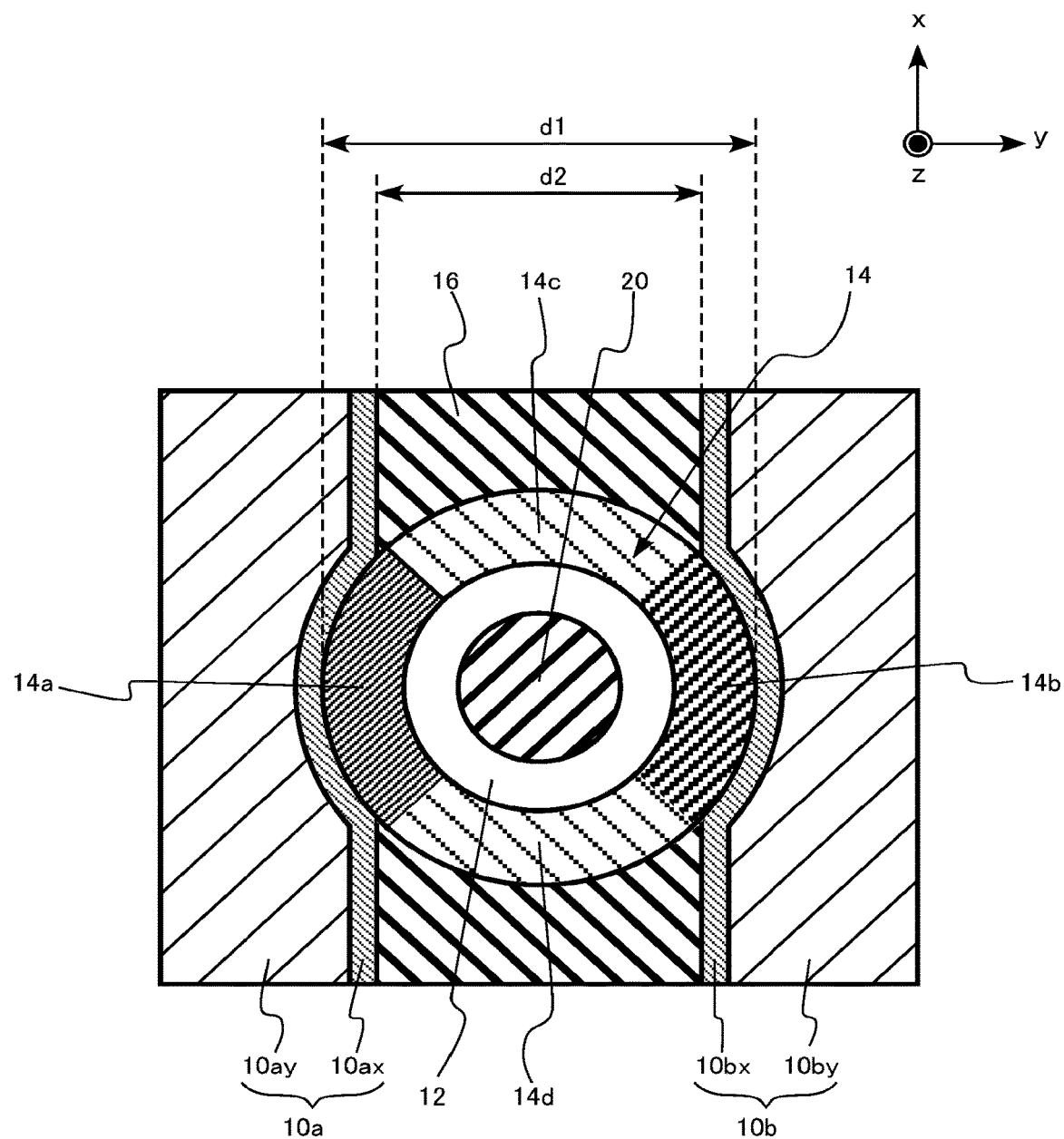
FIG. 5 is an enlarged schematic cross-sectional view of a part of the memory cell array of the semiconductor memory device of the first embodiment.

FIG. 5 is an enlarged schematic cross-sectional view of a part of the memory cell array of the semiconductor memory device of the first embodiment. FIG. 5 is an xy cross-section of the memory cell array 101.

The dielectric layer 14 contains oxygen and at least one of hafnium (Hf) or zirconium (Zr). The dielectric layer 14 contains an oxide containing at least one of hafnium oxide or zirconium oxide. A part of the dielectric layer 14 is a ferroelectric and another part of the dielectric layer 14 is a paraelectric.

The dielectric layer 14 contains, for example, hafnium oxide as a main component. The fact that the hafnium oxide is the main component means that a mole fraction of hafnium oxide is the highest among substances contained in the dielectric layer 14. The mole fraction of hafnium oxide is, for example, equal to or more than 90%.

The dielectric layer 14 contains, for example, zirconium oxide as a main component. The fact that zirconium oxide is the main component means that a mole fraction of zirconium oxide is the highest among the substances contained in the dielectric layer 14.

The mole fraction of zirconium oxide contained in the dielectric layer 14 is, for example, 40% or more and 60% or less. The oxide contained in the dielectric layer 14 is, for example, a mixed crystal of hafnium oxide and zirconium oxide.

Hafnium oxide has ferroelectricity in a case where this is crystals of an orthorhombic crystal system or a trigonal crystal system. Hafnium oxide is a ferroelectric in a case where this is the crystals of the orthorhombic crystal system or trigonal crystal system.

Hafnium oxide having ferroelectricity has ferroelectricity in a case where this is, for example, crystals of a third orthorhombic crystal system (orthorhombic III; space group $Pbc2_1$, and space group number 29), or a trigonal crystal system (trigonal; space group R3m, P3, or R3, and space group number 160, 143, or 146).

Hafnium oxide does not have ferroelectricity in a case where this is crystals other than the crystals of the orthorhombic crystal system or the trigonal crystal system, or this is an amorphous substance. Hafnium oxide is a paraelectric in a case where this is crystals other than crystals of the orthorhombic crystal system or trigonal crystal system, or this is the amorphous substance. The "crystals other than crystals of the orthorhombic crystal system or trigonal crystal system" means the crystals are not orthorhombic crystal system and the crystals are not trigonal crystal system. The crystals other than the orthorhombic crystal system or trigonal crystal system are crystals of a cubic crystal system, a hexagonal crystal system, a tetragonal crystal system, a monoclinic crystal system, or a triclinic crystal system.

Zirconium oxide has ferroelectricity in a case where this is crystals of an orthorhombic crystal system or a trigonal crystal system. Zirconium oxide is a ferroelectric in a case where this is the crystals of the orthorhombic crystal system or trigonal crystal system.

Zirconium oxide having ferroelectricity has ferroelectricity in a case where this is, for example, a crystals of a third orthorhombic crystal system (orthorhombic III; space group $Pbc2_1$, and space group number 29), or a trigonal crystal system (trigonal; space group R3m, P3, or R3, and space group number 160, 143, or 146).

Zirconium oxide does not have ferroelectricity in a case where this is crystals other than the crystals of the orthorhombic crystal system or trigonal crystal system, or this is an amorphous substance. Zirconium oxide is a paraelectric in a case where this is the crystals other than the crystals of the orthorhombic crystal system or trigonal crystal system, or this is the amorphous substance.

The dielectric layer 14 contains at least one additive element selected from the group consisting of, for example, silicon (Si), zirconium (Zr), aluminum (Al), yttrium (Y), strontium (Sr), lanthanum (La), samarium (Sm), gadolinium (Gd), terbium (Tb), dysprosium (Dy), holmium (Ho), erbium (Er), ytterbium (Yb), lutetium (Lu), and barium (Ba). The oxide contained in the dielectric layer 14 contains the above-described additive element. In a case where the oxide is hafnium oxide, hafnium oxide easily displays ferroelectricity when this contains the above-described additive element.

The dielectric layer 14 includes a ferroelectric region 14a, a ferroelectric region 14b, a paraelectric region 14c, and a paraelectric region 14d. The ferroelectric region 14a is an example of a first region. The ferroelectric region 14b is an example of a second region. The paraelectric region 14c is an example of a third region. The paraelectric region 14d is an example of a fourth region.

The ferroelectric region 14a is provided between the first gate electrode layer 10a and the semiconductor layer 12. The ferroelectric region 14b is provided between the second gate electrode layer 10b and the semiconductor layer 12.

The paraelectric region 14c is provided between the trench insulating layer 16 and the semiconductor layer 12. The trench insulating layer 16 is in contact with the paraelectric region 14c. The paraelectric region 14c is provided between the ferroelectric region 14a and the ferroelectric region 14b.

The paraelectric region 14d is provided between the trench insulating layer 16 and the semiconductor layer 12. The trench insulating layer 16 is in contact with the paraelectric region 14d. The paraelectric region 14d is provided between the ferroelectric region 14a and the ferroelectric region 14b.

The ferroelectric region 14a and the ferroelectric region 14b have crystals of an orthorhombic crystal system or a trigonal crystal system as a main component substance. The fact that the crystals of the orthorhombic crystal system or trigonal crystal system is the main component substance means that the crystals of the orthorhombic crystal system or trigonal crystal system has the highest existence ratio among substances forming the ferroelectric region 14a and the ferroelectric region 14b.

In the ferroelectric region 14a and the ferroelectric region 14b, the existence ratio of the crystals of the orthorhombic crystal system or the trigonal crystal system is larger than that of crystals other than the crystals of the orthorhombic crystal system or the trigonal crystal system and an amorphous phase. The existence ratio is, for example, a mole ratio or a volume ratio. The ferroelectric region 14a and the ferroelectric region 14b are crystalline substances.

The ferroelectric region 14a and the ferroelectric region 14b are ferroelectric. An oxide contained in the ferroelectric region 14a and the ferroelectric region 14b is a ferroelectric.

Each of the ferroelectric region 14a and the ferroelectric region 14b having ferroelectricity serves as the gate insulating layer of the FeFET of the memory cell MC.

The paraelectric region 14c and the paraelectric region 14d have a substance other than crystals of the orthorhombic crystal system or the trigonal crystal system as a main component substance. The fact that the substance other than crystals of the orthorhombic crystal system or the trigonal crystal system is the main component substance means that the substance other than crystals of the orthorhombic crystal system or the trigonal crystal system has the highest existence ratio among the substances forming the paraelectric region 14c and the paraelectric region 14d.

In the paraelectric region 14c and the paraelectric region 14d, the existence ratio of the crystals other than the crystals of the orthorhombic crystal system or the trigonal crystal system or the amorphous phase is larger than that of the crystals of the orthorhombic crystal system or trigonal crystal system. The paraelectric region 14c and the paraelectric region 14d are crystalline substances or amorphous substances.

The paraelectric region 14c and the paraelectric region 14d are paraelectric. An oxide contained in the paraelectric region 14c and the paraelectric region 14d is a paraelectric.

A first distance (d1 in FIG. 5) between the first gate electrode layer 10a and the second gate electrode layer 10b in a first portion in which the semiconductor layer 12 is provided between the first gate electrode layer 10a and the second gate electrode layer 10b is larger than a second distance (d2 in FIG. 5) between the first gate electrode layer 10a and the second gate electrode layer 10b in a second portion in which the trench insulating layer 16 is provided between the first gate electrode layer 10a and the second gate electrode layer 10b.

Next, an example of a method of manufacturing the semiconductor memory device of the first embodiment is described.

FIGS. 6, 7, 8, 9, 10, 11, 12, 13, 14, and 15 are schematic cross-sectional views illustrating the method of manufacturing the semiconductor memory device of the first embodiment. FIGS. 6 to 15 are views illustrating an example of a method of manufacturing the memory cell array 101 of the three-dimensional ferroelectric memory 100.

Upper views in FIGS. 6 to 15 are xy cross-sections of the memory cell array 101. The upper views in FIGS. 6 to 15 are views corresponding to a part of FIG. 3. Lower views in FIGS. 6 to 15 are yz cross-sections of the memory cell array 101. The lower views in FIGS. 6 to 15 are views corresponding to FIG. 4.

Figure 6:
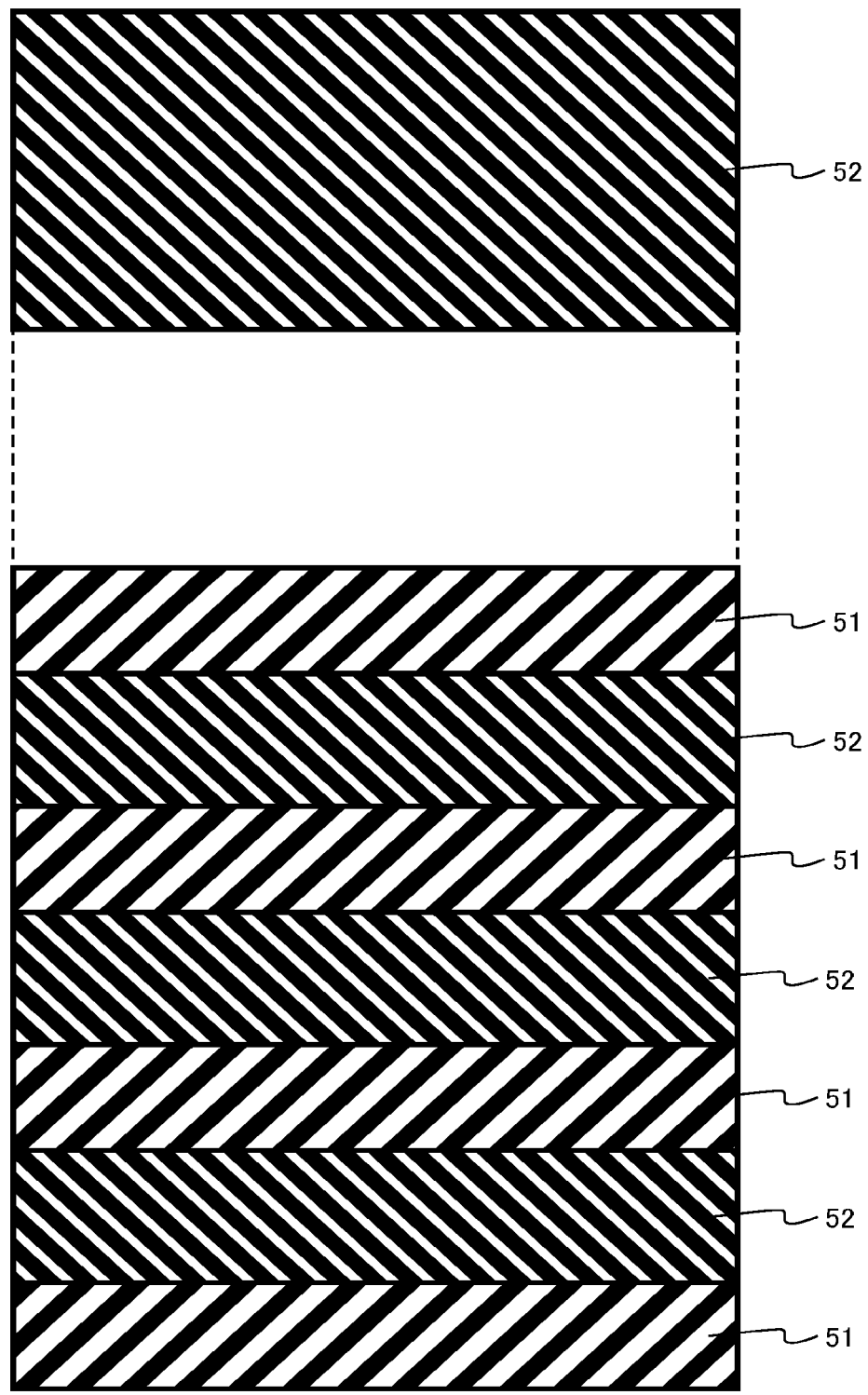
FIG. 6 is a schematic cross-sectional view illustrating a method of manufacturing the semiconductor memory device of the first embodiment.

First, a plurality of silicon oxide layers 51 and a plurality of silicon nitride layers 52 are alternately stacked on a semiconductor substrate not illustrated (FIG. 6).

The silicon oxide layer 51 and the silicon nitride layer 52 are formed by, for example, a chemical vapor deposition method (CVD method).

A part of the silicon oxide layer 51 finally becomes the interlayer insulating layer 18.

Figure 7:
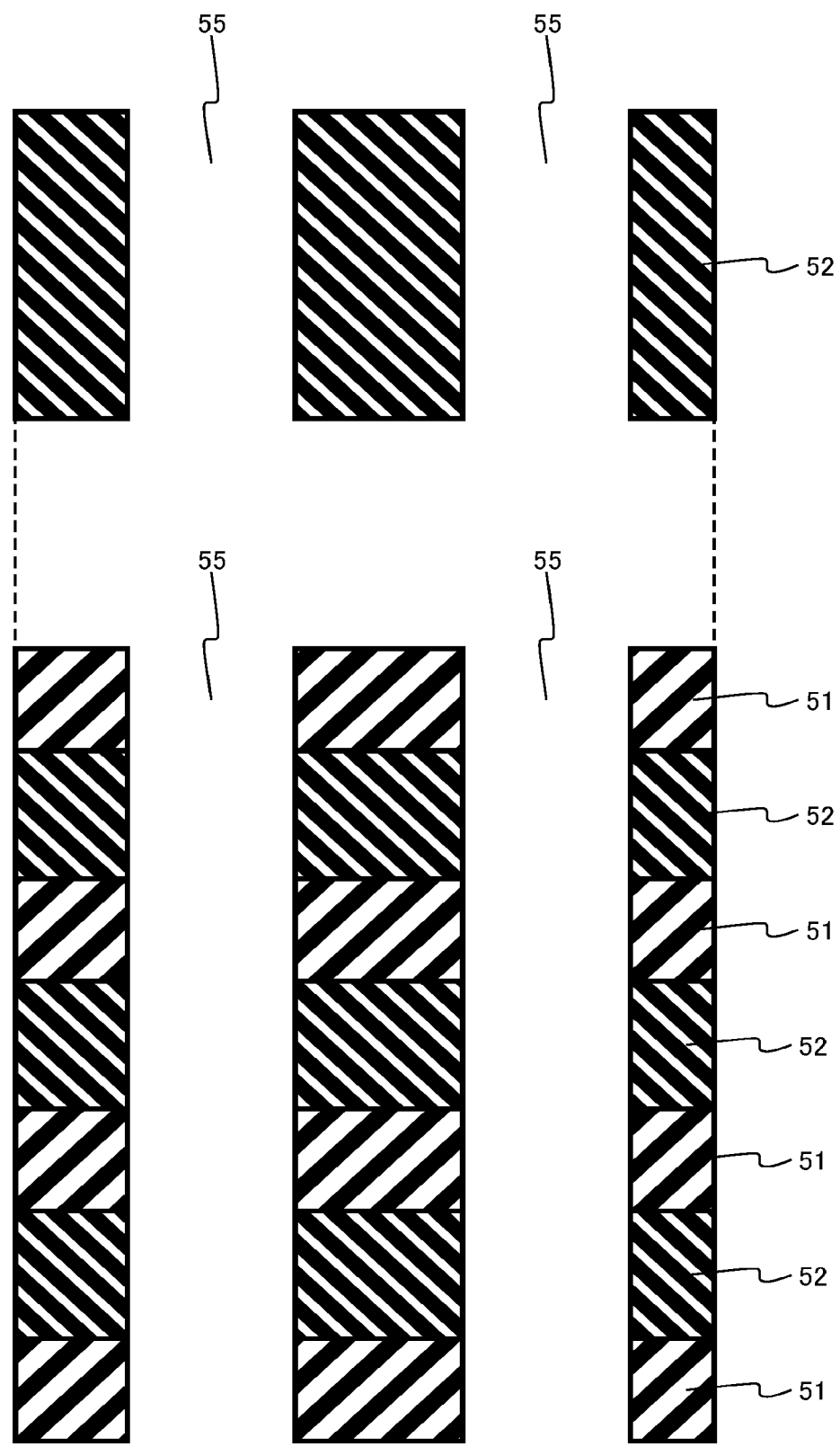
FIG. 7 is a schematic cross-sectional view illustrating the method of manufacturing the semiconductor memory device of the first embodiment.

Next, a memory trench 55 is formed in a plurality of silicon oxide layers 51 and a plurality of silicon nitride layers 52 (FIG. 7). The memory trench 55 penetrates a plurality of silicon oxide layers 51 and a plurality of silicon nitride layers 52.

The memory trench 55 is formed by, for example, a lithography method and a reactive ion etching method (RIE method).

Figure 8:
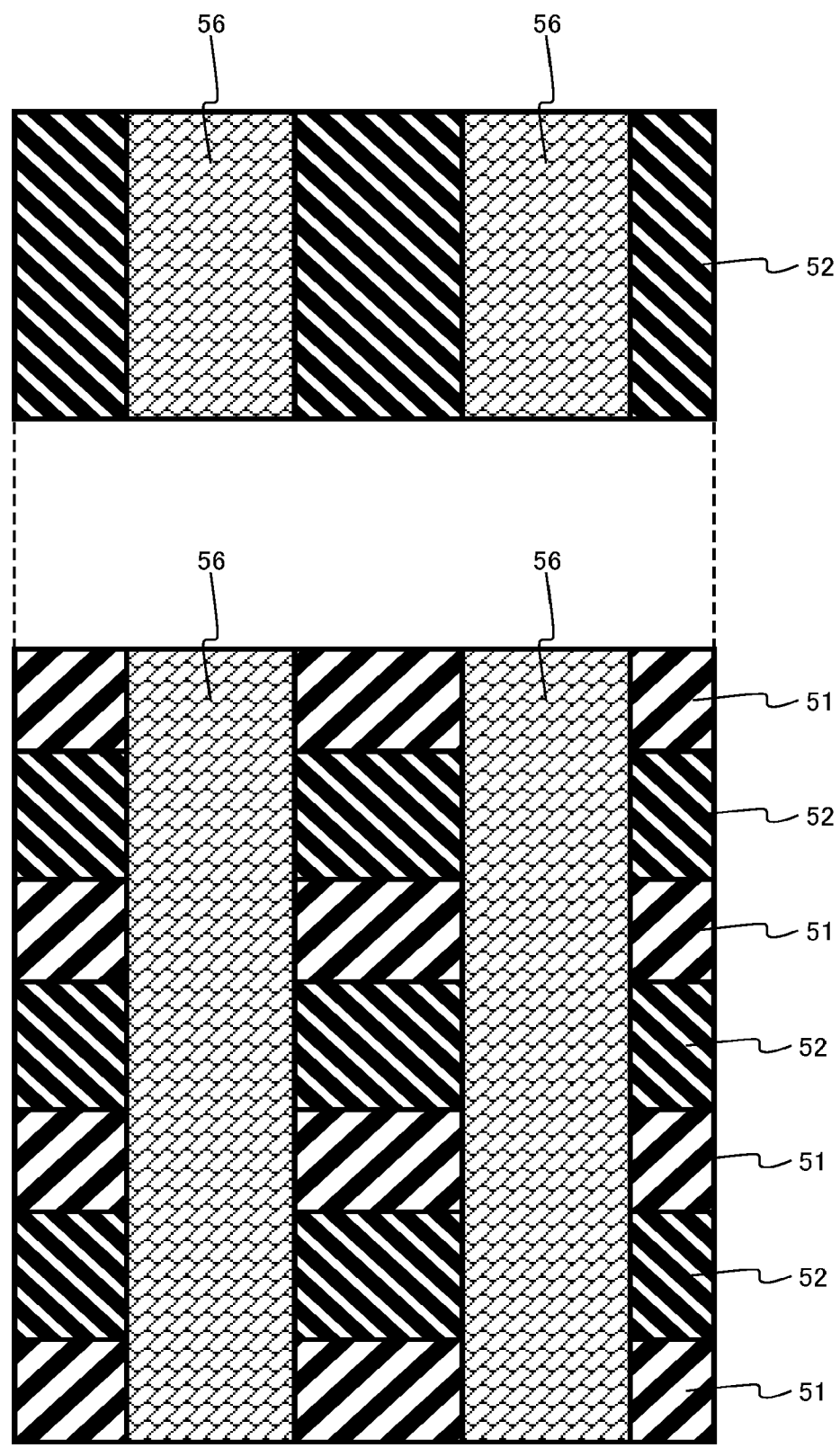
FIG. 8 is a schematic cross-sectional view illustrating the method of manufacturing the semiconductor memory device of the first embodiment.

Next, a spin on glass (SOG) layer 56 is buried in the memory trench 55 (FIG. 8). The SOG layer 56 is formed by a coating method.

Figure 9:
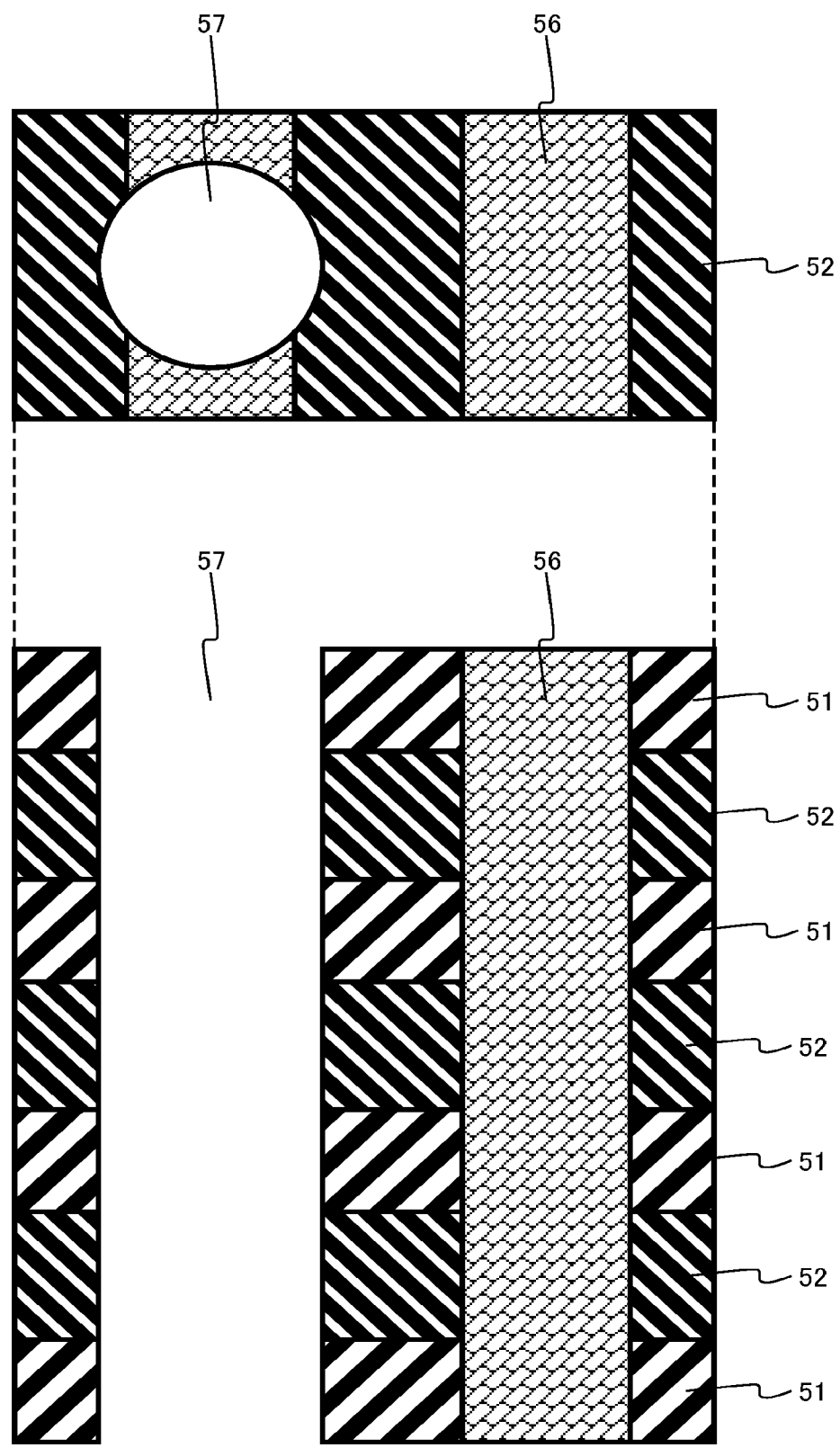
FIG. 9 is a schematic cross-sectional view illustrating the method of manufacturing the semiconductor memory device of the first embodiment.

Next, a memory hole 57 is formed in a part of the SOG layer 56, a plurality of silicon oxide layers 51, and a plurality of silicon nitride layers 52 (FIG. 9). The memory hole 57 is formed by, for example, the lithography method and the RIE method.

Figure 10:
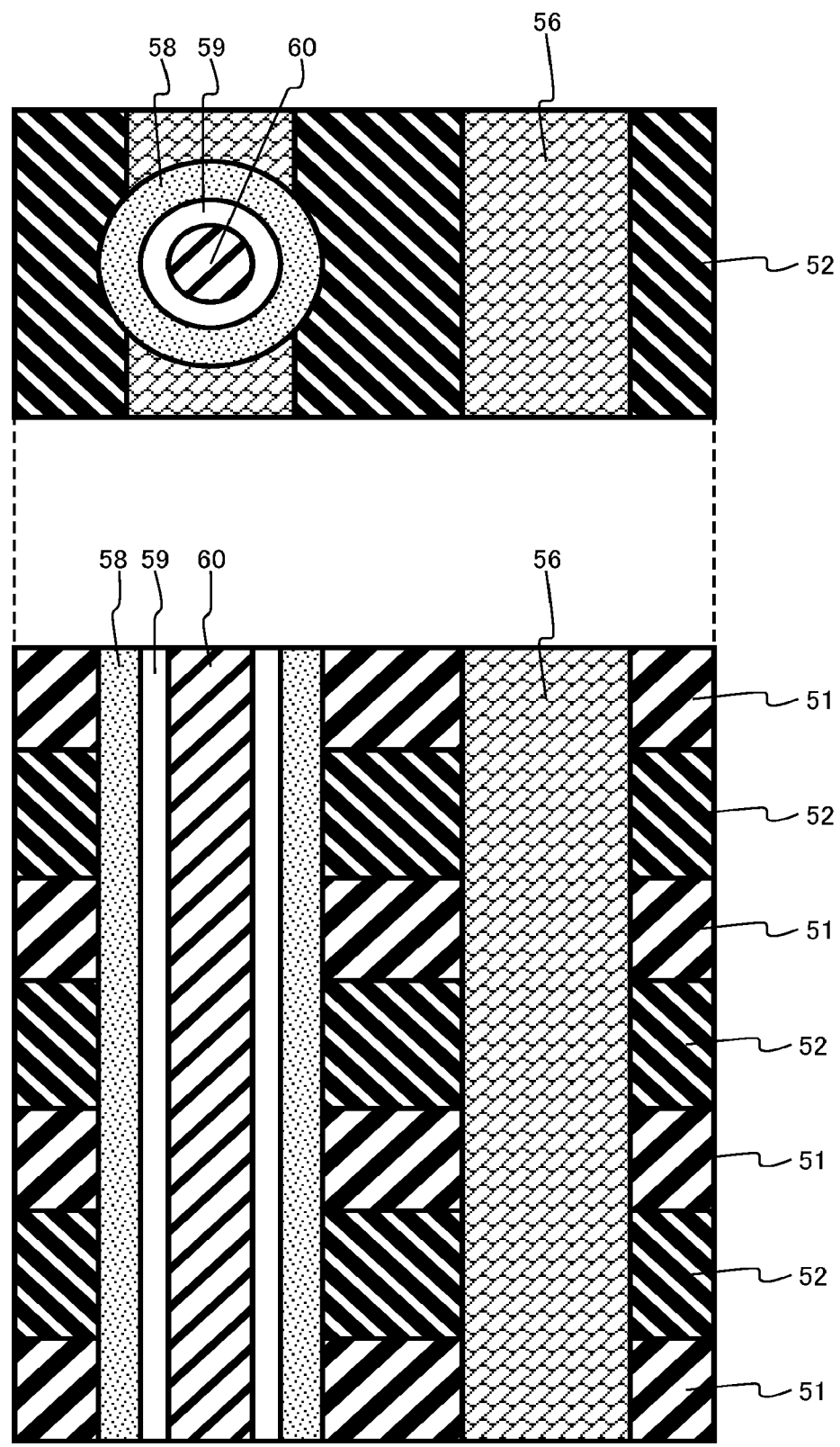
FIG. 10 is a schematic cross-sectional view illustrating the method of manufacturing the semiconductor memory device of the first embodiment.

Next, a hafnium oxide layer 58, a polycrystalline silicon layer 59, and a silicon oxide layer 60 are formed in the memory hole 57 (FIG. 10). The hafnium oxide layer 58 is formed by, for example, an atomic layer deposition method (ALD method). The polycrystalline silicon layer 59 and the silicon oxide layer 60 are formed by, for example, the CVD method.

The hafnium oxide layer 58 finally becomes the dielectric layer 14. The polycrystalline silicon layer 59 finally becomes the semiconductor layer 12. The silicon oxide layer 60 finally becomes the core insulating layer 20.

Figure 11:
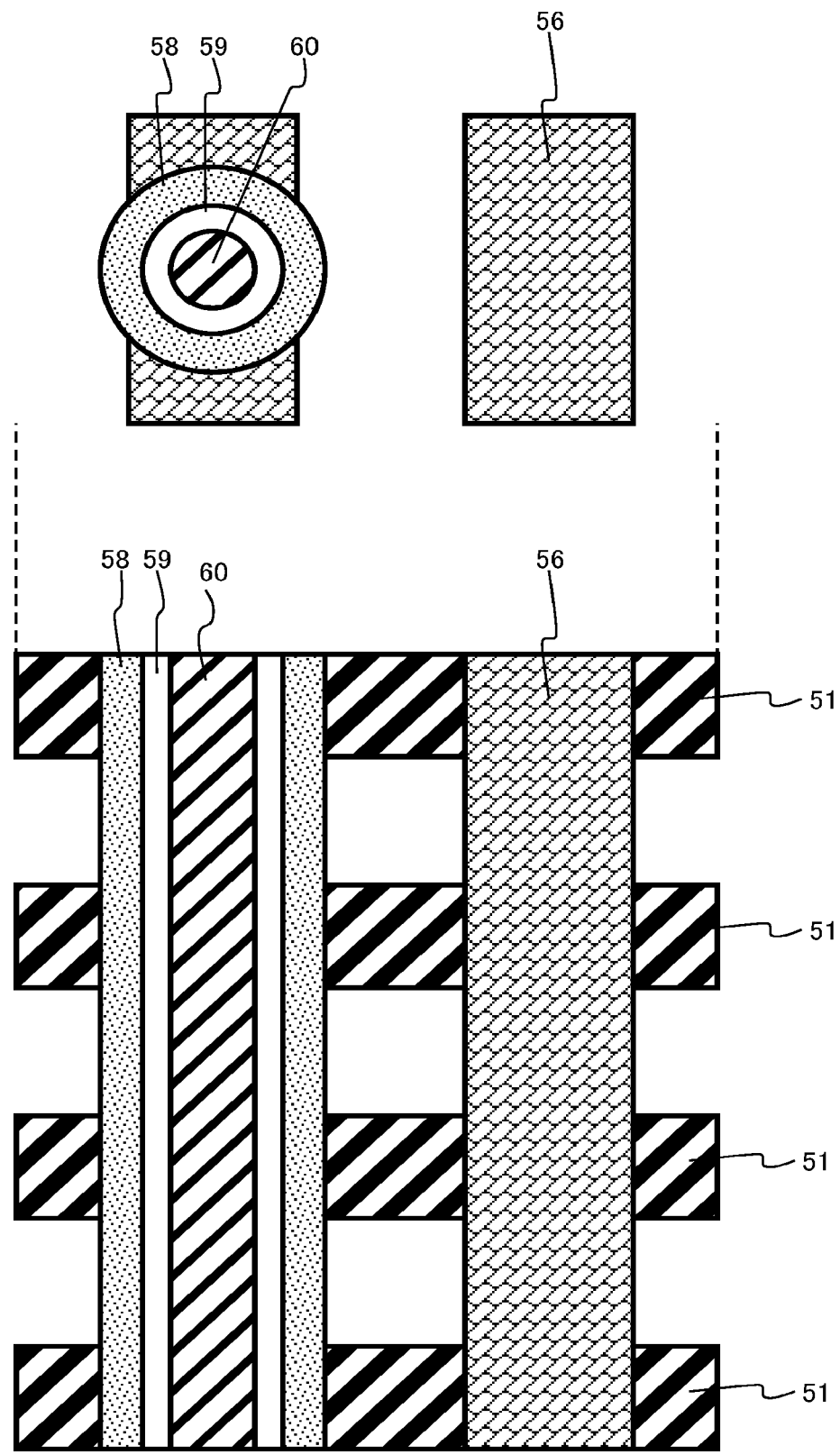
FIG. 11 is a schematic cross-sectional view illustrating the method of manufacturing the semiconductor memory device of the first embodiment.

Next, a plurality of silicon nitride layers 52 is removed (FIG. 11). A plurality of silicon nitride layers 52 is removed by a wet etching method using, for example, an opening not illustrated.

Figure 12:
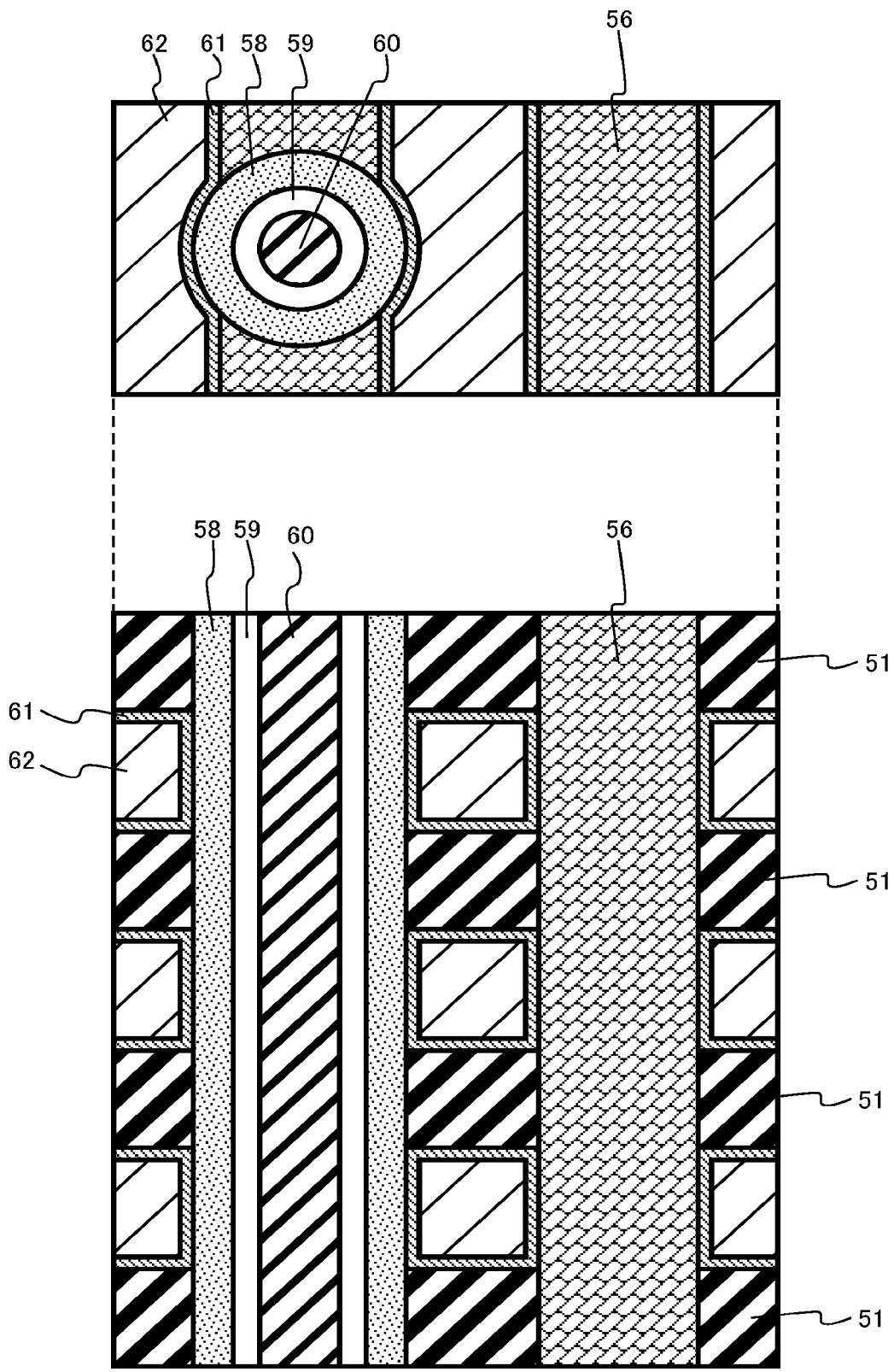
FIG. 12 is a schematic cross-sectional view illustrating the method of manufacturing the semiconductor memory device of the first embodiment.

Next, a titanium nitride layer 61 and a tungsten layer 62 are formed (FIG. 12). The titanium nitride layer 61 and the tungsten layer 62 are formed by, for example, the CVD method.

The titanium nitride layer 61 finally becomes the barrier metal layers 10ax, 10bx, 10cx, and 10dx. The tungsten layer 62 finally becomes the metal layer 10ay, the metal layer 10by, the metal layer 10cy, and the metal layer 10dy.

Figure 13:
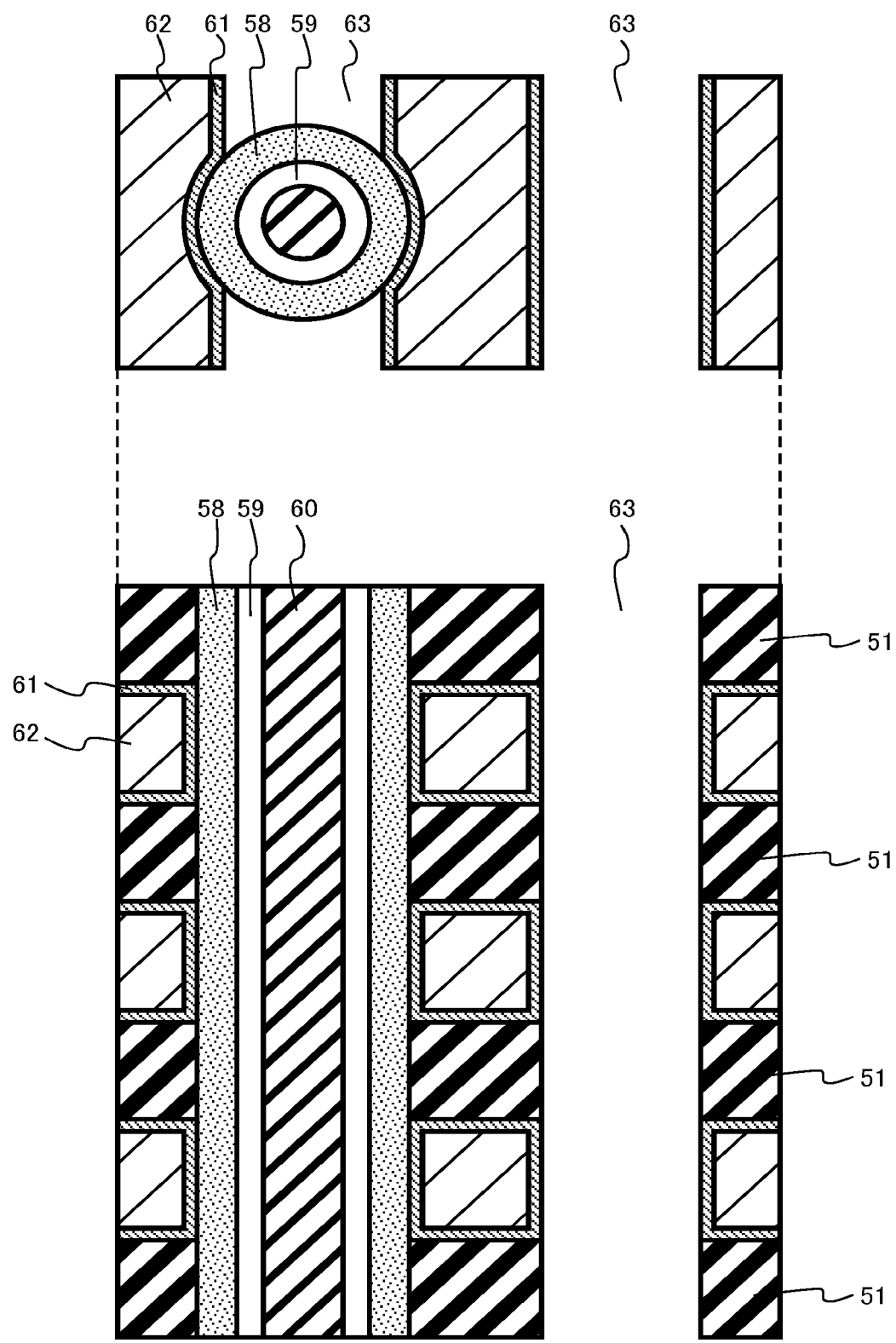
FIG. 13 is a schematic cross-sectional view illustrating the method of manufacturing the semiconductor memory device of the first embodiment.

Next, the SOG layer 56 is removed (FIG. 13). The SOG layer 56 is removed by, for example, the wet etching method. By removing the SOG layer 56, a void 63 is formed. When removing the SOG layer 56, a mask material for preventing etching of the silicon oxide layer 60 may be provided on the silicon oxide layer 60.

Figure 14:
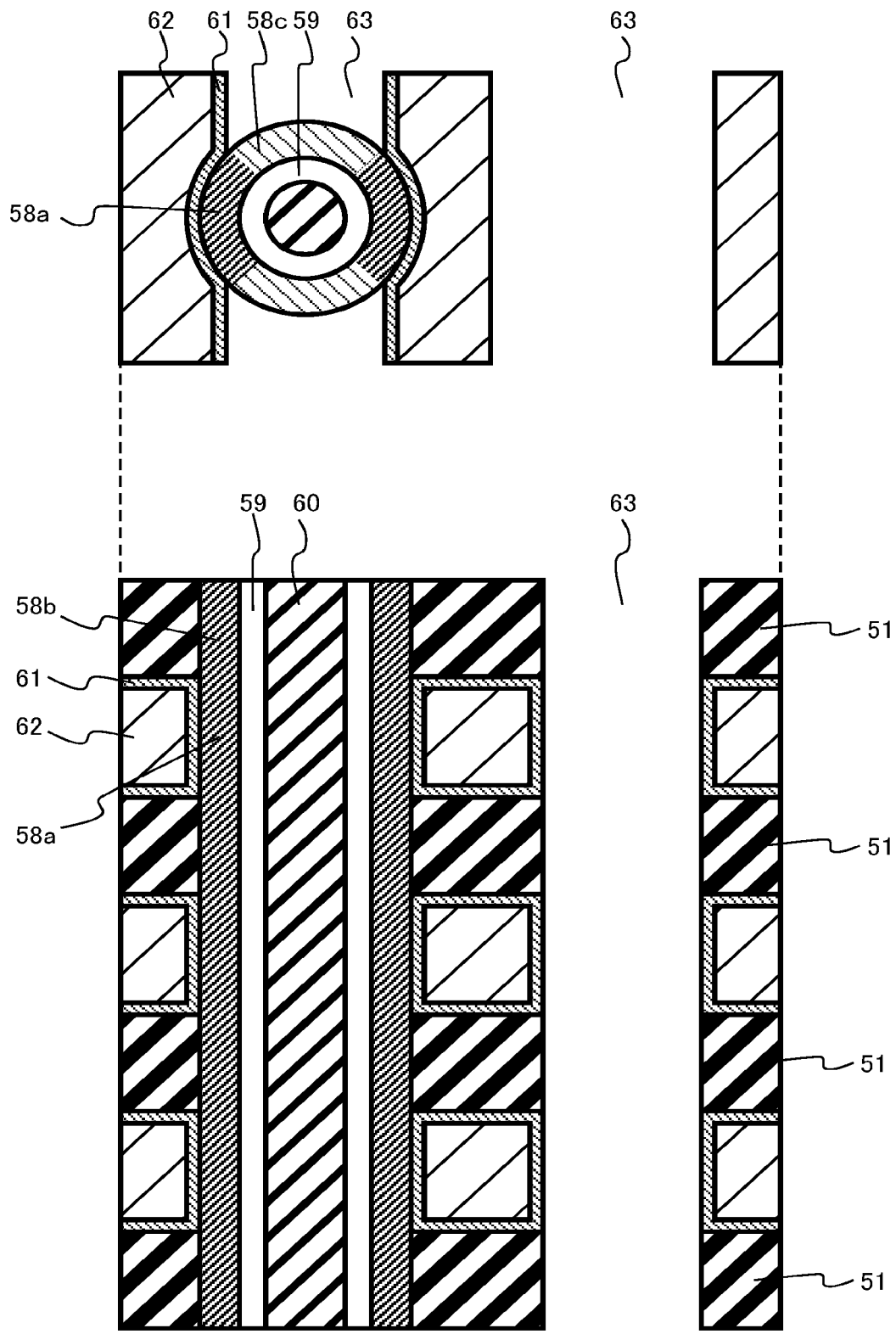
FIG. 14 is a schematic cross-sectional view illustrating the method of manufacturing the semiconductor memory device of the first embodiment.

Next, heat treatment is performed to crystallize the hafnium oxide layer 58 (FIG. 14). The heat treatment is performed, for example, in a nitrogen gas atmosphere at temperature of 600° C. or higher and 1050° C. or lower. The heat treatment is so-called crystallization annealing.

By the heat treatment, in the hafnium oxide layer 58, a region 58a interposed between the polycrystalline silicon layer 59 and the titanium nitride layer 61, and a region 58b interposed between the polycrystalline silicon layer 59 and the silicon oxide layer 51 become crystals of an orthorhombic crystal system or a trigonal crystal system by an applied stress. On the other hand, since the stress applied to a region 58c interposed between the polycrystalline silicon layer 59 and the void 63 is small, the region becomes crystals other than the crystals of the orthorhombic crystal system or trigonal crystal system or an amorphous phase.

In other words, the region 58a interposed between the polycrystalline silicon layer 59 and the titanium nitride layer 61, and the region 58b interposed between the polycrystalline silicon layer 59 and the silicon oxide layer 51 become ferroelectric. The region 58c interposed between the polycrystalline silicon layer 59 and the void 63 becomes a paraelectric.

The region 58a interposed between the polycrystalline silicon layer 59 and the titanium nitride layer 61 finally becomes the ferroelectric region 14a and the ferroelectric region 14b. The region 58c interposed between the polycrystalline silicon layer 59 and the void 63 finally becomes the paraelectric region 14c and the paraelectric region 14d.

Figure 15:
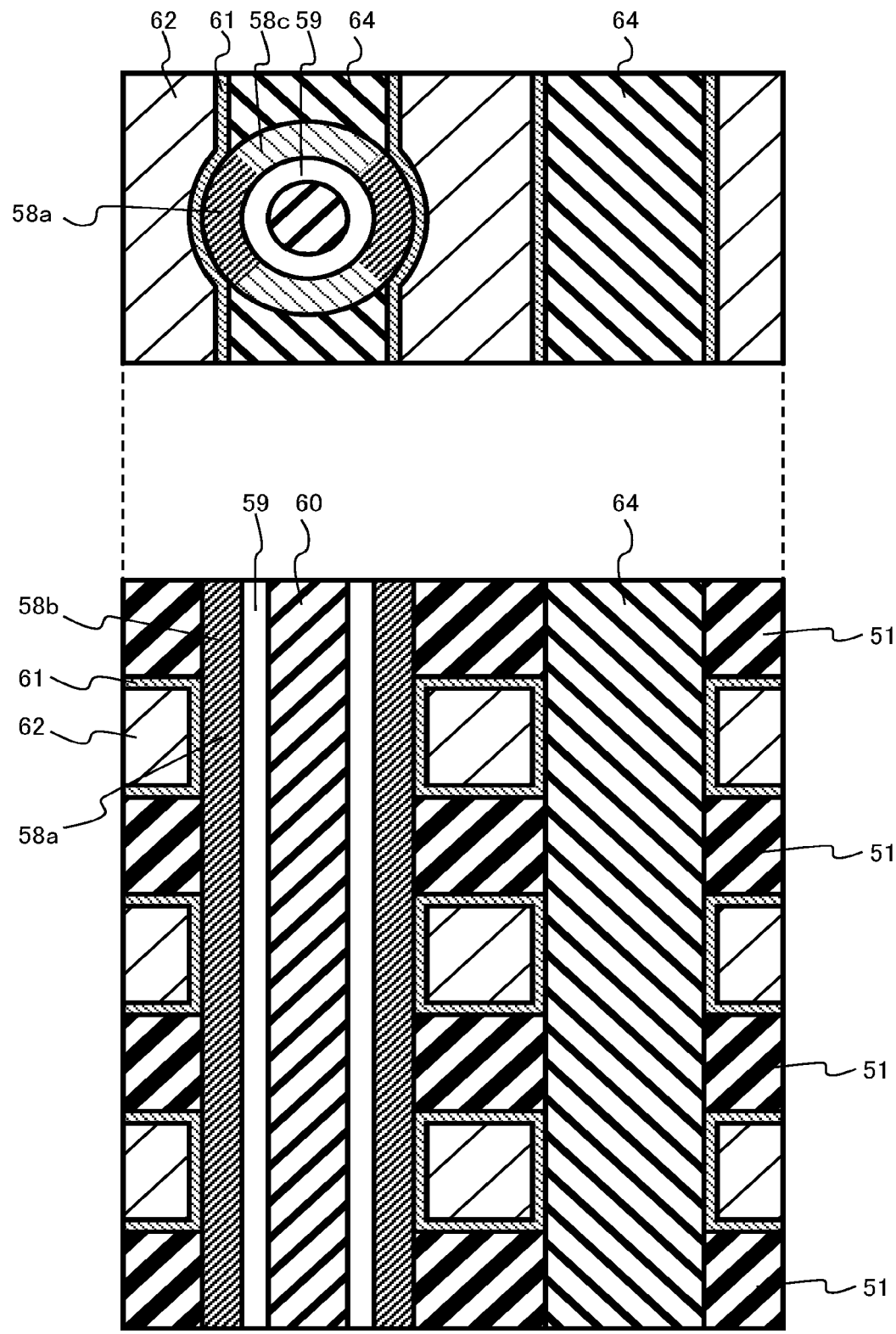
FIG. 15 is a schematic cross-sectional view illustrating the method of manufacturing the semiconductor memory device of the first embodiment.

Next, the silicon oxide layer 64 is buried in the void 63 (FIG. 15). The silicon oxide layer 64 finally becomes the trench insulating layer 16.

By the above-described manufacturing method, the memory cell array 101 of the three-dimensional ferroelectric memory 100 of the first embodiment is manufactured.

Next, a function and an effect of the semiconductor memory device of the first embodiment are described.

A three-dimensional NAND flash memory in which memory cells are disposed three-dimensionally realizes a high degree of integration and a low cost. In the three-dimensional NAND flash memory, for example, a memory hole penetrating a stack is formed in the stack obtained by alternately stacking a plurality of insulating layers and a plurality of gate electrode layers. By applying the FeFET type three-terminal memory as the memory cell of the three-dimensional NAND flash memory, the gate insulating layer may be thinned. Therefore, a hole diameter of the memory hole may be reduced, and the memory cell may be scaled-down. Therefore, by applying the FeFET type three-terminal memory, it becomes possible to further increase the degree of integration of the memory.

As the memory cell is scaled-down, for example, control of a polarization state of the ferroelectric layer serving as the gate insulating layer might become difficult, and an operation of the memory cell might become unstable. Therefore, it is desired to realize a memory provided with the memory cell that operates stably even in a case where the memory cell is scaled-down.

Figure 16:
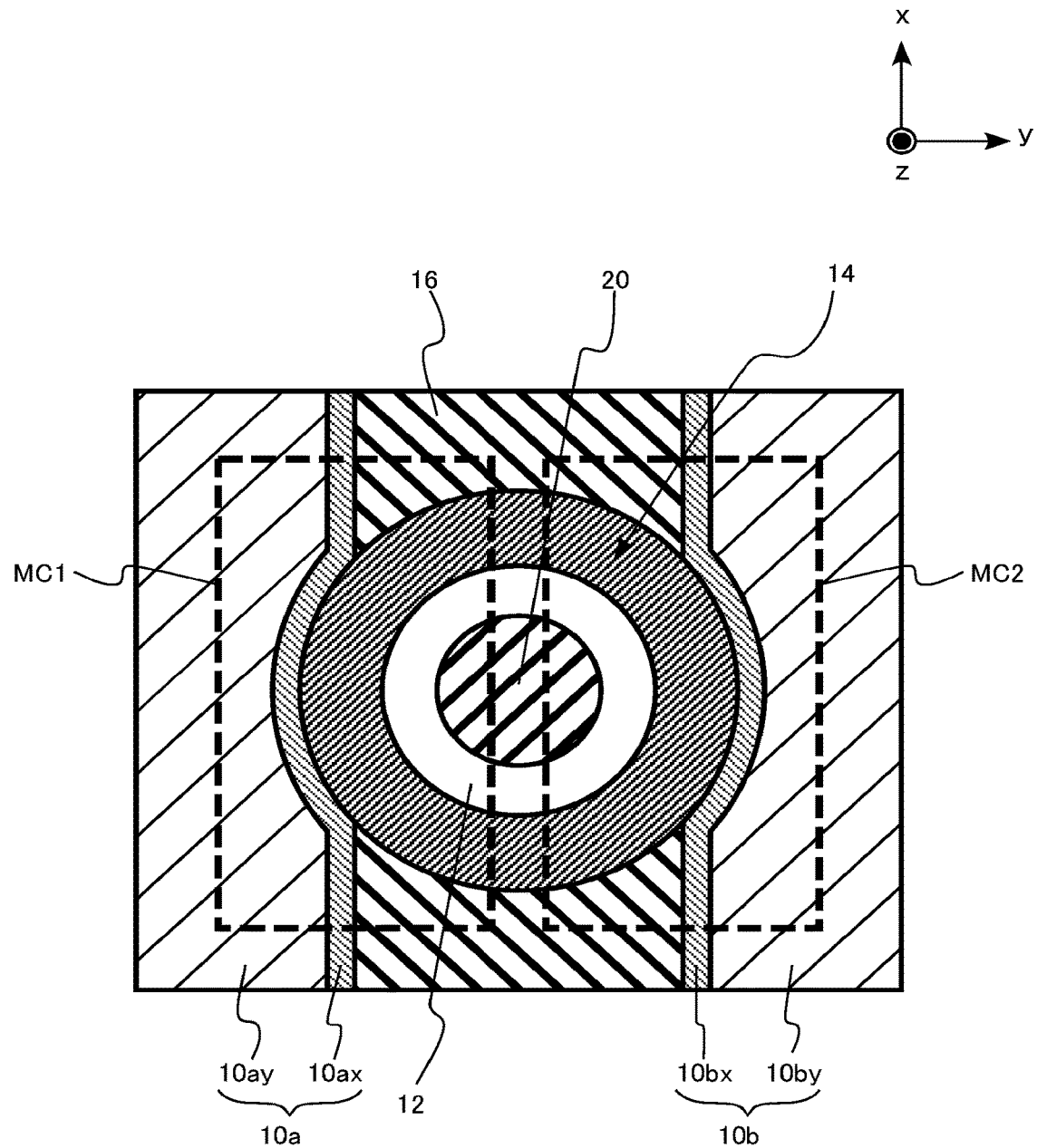
FIG. 16 is an enlarged schematic cross-sectional view of a part of a memory cell array of a semiconductor memory device of a comparative example.

FIG. 16 is an enlarged schematic cross-sectional view of a part of a memory cell array of a semiconductor memory device of a comparative example. FIG. 16 is a view corresponding to FIG. 5 of the first embodiment.

The memory cell array of the semiconductor memory device of the comparative example is different from the memory cell array 101 of the first embodiment in that an entire region of a dielectric layer 14 is a ferroelectric.

In a case of the memory cell array of the comparative example, the entire region of the dielectric layer 14 is the ferroelectric. Therefore, for example, at the time of write operation to a memory cell MC1, polarization inversion of the dielectric layer 14 might unintentionally proceed to a side of a second gate electrode layer 10b. In this case, for example, erroneous write to the memory cell MC2 might occur. That is, interference between the memory cell MC1 and the memory cell MC2 might occur.

As described above, in the memory cell array of the comparative example, since the entire region of the dielectric layer 14 is the ferroelectric, control of a polarization state of a ferroelectric layer might become difficult, and an operation of the memory cell MC might become unstable.

Figure 17:
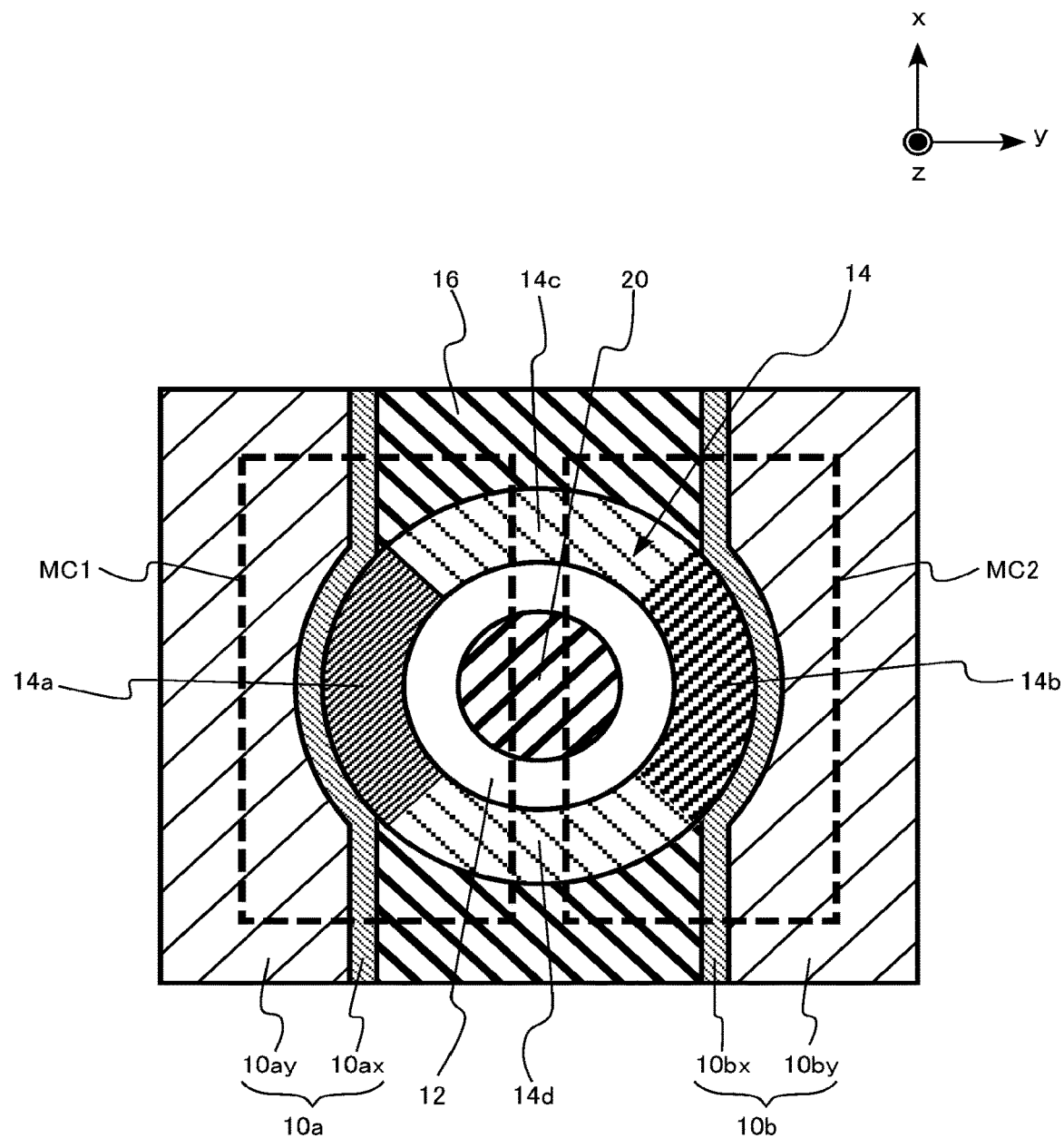
FIG. 17 is an illustrative diagram of a function and an effect of the semiconductor memory device of the first embodiment.

FIG. 17 is an illustrative diagram of the function and effect of the semiconductor memory device of the first embodiment. FIG. 17 is an enlarged schematic cross-sectional view of a part of the memory cell array of the semiconductor memory device of the first embodiment. FIG. 17 is an xy cross-section of the memory cell array 101.

In the memory cell array 101 of the three-dimensional ferroelectric memory 100 of the first embodiment, the dielectric layer 14 is divided into the ferroelectric regions 14a and 14b and the paraelectric regions 14c and 14d. The ferroelectric region 14a of the memory cell MC1 and the ferroelectric region 14b of the memory cell MC2 are divided by the paraelectric regions 14c and 14d.

Therefore, for example, at the time of write operation to the memory cell MC1, polarization inversion of the dielectric layer 14 is suppressed from unintentionally proceeding to a side of the second gate electrode layer 10b. Therefore, for example, erroneous write to the memory cell MC2 is suppressed. Therefore, interference between the memory cell MC1 and the memory cell MC2 is suppressed. In the three-dimensional ferroelectric memory 100 of the first embodiment, controllability of the polarization state of the ferroelectric layer is improved, and the stable operation is realized.

Figure 18:
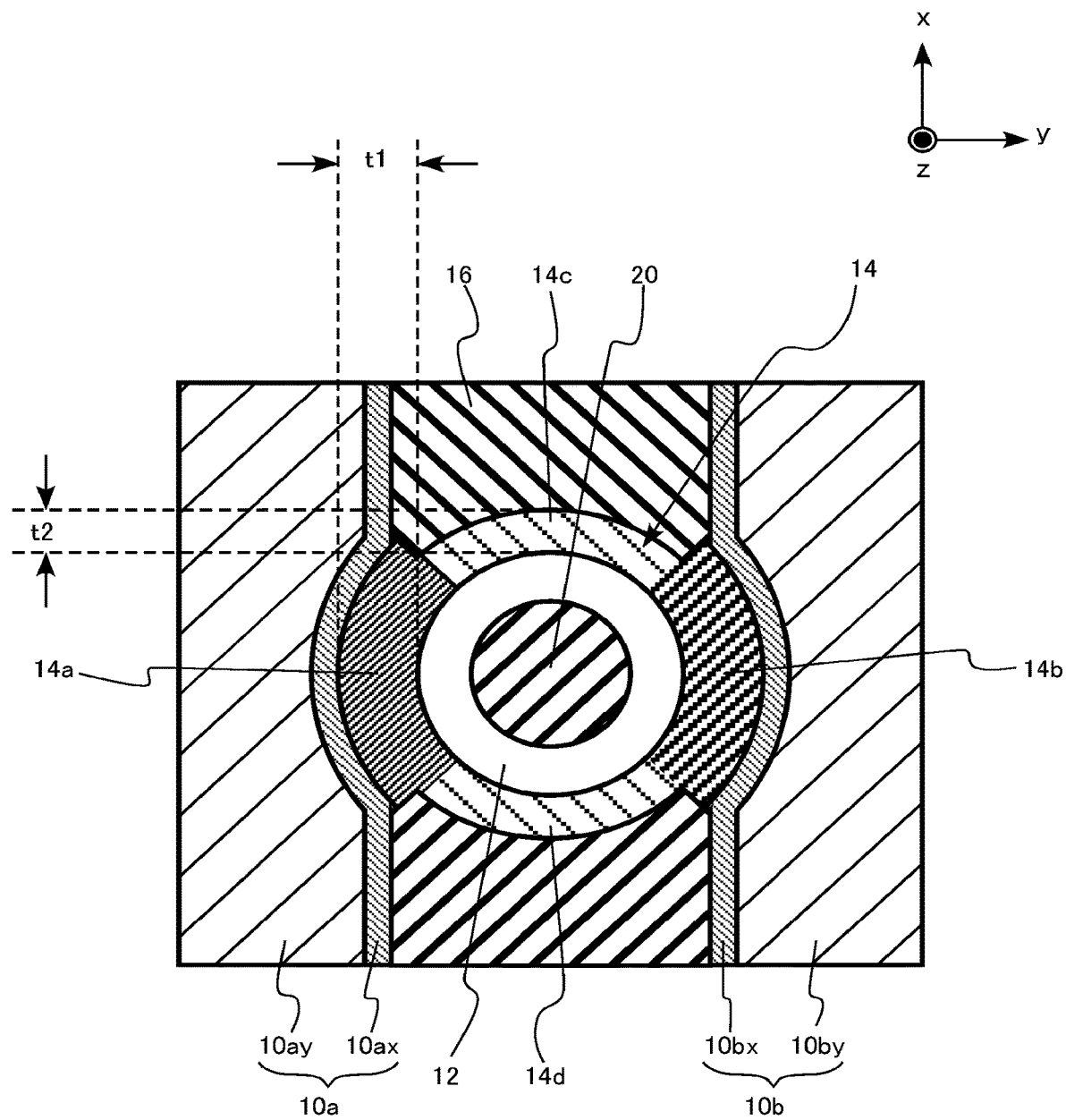
FIG. 18 is an enlarged schematic cross-sectional view of a part of a memory cell array of a variation of the semiconductor memory device of the first embodiment.

FIG. 18 is an enlarged schematic cross-sectional view of a part of a memory cell array of a variation of the semiconductor memory device of the first embodiment. FIG. 18 is a view corresponding to FIG. 5 of the first embodiment.

The memory cell array of the variation is different from the memory cell array 101 of the first embodiment in that a first thickness in a y direction of a ferroelectric region 14a of a dielectric layer 14 (t1 in FIG. 18) is thicker than a second thickness in an x direction of a paraelectric region 14c (t2 in FIG. 18).

The memory cell array of the variation may be manufactured, for example, by removing the SOG layer 56 and then further etching a part of the hafnium oxide layer 58 in the method of manufacturing the memory cell array 101 of the first embodiment.

In the memory cell array of the variation, controllability of a polarization state of the dielectric layer 14 of the memory cell MC is further improved because the thickness t2 in the x direction of the paraelectric region 14c is thin.

As described above, according to the first embodiment, the semiconductor memory device that operates stably with improved controllability of the polarization state of the ferroelectric layer may be realized.

Second Embodiment

A semiconductor memory device of a second embodiment is different from the semiconductor memory device of the first embodiment in further including a metal oxide layer provided between a first gate electrode layer and a dielectric layer and between the first gate electrode layer and a first insulating layer, the metal oxide layer containing metal oxide containing a metal element different from hafnium (Hf) and zirconium (Zr). Hereinafter, a part of description of contents overlapped with those of the first embodiment is not repeated sometimes.

Figure 19:
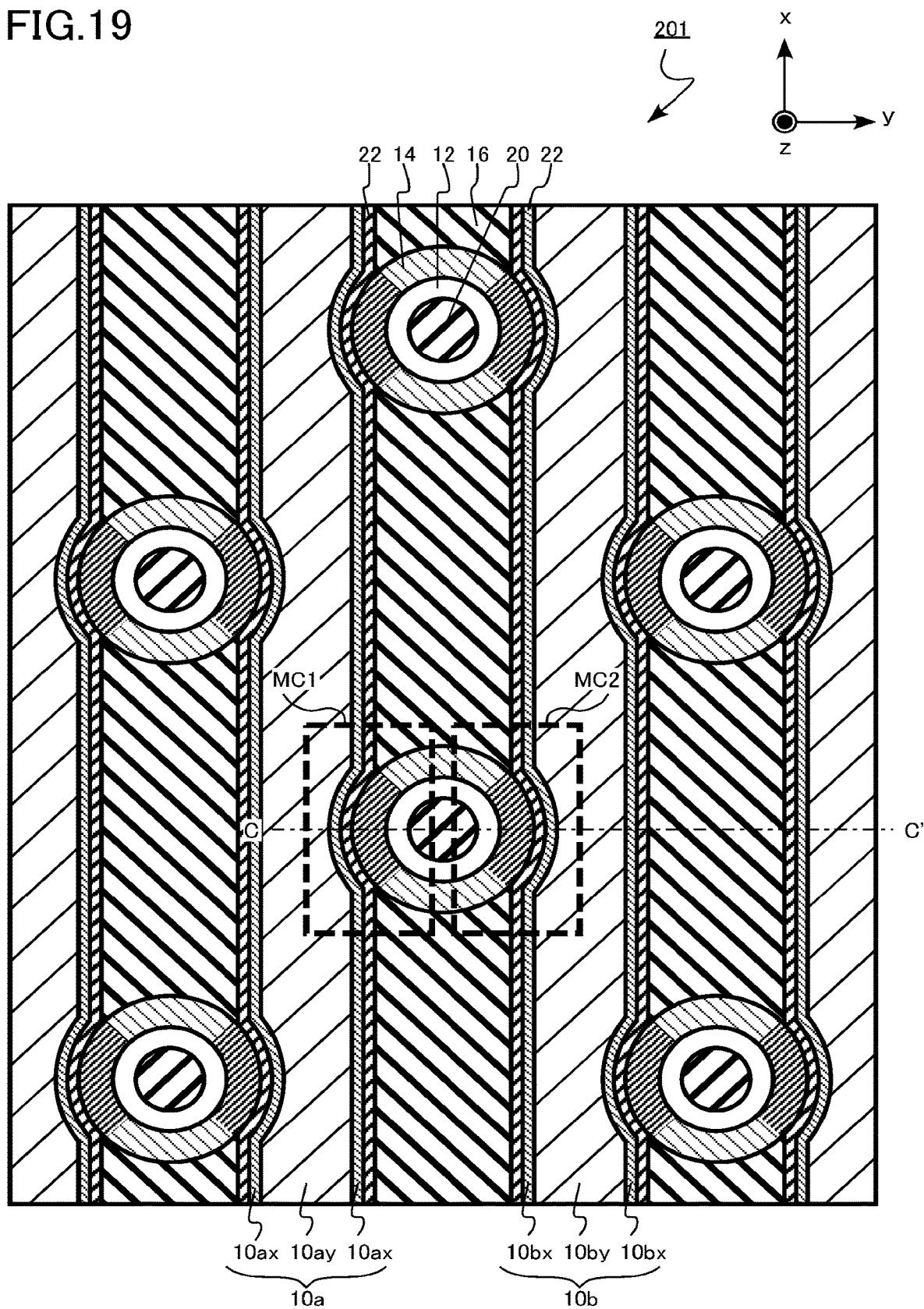
FIG. 19 is a schematic cross-sectional view of a part of a memory cell array of a semiconductor memory device of a second embodiment.
Figure 20:
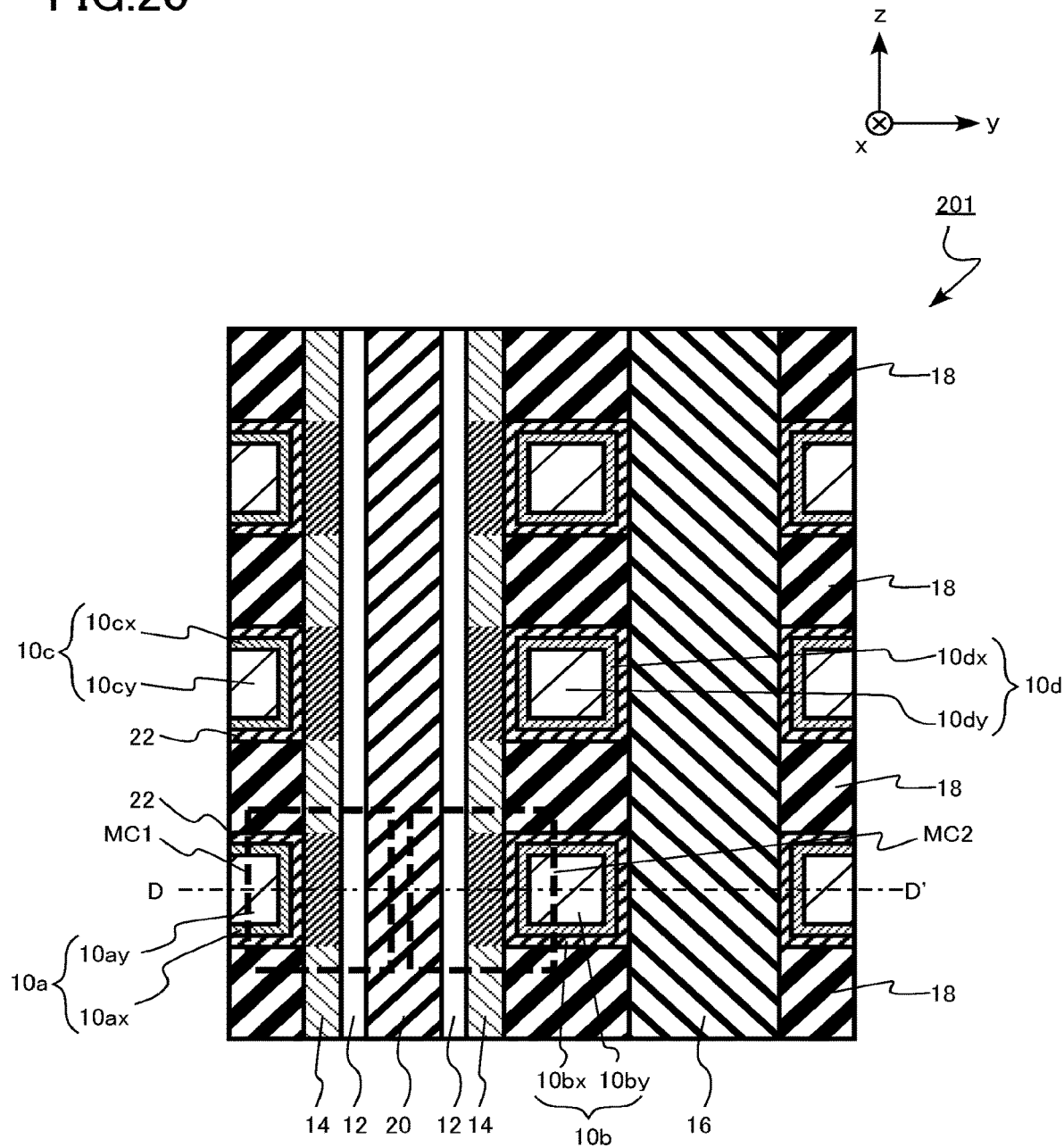
FIG. 20 is a schematic cross-sectional view of a part of the memory cell array of the semiconductor memory device of the second embodiment.

FIGS. 19 and 20 are schematic cross-sectional views of a part of a memory cell array of the semiconductor memory device of the second embodiment. FIG. 19 is an xy cross-section of a memory cell array 201. FIG. 19 is a cross-section including a DD' plane in FIG. 20. FIG. 20 is a yz cross-section of the memory cell array 201. FIG. 20 is a cross-section taken along line CC' in FIG. 19.

In FIGS. 19 and 20, a region enclosed by a broken line is one memory cell MC. FIGS. 19 and 20 illustrate memory cells MC1 and MC2 adjacent to each other in a y direction.

The memory cell array 201 includes a first gate electrode layer 10a, a second gate electrode layer 10b, a third gate electrode layer 10c, a fourth gate electrode layer 10d, a semiconductor layer 12, a dielectric layer 14, a trench insulating layer 16, an interlayer insulating layer 18, a core insulating layer 20, and an intermediate insulating layer 22.

The trench insulating layer 16 is an example of a first insulating layer. The interlayer insulating layer 18 is an example of a second insulating layer. The core insulating layer 20 is an example of a third insulating layer. The intermediate insulating layer 22 is an example of a metal oxide layer.

The intermediate insulating layer 22 is provided between the first gate electrode layer 10a and the dielectric layer 14, between the second gate electrode layer 10b and the dielectric layer 14, between the third gate electrode layer 10c and the dielectric layer 14, and between the fourth gate electrode layer 10d and the dielectric layer 14. The intermediate insulating layer 22 is in contact with, for example, the first gate electrode layer 10a, the second gate electrode layer 10b, the third gate electrode layer 10c, and the fourth gate electrode layer 10d. The intermediate insulating layer 22 is also in contact with, for example, the dielectric layer 14.

The intermediate insulating layer 22 is provided between the first gate electrode layer 10a and the trench insulating layer 16, between the second gate electrode layer 10b and the trench insulating layer 16, between the third gate electrode layer 10c and the trench insulating layer 16, and between the fourth gate electrode layer 10d and the trench insulating layer 16. The intermediate insulating layer 22 is in contact with, for example, the trench insulating layer 16.

The intermediate insulating layer 22 contains metal oxide. The metal oxide contained in the intermediate insulating layer 22 contains a metal element different from hafnium (Hf) and zirconium (Zr). The intermediate insulating layer 22 contains, for example, titanium (Ti). The intermediate insulating layer 22 contains, for example, titanium oxide. The intermediate insulating layer 22 is, for example, a titanium oxide layer.

A thickness of the intermediate insulating layer 22 in the y direction is, for example, 0.5 nm or more and 3 nm or less.

The first gate electrode layer 10a, the second gate electrode layer 10b, the third gate electrode layer 10c, and the fourth gate electrode layer 10d contain, for example, the same metal element as the metal element contained in the intermediate insulating layer 22. The first gate electrode layer 10a, the second gate electrode layer 10b, the third gate electrode layer 10c, and the fourth gate electrode layer 10d contain, for example, titanium (Ti).

A barrier metal layer 10ax of the first gate electrode layer 10a, a barrier metal layer 10bx of the second gate electrode layer 10b, a barrier metal layer 10cx of the third gate electrode layer 10c, and a barrier metal layer 10dx of the fourth gate electrode layer 10d contain, for example, titanium (Ti). The barrier metal layer 10ax of the first gate electrode layer 10a, the barrier metal layer 10bx of the second gate electrode layer 10b, the barrier metal layer 10cx of the third gate electrode layer 10c, and the barrier metal layer 10dx of the fourth gate electrode layer 10d are, for example, titanium nitride layers.

The dielectric layer 14 is divided into a ferroelectric region and a paraelectric region in a z direction. The dielectric layer 14 between the intermediate insulating layer 22 and the semiconductor layer 12 is the ferroelectric region, whereas the dielectric layer 14 between the interlayer insulating layer 18 and the semiconductor layer 12 is the paraelectric region.

Next, an example of a method of manufacturing the semiconductor memory device of the second embodiment is described. The method of manufacturing the semiconductor memory device of the second embodiment is different from the method of manufacturing the semiconductor memory device of the first embodiment in that the titanium oxide layer is formed and a void is not formed.

FIGS. 21, 22, 23, 24, 25, and 26 are schematic cross-sectional views illustrating the method of manufacturing the semiconductor memory device of the second embodiment. FIGS. 21 to 26 are views illustrating an example of a method of manufacturing the memory cell array 201 of a three-dimensional ferroelectric memory 200.

Upper views in FIGS. 21 to 26 are xy cross-sections of the memory cell array 201. The upper views in FIGS. 21 to 26 are views corresponding to a part of FIG. 19. Lower views in FIGS. 21 to 26 are yz cross-sections of the memory cell array 201. The lower views in FIGS. 21 to 26 are views corresponding to FIG. 20.

The method is similar to the method of manufacturing the semiconductor memory device of the first embodiment until forming a memory trench 55 in a plurality of silicon oxide layers 51 and a plurality of silicon nitride layers 52.

Figure 21:
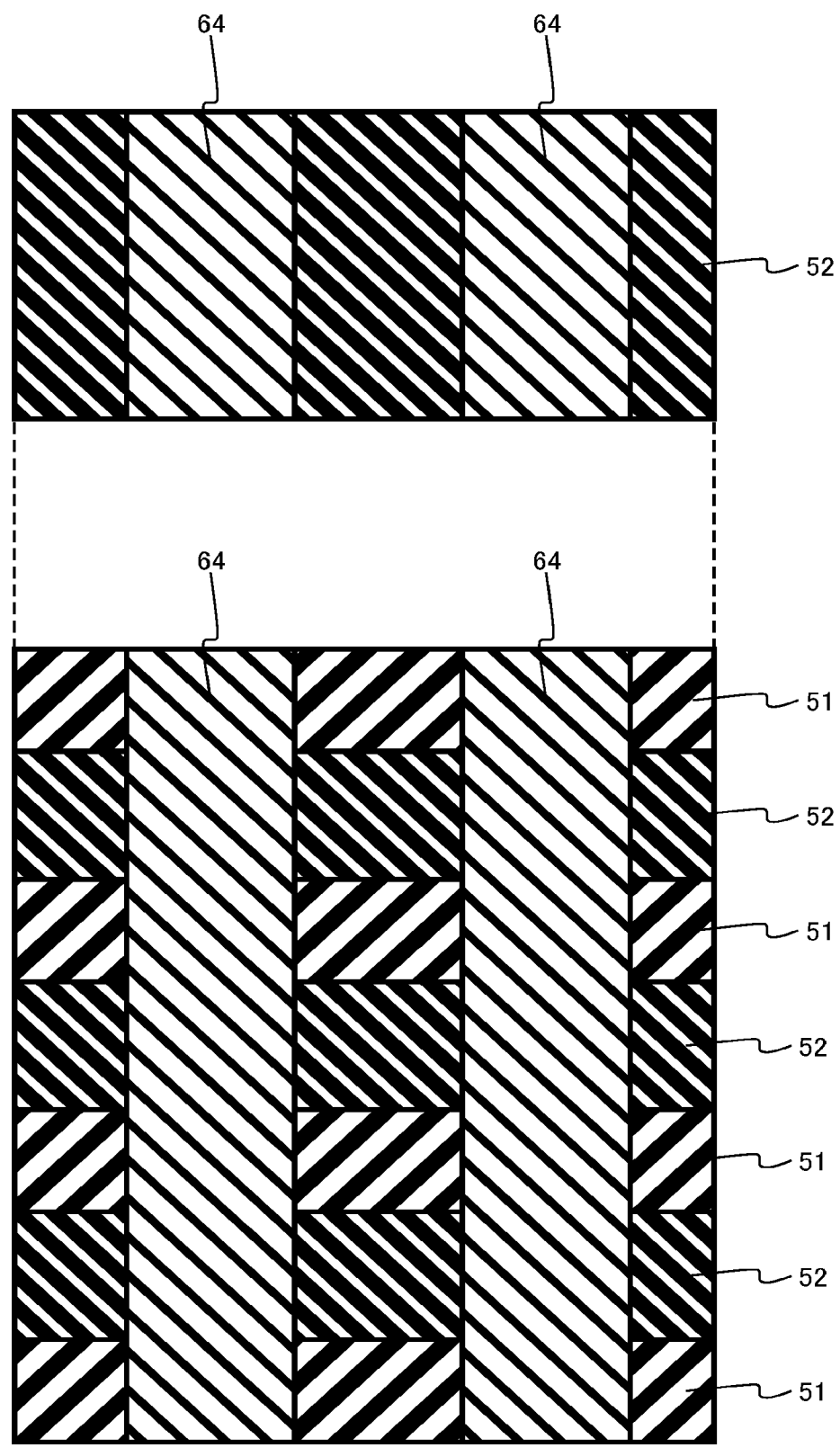
FIG. 21 is a schematic cross-sectional view illustrating a method of manufacturing the semiconductor memory device of the second embodiment.

Next, a silicon oxide layer 64 is buried in the memory trench 55 (FIG. 21). The silicon oxide layer 64 finally becomes the trench insulating layer 16.

Figure 22:
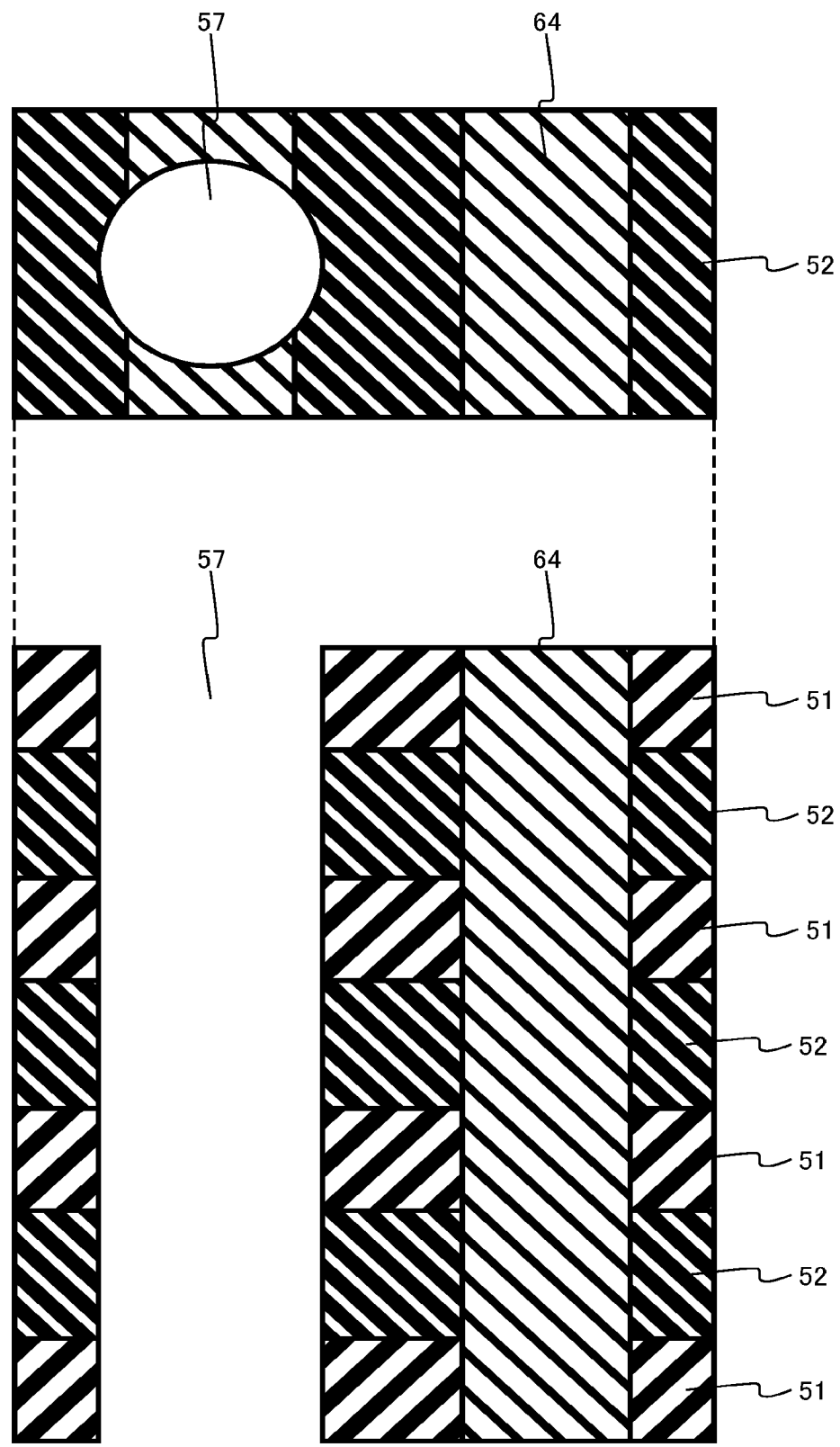
FIG. 22 is a schematic cross-sectional view illustrating the method of manufacturing the semiconductor memory device of the second embodiment.

Next, a memory hole 57 is formed in a part of the silicon oxide layer 64, a plurality of silicon oxide layers 51, and a plurality of silicon nitride layers 52 (FIG. 22). The memory hole 57 is formed by, for example, the lithography method and the RIE method.

Figure 23:
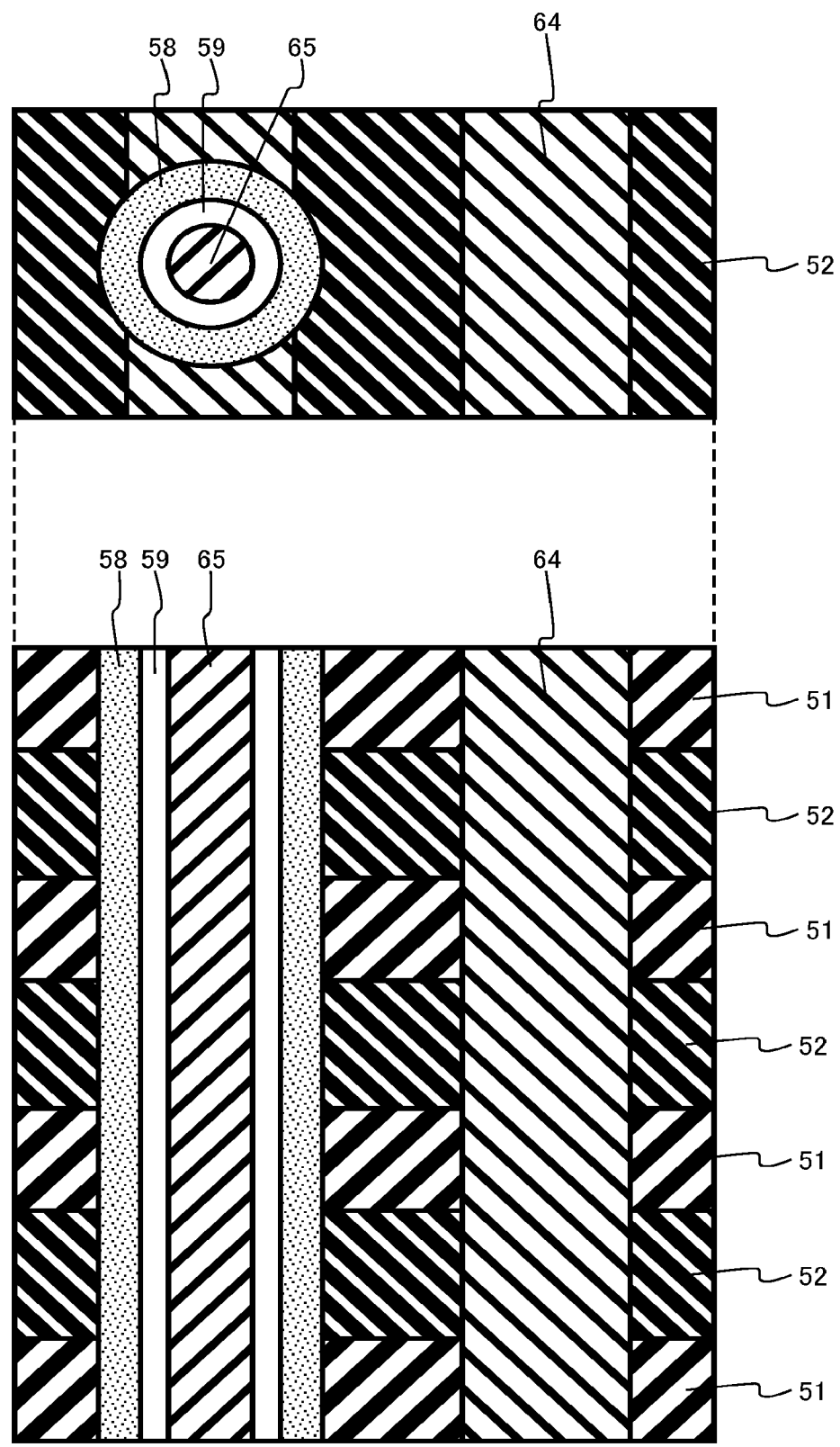
FIG. 23 is a schematic cross-sectional view illustrating the method of manufacturing the semiconductor memory device of the second embodiment.

Next, a hafnium oxide layer 58, a polycrystalline silicon layer 59, and a silicon oxide layer 65 are formed in the memory hole 57 (FIG. 23). The hafnium oxide layer 58 is formed by, for example, an ALD method. The polycrystalline silicon layer 59 and the silicon oxide layer 65 are formed by, for example, a CVD method.

The hafnium oxide layer 58 finally becomes the dielectric layer 14. The polycrystalline silicon layer 59 finally becomes the semiconductor layer 12. The silicon oxide layer 65 finally becomes the core insulating layer 20.

Figure 24:
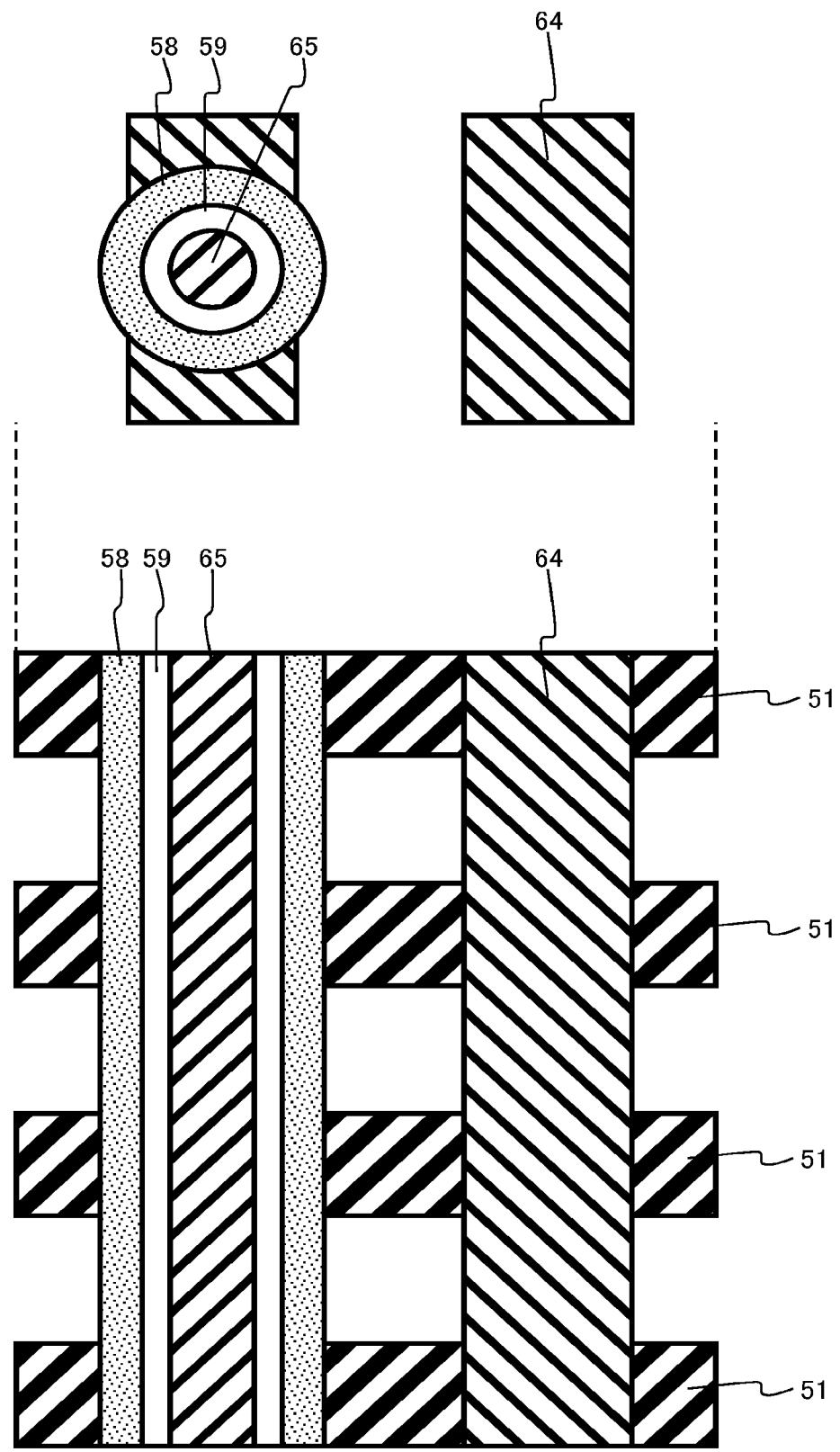
FIG. 24 is a schematic cross-sectional view illustrating the method of manufacturing the semiconductor memory device of the second embodiment.

Next, a plurality of silicon nitride layers 52 is removed (FIG. 24). A plurality of silicon nitride layers 52 is removed by a wet etching method using, for example, an opening not illustrated.

Figure 25:
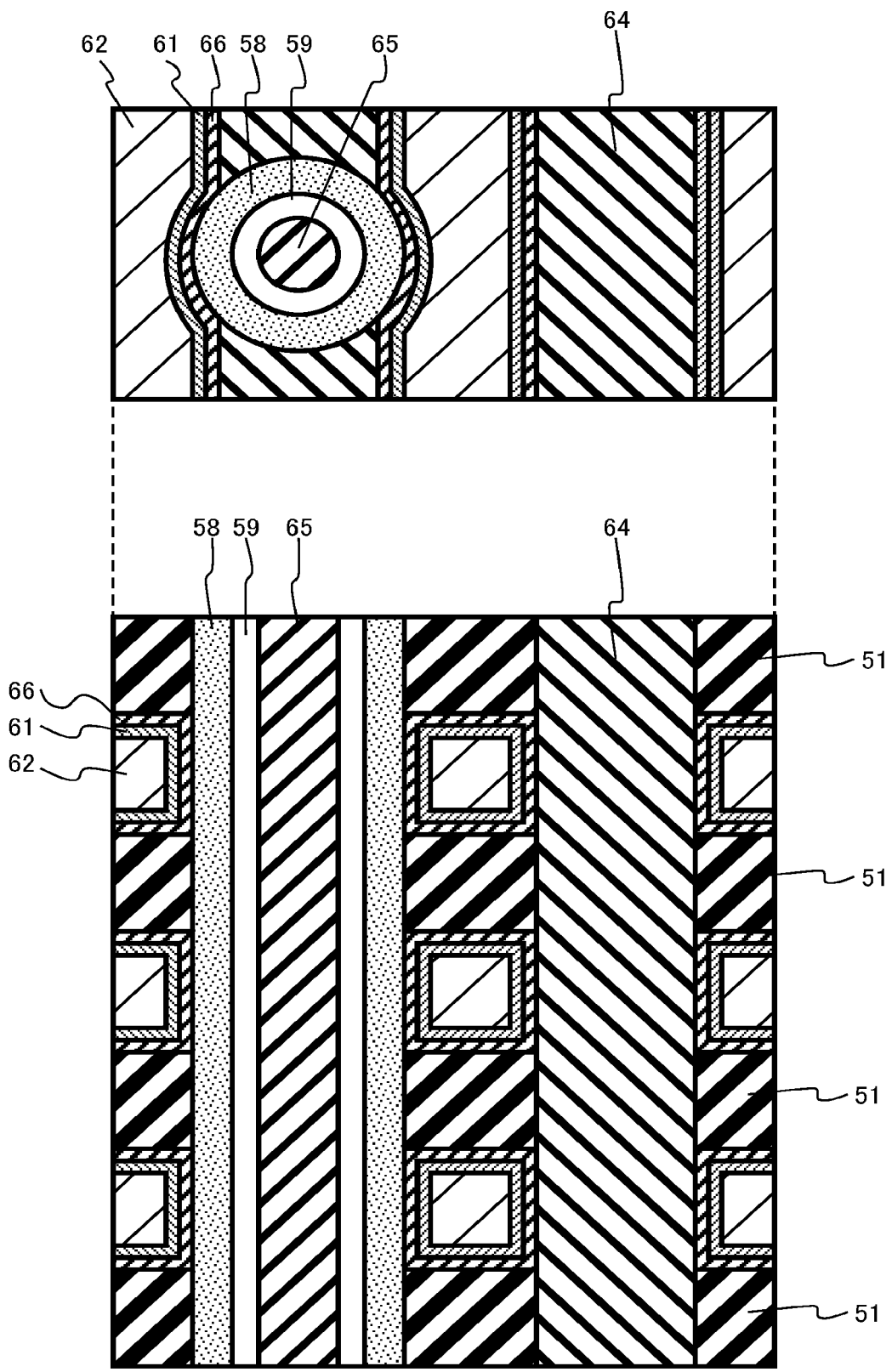
FIG. 25 is a schematic cross-sectional view illustrating the method of manufacturing the semiconductor memory device of the second embodiment.

Next, a titanium oxide layer 66, a titanium nitride layer 61, and a tungsten layer 62 are formed (FIG. 25). The titanium oxide layer 66, the titanium nitride layer 61, and the tungsten layer 62 are formed by, for example, the CVD method.

The titanium oxide layer 66 finally becomes the intermediate insulating layer 22. The titanium nitride layer 61 finally becomes the barrier metal layers 10ax, 10bx, 10cx, and 10dx. The tungsten layer 62 finally becomes the metal layer 10ay, the metal layer 10by, the metal layer 10cy, and the metal layer 10dy.

Figure 26:
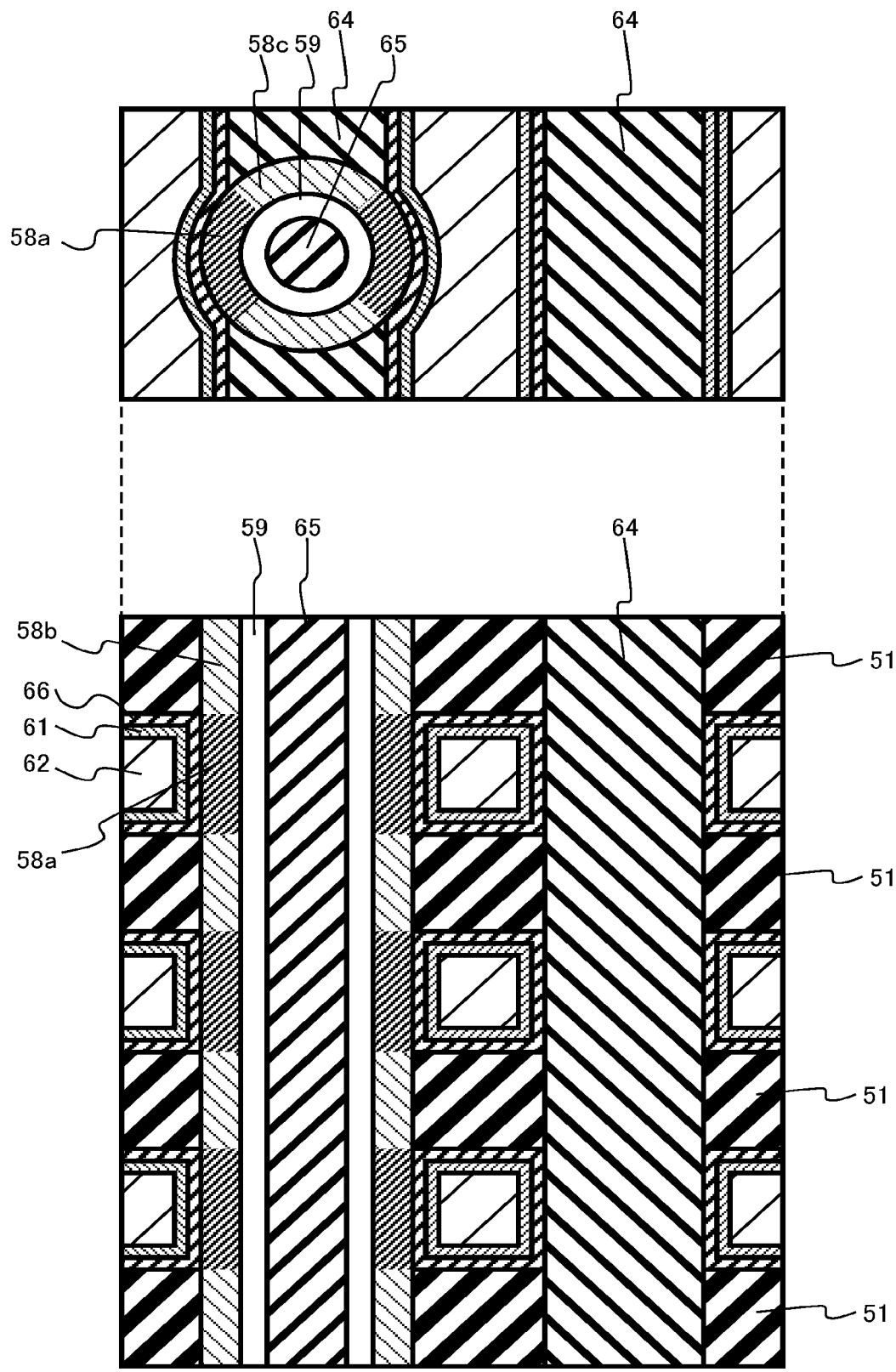
FIG. 26 is a schematic cross-sectional view illustrating the method of manufacturing the semiconductor memory device of the second embodiment.

Next, heat treatment is performed to crystallize the hafnium oxide layer 58 (FIG. 26). The heat treatment is performed, for example, in a nitrogen gas atmosphere at temperature of 600° C. or higher and 1050° C. or lower. The heat treatment is so-called crystallization annealing.

By the heat treatment, in the hafnium oxide layer 58, crystallization of a region 58a interposed between the polycrystalline silicon layer 59 and the titanium oxide layer 66 is promoted due to the titanium oxide layer 66, and the region 58a becomes crystals of an orthorhombic crystal system or a trigonal crystal system. On the other hand, a region 58b interposed between the polycrystalline silicon layer 59 and the silicon oxide layer 51, and a region 58c interposed between the polycrystalline silicon layer 59 and the silicon oxide layer 64 become crystals other than the crystals of the orthorhombic crystal system or trigonal crystal system or an amorphous phase.

In other words, the region 58a interposed between the polycrystalline silicon layer 59 and the titanium oxide layer 66 becomes a ferroelectric. On the other hand, the region 58b interposed between the polycrystalline silicon layer 59 and the silicon oxide layer 51, and the region 58c interposed between the polycrystalline silicon layer 59 and the silicon oxide layer 64 become paraelectric.

The region 58a interposed between the polycrystalline silicon layer 59 and the titanium oxide layer 66 finally becomes a ferroelectric region 14a and a ferroelectric region 14b. The region 58c interposed between the polycrystalline silicon layer 59 and the silicon oxide layer 64 finally becomes a paraelectric region 14c and a paraelectric region 14d.

The silicon oxide layer 64 preferably contains aluminum oxide. When the silicon oxide layer 64 contains aluminum oxide, growth of the crystals of the orthorhombic crystal system or trigonal crystal system in the region 58c interposed between the polycrystalline silicon layer 59 and the silicon oxide layer 64 is suppressed.

By the above-described manufacturing method, the memory cell array 201 of the three-dimensional ferroelectric memory 200 of the second embodiment is manufactured.

As described above, according to the second embodiment, the semiconductor memory device that operates stably with improved controllability of a polarization state of a ferroelectric layer may be realized as in the first embodiment.

Third Embodiment

A dielectric layer is different from that of the semiconductor memory device of the first embodiment in further including a fourth region having a substance other than at least one crystal of an orthorhombic crystal system or a trigonal crystal system as a main component substance between a second insulating layer and a semiconductor layer. Hereinafter, a part of description of contents overlapped with those of the first embodiment is not repeated sometimes.

Figure 27:
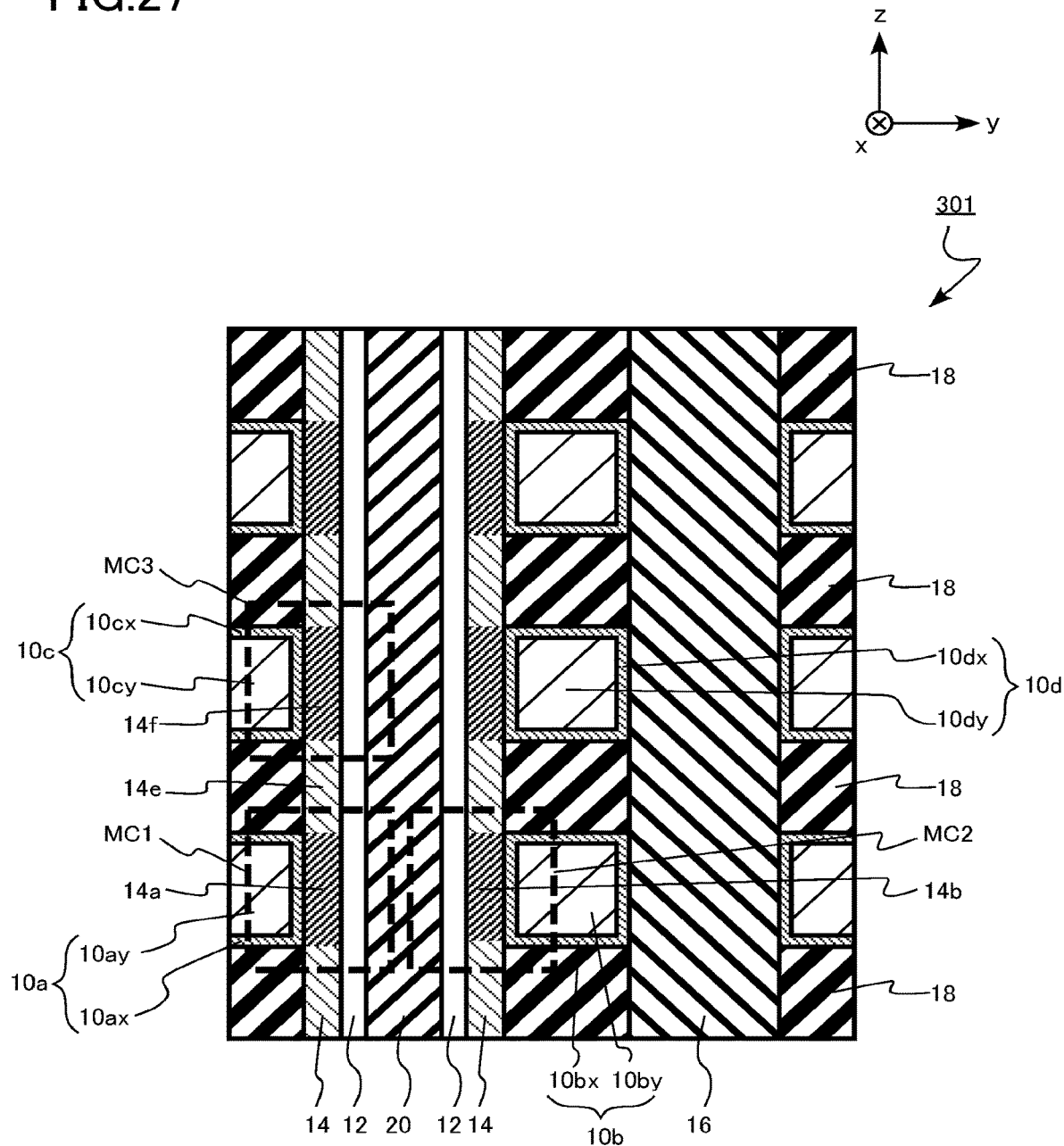
FIG. 27 is a schematic cross-sectional view of a part of a memory cell array of a semiconductor memory device of a third embodiment.

FIG. 27 is a schematic cross-sectional view of a part of a memory cell array of the semiconductor memory device of the third embodiment. FIG. 27 is a yz cross-section of a memory cell array 301. FIG. 27 is a cross-section corresponding to FIG. 4.

In FIG. 27, a region enclosed by a broken line is one memory cell MC. FIG. 27 illustrates memory cells MC1 and MC2 adjacent to each other in a y direction. This also illustrates a memory cell MC3 adjacent to the memory cell MC1 in a z direction.

The memory cell array 301 includes a first gate electrode layer 10a, a second gate electrode layer 10b, a third gate electrode layer 10c, a fourth gate electrode layer 10d, a semiconductor layer 12, a dielectric layer 14, a trench insulating layer 16, an interlayer insulating layer 18, and a core insulating layer 20.

The trench insulating layer 16 is an example of a first insulating layer. The interlayer insulating layer 18 is an example of a second insulating layer. The core insulating layer 20 is an example of a third insulating layer.

The interlayer insulating layer 18 is provided between the first gate electrode layer 10a and the third gate electrode layer 10c, and between the second gate electrode layer 10b and the fourth gate electrode layer 10d.

The interlayer insulating layer 18 contains, for example, aluminum oxide. The interlayer insulating layer 18 is, for example, an aluminum oxide layer.

The dielectric layer 14 surrounds the semiconductor layer 12. The dielectric layer 14 is provided between the first gate electrode layer 10a and the semiconductor layer 12, between the second gate electrode layer 10b and the semiconductor layer 12, between the third gate electrode layer 10c and the semiconductor layer 12, and between the fourth gate electrode layer 10d and the semiconductor layer 12.

The dielectric layer 14 is provided between the trench insulating layer 16 and the semiconductor layer 12, and between the interlayer insulating layer 18 and the semiconductor layer 12. The dielectric layer 14 extends in the z direction. The dielectric layer 14 has, for example, a cylindrical shape.

A part of the dielectric layer 14 is a ferroelectric. A part of the dielectric layer 14 serves as the gate insulating layer of the transistor of the memory cell MC.

The dielectric layer 14 contains an oxygen and at least one of hafnium (Hf) or zirconium (Zr). The dielectric layer 14 contains an oxide containing at least any one of hafnium oxide and zirconium oxide. The dielectric layer 14 is, for example, a hafnium oxide layer. The dielectric layer 14 is, for example, a zirconium oxide layer. A thickness of the dielectric layer 14 on the xy plane is, for example, 5 nm or more and 40 nm or less.

The dielectric layer 14 includes a ferroelectric region 14*a*, a ferroelectric region 14*b*, a paraelectric region 14*c*, a paraelectric region 14*d*, a paraelectric region 14*e*, and a ferroelectric region 14*f*. The paraelectric region 14*e* is an example of the fourth region.

The ferroelectric region 14*a* is provided between the first gate electrode layer 10*a* and the semiconductor layer 12. The ferroelectric region 14*b* is provided between the second gate electrode layer 10*b* and the semiconductor layer 12.

The paraelectric region 14*c* is provided between the trench insulating layer 16 and the semiconductor layer 12. The trench insulating layer 16 is in contact with the paraelectric region 14*c*. The paraelectric region 14*c* is provided between the ferroelectric region 14*a* and the ferroelectric region 14*b*.

The paraelectric region 14*d* is provided between the trench insulating layer 16 and the semiconductor layer 12. The trench insulating layer 16 is in contact with the paraelectric region 14*d*. The paraelectric region 14*d* is provided between the ferroelectric region 14*a* and the ferroelectric region 14*b*.

The paraelectric region 14*e* is provided between the interlayer insulating layer 18 between the first gate electrode layer 10*a* and the third gate electrode layer 10*c*, and the semiconductor layer 12. The interlayer insulating layer 18 is in contact with the paraelectric region 14*e*. The paraelectric region 14*e* is adjacent to the ferroelectric region 14*a* in the z direction.

The ferroelectric region 14*f* is provided between the third gate electrode layer 10*c* and the semiconductor layer 12. The paraelectric region 14*e* is interposed between the ferroelectric region 14*a* and the ferroelectric region 14*f*.

The paraelectric region 14*e* has a substance other than crystals of an orthorhombic crystal system or a trigonal crystal system as a main component substance. In the paraelectric region 14*e*, an existence ratio of crystals other than the crystals of the orthorhombic crystal system or trigonal crystal system or an amorphous phase is larger than that of crystals of the orthorhombic crystal system or trigonal crystal system. The paraelectric region 14*e* is a crystalline substance or an amorphous substance.

The paraelectric region 14*e* is a paraelectric. An oxide contained in the paraelectric region 14*e* is a paraelectric.

The ferroelectric region 14*f* has crystals of an orthorhombic crystal system or a trigonal crystal system as a main component substance. In the ferroelectric region 14*f*, an existence ratio of the crystals of the orthorhombic crystal system or trigonal crystal system is larger than that of crystals other than the crystals of the orthorhombic crystal system or trigonal crystal system or an amorphous phase. The ferroelectric region 14*f* is a crystalline substance.

The ferroelectric region 14*f* is a ferroelectric. An oxide contained in the ferroelectric region 14*f* is a ferroelectric.

The memory cell array 301 of the third embodiment may be formed by alternately stacking a plurality of aluminum oxide layers in place of silicon oxide layers 51 and a plurality of silicon nitride layers 52 on a semiconductor substrate at a step illustrated in FIG. 6 of the method of manufacturing the semiconductor memory device of the first embodiment, for example. For example, when the hafnium oxide layer is in contact with the aluminum oxide layer at the time of crystallization annealing of crystallizing the hafnium oxide layer, growth of the crystals of the orthorhombic crystal system or trigonal crystal system in the hafnium oxide layer is suppressed.

In the memory cell array 301 of the three-dimensional ferroelectric memory 300 of the third embodiment, the dielectric layer 14 is divided into the ferroelectric region 14*a*, the paraelectric region 14*e*, and the ferroelectric region 14*f*. The ferroelectric region 14*a* of the memory cell MC1 and the ferroelectric region 14*f* of the memory cell MC3 disposed in the z direction of the memory cell MC1 are divided by the paraelectric region 14*e*.

Therefore, for example, at the time of write operation to the memory cell MC1, polarization inversion of the dielectric layer 14 is suppressed from unintentionally proceeding to a side of the third gate electrode layer 10*c*. Therefore, for example, erroneous write to the memory cell MC3 is suppressed. Therefore, interference between the memory cells MCs is further suppressed as compared to that in the semiconductor memory device of the first embodiment.

As described above, according to the third embodiment, the semiconductor memory device that operates further stably with further improved controllability of the polarization state of the ferroelectric layer as compared to that of the first embodiment may be realized.

Fourth Embodiment

A semiconductor memory device of a fourth embodiment includes, a first gate electrode layer extending in a first direction; a second gate electrode layer extending in the first direction, the second gate electrode layer spaced from the first gate electrode layer in a second direction intersecting with the first direction; a semiconductor layer provided between the first gate electrode layer and the second gate electrode layer, the semiconductor layer extending in a third direction intersecting with the first direction and the second direction; a first dielectric layer provided between the first gate electrode layer and the semiconductor layer, the first dielectric layer containing oxygen and at least one of hafnium or zirconium; a second dielectric layer provided between the second gate electrode layer and the semiconductor layer, the second dielectric layer containing oxygen and at least one of hafnium or zirconium; and a first insulating layer provided between the first gate electrode layer and the second gate electrode layer, the first insulating layer being adjacent to the semiconductor layer in the first direction. The first dielectric layer includes a first region containing at least one crystal of an orthorhombic crystal system or a trigonal crystal system as a main component substance and a second region containing a substance other than at least one crystal of the orthorhombic crystal system or the trigonal crystal system as a main component substance, the second region provided between the first region and the first insulating layer, the second dielectric layer includes a third region containing at least one crystal of the orthorhombic crystal system or the trigonal crystal system as a main component substance and a fourth region containing the substance other than at least one crystal of the orthorhombic crystal system or the trigonal crystal system as a main component substance, and the fourth region is provided between the third region and the first insulating layer.

The semiconductor memory device of the fourth embodiment is a three-dimensional ferroelectric memory 400. The three-dimensional ferroelectric memory 400 of the fourth embodiment is a ferroelectric memory to which a FeFET type three-terminal memory is applied as a memory cell MC.

The three-dimensional ferroelectric memory 400 of the fourth embodiment has a circuit configuration similar to the circuit configuration illustrated in FIG. 1 of the first embodiment. A memory cell array 401 of the three-dimensional ferroelectric memory 400 is provided with an equivalent circuit similar to the equivalent circuit illustrated in FIG. 2 of the first embodiment.

Figure 28:
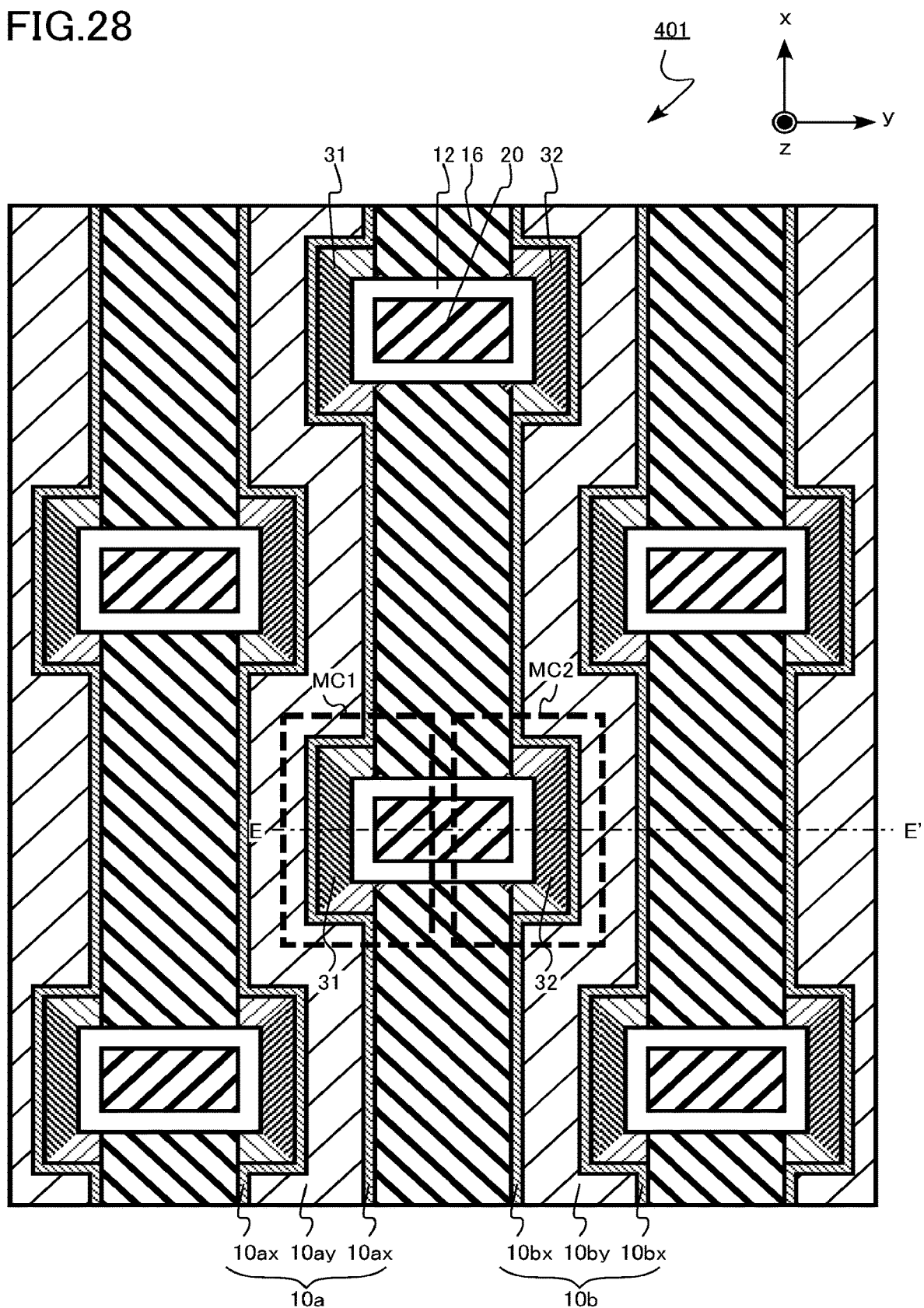
FIG. 28 is a schematic cross-sectional view of a part of a memory cell array of a semiconductor memory device of a fourth embodiment.
Figure 29:
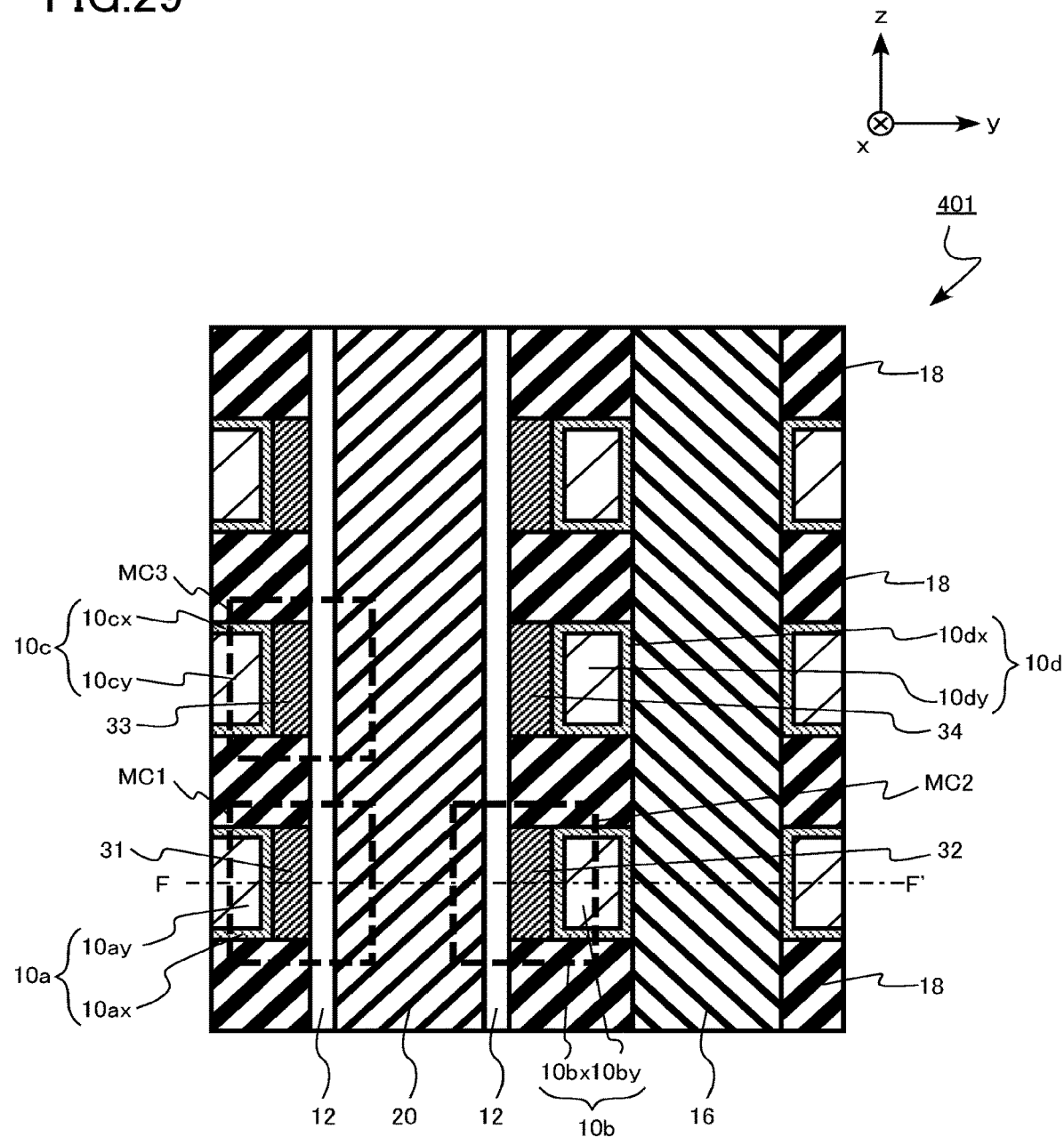
FIG. 29 is a schematic cross-sectional view of a part of the memory cell array of the semiconductor memory device of the fourth embodiment.

FIGS. 28 and 29 are schematic cross-sectional views of a part of the memory cell array of the semiconductor memory device of the fourth embodiment. FIG. 28 is an xy cross-section of the memory cell array 401. FIG. 28 is a cross-section including a FF' plane in FIG. 29. FIG. 29 is a yz cross-section of the memory cell array 401. FIG. 29 is a cross-section taken along line EE' in FIG. 28.

In FIGS. 28 and 29, a region enclosed by a broken line is one memory cell MC. FIGS. 28 and 29 illustrate memory cells MC1 and MC2 adjacent to each other in a y direction. FIG. 29 also illustrates a memory cell MC3 adjacent to the memory cell MC1 in a z direction.

The memory cell array 401 is provided with a first gate electrode layer 10a, a second gate electrode layer 10b, a third gate electrode layer 10c, a fourth gate electrode layer 10d, a semiconductor layer 12, a trench insulating layer 16, an interlayer insulating layer 18, a core insulating layer 20, a first dielectric layer 31, a second dielectric layer 32, a third dielectric layer 33, and a fourth dielectric layer 34.

The trench insulating layer 16 is an example of a first insulating layer. The interlayer insulating layer 18 is an example of a second insulating layer.

The first gate electrode layer 10a extends in the x direction. The first gate electrode layer 10a corresponds to, for example, the word line WLa illustrated in FIG. 2. The first gate electrode layer 10a serves as a gate electrode of a transistor of the memory cell MC1.

The first gate electrode layer 10a includes a barrier metal layer 10ax and a metal layer 10ay.

The barrier metal layer 10ax is, for example, metal nitride or metal carbide. The barrier metal layer 10ax contains, for example, titanium nitride. The barrier metal layer 10ax is, for example, a titanium nitride layer.

The metal layer 10ay is, for example, metal. The metal layer 10ay contains, for example, tungsten (W). The metal layer 10ay is, for example, a tungsten layer.

The second gate electrode layer 10b extends in the x direction. The second gate electrode layer 10b is provided so as to be spaced apart from the first gate electrode layer 10a in the y direction. The second gate electrode layer 10b is spaced from the first gate electrode layer 10a in the y direction. The second gate electrode layer 10b is adjacent to the first gate electrode layer 10a in the y direction. The second gate electrode layer 10b corresponds to, for example, the word line WLb illustrated in FIG. 2. The second gate electrode layer 10b serves as a gate electrode of a transistor of the memory cell MC2.

The second gate electrode layer 10b includes a barrier metal layer 10bx and a metal layer 10by.

The barrier metal layer 10bx is, for example, metal nitride or metal carbide. The barrier metal layer 10bx contains, for example, titanium nitride. The barrier metal layer 10bx is, for example, a titanium nitride layer.

The metal layer 10by is, for example, metal. The metal layer 10by contains, for example, tungsten (W). The metal layer 10by is, for example, a tungsten layer.

The third gate electrode layer 10c extends in the x direction. The third gate electrode layer 10c is provided so as to be spaced apart from the first gate electrode layer 10a in the z direction. The third gate electrode layer 10c is adjacent to the first gate electrode layer 10a in the z direction. The third gate electrode layer 10c corresponds to, for example, the word line WLa illustrated in FIG. 2. The third gate electrode layer 10c serves as a gate electrode of a transistor of the memory cell MC3.

The third gate electrode layer 10c includes a barrier metal layer 10cx and a metal layer 10cy.

The barrier metal layer 10cx is, for example, metal nitride or metal carbide. The barrier metal layer 10cx contains, for example, titanium nitride. The barrier metal layer 10cx is, for example, a titanium nitride layer.

The metal layer 10cy is, for example, metal. The metal layer 10cy contains, for example, tungsten (W). The metal layer 10cy is, for example, a tungsten layer.

The fourth gate electrode layer 10d extends in the x direction. The fourth gate electrode layer 10d is provided so as to be spaced apart from the third gate electrode layer 10c in the y direction. The fourth gate electrode layer 10d is adjacent to the third gate electrode layer 10c in the y direction. The fourth gate electrode layer 10d is also adjacent to the second gate electrode layer 10b in the z direction. The fourth gate electrode layer 10d corresponds to, for example, the word line WLb illustrated in FIG. 2. The fourth gate electrode layer 10d serves as the gate electrode of the transistor of the memory cell MC.

The fourth gate electrode layer 10d includes a barrier metal layer 10dx and a metal layer 10dy.

The barrier metal layer 10dx is, for example, metal nitride or metal carbide. The barrier metal layer 10dx contains, for example, titanium nitride. The barrier metal layer 10dx is, for example, a titanium nitride layer.

The metal layer 10dy is, for example, metal. The metal layer 10dy contains, for example, tungsten (W). The metal layer 10dy is, for example, a tungsten layer.

The semiconductor layer 12 is provided between the first gate electrode layer 10a and the second gate electrode layer 10b. The semiconductor layer 12 is provided between the third gate electrode layer 10c and the fourth gate electrode layer 10d. The semiconductor layer 12 extends in the z direction. The semiconductor layer 12 has, for example, a cylindrical shape.

The semiconductor layer 12 serves as a channel of the transistor of the memory cell MC.

The semiconductor layer 12 is, for example, a polycrystalline semiconductor. The semiconductor layer 12 contains, for example, polycrystalline silicon. The semiconductor layer 12 is, for example, a polycrystalline silicon layer. A thickness of the semiconductor layer 12 on an xy plane is, for example, 5 nm or more and 30 nm or less.

The first dielectric layer 31 is provided between the first gate electrode layer 10a and the semiconductor layer 12. The first dielectric layer 31 is provided between two interlayer insulating layers 18 adjacent to each other in the z direction.

A part of the first dielectric layer 31 is a ferroelectric. A part of the first dielectric layer 31 serves as a gate insulating layer of the transistor of the memory cell MC1.

The second dielectric layer 32 is provided between the second gate electrode layer 10b and the semiconductor layer 12. The second dielectric layer 32 is provided between the two interlayer insulating layers 18 adjacent to each other in the z direction.

A part of the second dielectric layer 32 is a ferroelectric. A part of the second dielectric layer 32 serves as a gate insulating layer of the transistor of the memory cell MC2.

The third dielectric layer 33 is provided between the third gate electrode layer 10c and the semiconductor layer 12. The third dielectric layer 33 is provided between the two interlayer insulating layers 18 adjacent to each other in the z direction.

A part of the third dielectric layer 33 is a ferroelectric. A part of the third dielectric layer 33 serves as a gate insulating layer of the transistor of the memory cell MC3.

The fourth dielectric layer 34 is provided between the fourth gate electrode layer 10d and the semiconductor layer 12. The fourth dielectric layer 34 is provided between the two interlayer insulating layers 18 adjacent to each other in the z direction.

A part of the fourth dielectric layer 34 is a ferroelectric. A part of the fourth dielectric layer 34 serves as a gate insulating layer of the transistor of the memory cell MC.

The first dielectric layer 31 and the second dielectric layer 32 are spaced apart from each other. The first dielectric layer 31 and the third dielectric layer 33 are spaced apart from each other.

The first dielectric layer 31, the second dielectric layer 32, the third dielectric layer 33, and the fourth dielectric layer 34 contain oxygen and at least one of hafnium (Hf) or zirconium (Zr). The first dielectric layer 31, the second dielectric layer 32, the third dielectric layer 33, and the fourth dielectric layer 34 contain an oxide containing at least one of hafnium oxide or zirconium oxide. The first dielectric layer 31, the second dielectric layer 32, the third dielectric layer 33, and the fourth dielectric layer 34 are, for example, hafnium oxide layers. The first dielectric layer 31, the second dielectric layer 32, the third dielectric layer 33, and the fourth dielectric layer 34 are, for example, zirconium oxide layers. Thicknesses of the first dielectric layer 31, the second dielectric layer 32, the third dielectric layer 33, and the fourth dielectric layer 34 in the y direction are, for example, 5 nm or more and 40 nm or less.

The trench insulating layer 16 is provided between the first gate electrode layer 10a and the second gate electrode layer 10b. The trench insulating layer 16 is provided between the third gate electrode layer 10c and the fourth gate electrode layer 10d. The trench insulating layer 16 is adjacent to the semiconductor layer 12 in the x direction.

The trench insulating layer 16 is, for example, an oxide, an oxynitride, or a nitride. The trench insulating layer 16 contains, for example, silicon oxide or aluminum oxide. The trench insulating layer 16 is, for example, a silicon oxide layer or an aluminum oxide layer.

The interlayer insulating layer 18 is provided between the first gate electrode layer 10a and the third gate electrode layer 10c, and between the second gate electrode layer 10b and the fourth gate electrode layer 10d.

The interlayer insulating layer 18 is, for example, an oxide, an oxynitride, or a nitride. The interlayer insulating layer 18 contains, for example, silicon oxide. The interlayer insulating layer 18 is, for example, a silicon oxide layer. A thickness of the interlayer insulating layer 18 in the z direction is, for example, 5 nm or more and 30 nm or less.

The core insulating layer 20 is surrounded by the semiconductor layer 12. The core insulating layer 20 extends in the z direction. The core insulating layer 20 has, for example, a cylindrical shape.

The core insulating layer 20 is, for example, an oxide, an oxynitride, or a nitride. The core insulating layer 20 contains, for example, silicon oxide. The core insulating layer 20 contains, for example, silicon oxide or aluminum oxide. The core insulating layer 20 is, for example, a silicon oxide layer or an aluminum oxide layer. A material of the core insulating layer 20 is different from a material of the trench insulating layer 16, for example. Chemical composition of the core insulating layer 20 is different from the chemical composition of the trench insulating layer 16, for example.

Figure 30:
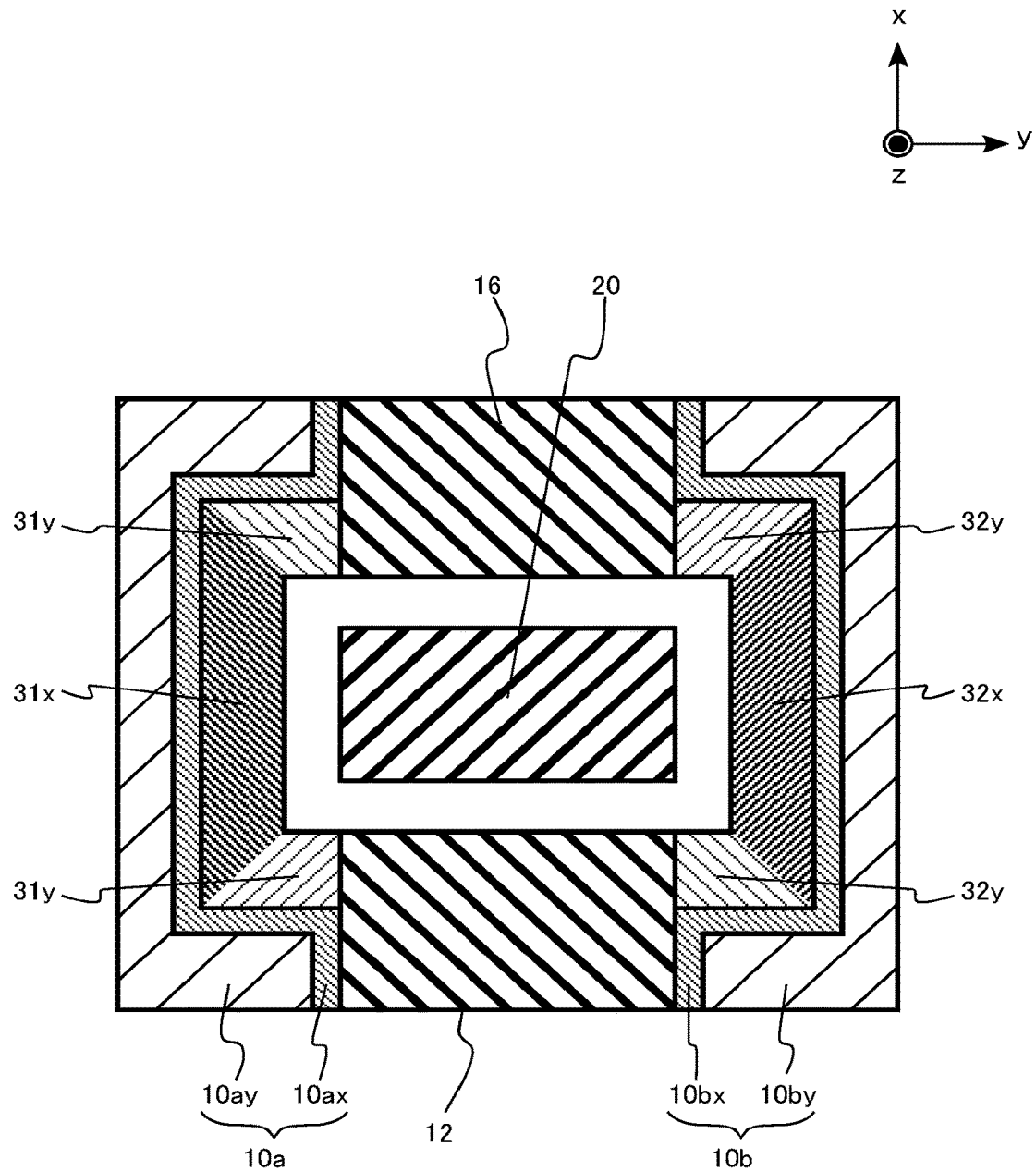
FIG. 30 is an enlarged schematic cross-sectional view of a part of the memory cell array of the semiconductor memory device of the fourth embodiment.

FIG. 30 is an enlarged schematic cross-sectional view of a part of the memory cell array of the semiconductor memory device of the fourth embodiment. FIG. 30 is an xy cross-section of the memory cell array 401.

The first dielectric layer 31, the second dielectric layer 32, the third dielectric layer 33, and the fourth dielectric layer 34 contain oxygen (O) and at least one of hafnium (Hf) or zirconium (Zr). The first dielectric layer 31, the second dielectric layer 32, the third dielectric layer 33, and the fourth dielectric layer 34 contain an oxide containing at least one of hafnium oxide or zirconium oxide. A part of the first dielectric layer 31, the second dielectric layer 32, the third dielectric layer 33, and the fourth dielectric layer 34 is a ferroelectric, and another part is a paraelectric.

The first dielectric layer 31, the second dielectric layer 32, the third dielectric layer 33, and the fourth dielectric layer 34 contain, for example, hafnium oxide as a main component. The fact that hafnium oxide is the main component means that a mole fraction of hafnium oxide is the highest among substances contained in the first dielectric layer 31, the second dielectric layer 32, the third dielectric layer 33, and the fourth dielectric layer 34. The mole fraction of hafnium oxide is, for example, equal to or more than 90%.

The first dielectric layer 31, the second dielectric layer 32, the third dielectric layer 33, and the fourth dielectric layer 34 contain, for example, zirconium oxide as a main component. The fact that zirconium oxide is the main component means that a mole fraction of zirconium oxide is the highest among the substances contained in the first dielectric layer 31, the second dielectric layer 32, the third dielectric layer 33, and the fourth dielectric layer 34.

The mole fraction of zirconium oxide contained in the first dielectric layer 31, the second dielectric layer 32, the third dielectric layer 33, and the fourth dielectric layer 34 is, for example, 40% or more and 60% or less. An oxide contained in the first dielectric layer 31, the second dielectric layer 32, the third dielectric layer 33, and the fourth dielectric layer 34 is, for example, a mixed crystal of hafnium oxide and zirconium oxide.

Hafnium oxide has ferroelectricity in a case where this is crystals of an orthorhombic crystal system or a trigonal crystal system. Hafnium oxide is a ferroelectric in a case where this is the crystals of the orthorhombic crystal system or trigonal crystal system.

Hafnium oxide having ferroelectricity has ferroelectricity in a case where this is, for example, crystals of a third orthorhombic crystal system (orthorhombic III; space group Pbc2$_1$, and space group number 29), or a trigonal crystal system (trigonal; space group R3m, P3, or R3, and space group number 160, 143, or 146).

Hafnium oxide does not have ferroelectricity in a case where this is crystals other than the crystals of the orthorhombic crystal system or trigonal crystal system, or this is an amorphous substance. Hafnium oxide is a paraelectric in a case where this is crystals other than the crystals of the orthorhombic crystal system or trigonal crystal system, or this is the amorphous substance. The crystals other than the orthorhombic crystal system or trigonal crystal system is crystals of a cubic crystal system, a hexagonal crystal system, a tetragonal crystal system, a monoclinic crystal system, or a triclinic crystal system.

Zirconium oxide has ferroelectricity in a case where this is crystals of an orthorhombic crystal system or a trigonal crystal system. Zirconium oxide is a ferroelectric in a case where this is the crystals of the orthorhombic crystal system or trigonal crystal system.

Zirconium oxide having ferroelectricity has ferroelectricity in a case where this is, for example, crystals of a third orthorhombic crystal system (orthorhombic III; space group Pbc2$_1$, and space group number 29), or a trigonal crystal system (trigonal; space group R3m, P3, or R3, and space group number 160, 143, or 146).

Zirconium oxide does not have ferroelectricity in a case where this is crystals other than crystals of the orthorhombic crystal system or trigonal crystal system, or this is an amorphous substance. Zirconium oxide is a paraelectric in a case where this is the crystals other than the crystals of the orthorhombic crystal system or trigonal crystal system, or this is the amorphous substance.

The first dielectric layer 31, the second dielectric layer 32, the third dielectric layer 33, and the fourth dielectric layer 34 contain at least one additive element selected from the group consisting of, for example, silicon (Si), zirconium (Zr), aluminum (Al), yttrium (Y), strontium (Sr), lanthanum (La), samarium (Sm), gadolinium (Gd), terbium (Tb), dysprosium (Dy), holmium (Ho), erbium (Er), ytterbium (Yb), lutetium (Lu), and barium (Ba). An oxide contained in the first dielectric layer 31, the second dielectric layer 32, the third dielectric layer 33, and the fourth dielectric layer 34 contains the above-described additive elements. In a case where the oxide is hafnium oxide, hafnium oxide easily displays ferroelectricity when this contains the above-described additive element.

The first dielectric layer 31 includes a ferroelectric region 31x and a paraelectric region 31y. The ferroelectric region 31x is an example of a first region. The paraelectric region 31y is an example of a second region.

The ferroelectric region 31x is provided between the first gate electrode layer 10a and the semiconductor layer 12. The ferroelectric region 31x is provided between the paraelectric regions 31y.

The paraelectric region 31y is provided between the ferroelectric region 31x and the trench insulating layer 16. The paraelectric region 31y is in contact with the trench insulating layer 16.

The second dielectric layer 32 includes a ferroelectric region 32x and a paraelectric region 32y. The ferroelectric region 32x is an example of a third region. The paraelectric region 32y is an example of a fourth region.

The ferroelectric region 32x is provided between the second gate electrode layer 10b and the semiconductor layer 12. The ferroelectric region 32x is provided between the paraelectric regions 32y.

The paraelectric region 32y is provided between the ferroelectric region 32x and the trench insulating layer 16. The paraelectric region 32y is in contact with the trench insulating layer 16.

The ferroelectric region 31x and the ferroelectric region 32x have crystals of an orthorhombic crystal system or a trigonal crystal system as a main component substance. The fact that the crystals of the orthorhombic crystal system or trigonal crystal system is the main component substance means that the crystals of the orthorhombic crystal system or trigonal crystal system has the highest existence ratio among substances forming the ferroelectric region 31x and the ferroelectric region 32x.

In the ferroelectric region 31x and the ferroelectric region 32x, the existence ratio of the crystals of the orthorhombic crystal system or trigonal crystal system is larger than that of the crystals other than the crystals of the orthorhombic crystal system or trigonal crystal system, or an amorphous phase. The ferroelectric region 31x and the ferroelectric region 32x are crystalline substances.

The ferroelectric region 31x and the ferroelectric region 32x are ferroelectric. An oxide contained in the ferroelectric region 31x and the ferroelectric region 32x is a ferroelectric.

Each of the ferroelectric region 31x and the ferroelectric region 32x having ferroelectricity serves as the gate insulating layer of the FeFET of the memory cell MC.

The paraelectric region 31y and the paraelectric region 32y have a substance other than the crystals of the orthorhombic crystal system or trigonal crystal system as a main component substance. The fact that the substance other than the crystals of the orthorhombic crystal system or trigonal crystal system is the main component substance means that the substance other than the crystals of the orthorhombic crystal system or the trigonal crystal system has the highest existence ratio among substances forming the paraelectric region 31y and the paraelectric region 32y.

In the paraelectric region 31y and the paraelectric region 32y, the existence ratio of the crystals other than the crystals of the orthorhombic crystal system or trigonal crystal system, or the amorphous phase is larger than that of the crystals of the orthorhombic crystal system or trigonal crystal system. The paraelectric region 31y and the paraelectric region 32y are crystalline substances or amorphous substances.

The paraelectric region 31y and the paraelectric region 32y are paraelectric. An oxide contained in the paraelectric region 31y and the paraelectric region 32y is a paraelectric.

Next, an example of a method of manufacturing the semiconductor memory device of the fourth embodiment is described.

FIGS. 31, 32, 33, 34, 35, 36, 37, 38, 39, 40, 41, 42, and 43 are schematic cross-sectional views illustrating the method of manufacturing the semiconductor memory device of the fourth embodiment. FIGS. 31 to 43 are views illustrating an example of a method of manufacturing the memory cell array 401 of the three-dimensional ferroelectric memory 400.

Upper views in FIGS. 31 to 43 are xy cross-sections of the memory cell array 401. The upper views in FIGS. 31 to 43 are views corresponding to a part of FIG. 28. Lower views in FIGS. 31 to 43 are yz cross-sections of the memory cell array 401. The lower views in FIGS. 31 to 43 are views corresponding to FIG. 29.

Figure 31:
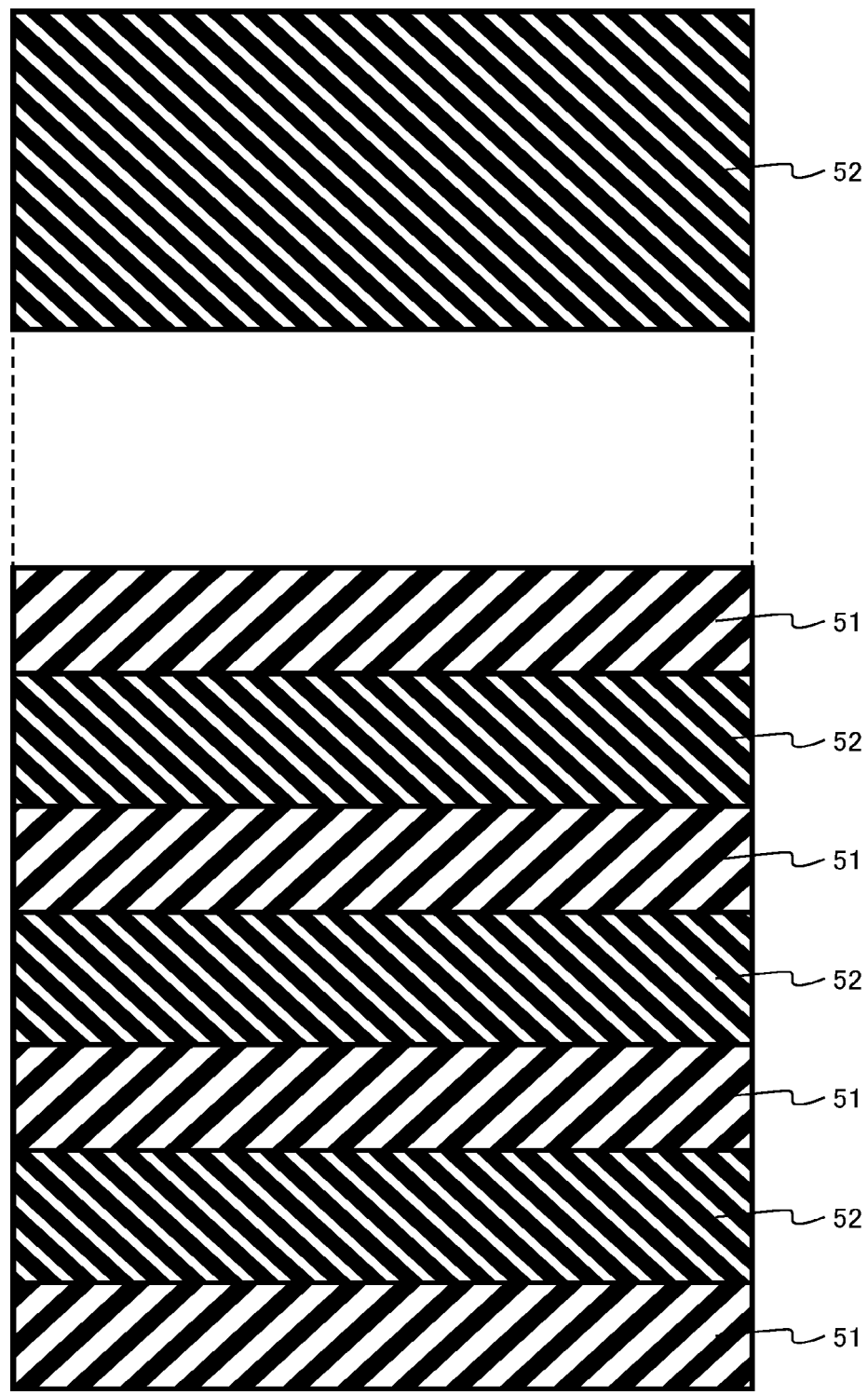
FIG. 31 is a schematic cross-sectional view illustrating a method of manufacturing the semiconductor memory device of the fourth embodiment.

First, a plurality of silicon oxide layers 51 and a plurality of silicon nitride layers 52 are alternately stacked on a semiconductor substrate not illustrated (FIG. 31).

The silicon oxide layer 51 and the silicon nitride layer 52 are formed by, for example, a CVD method.

A part of the silicon oxide layer 51 finally becomes the interlayer insulating layer 18.

Figure 32:
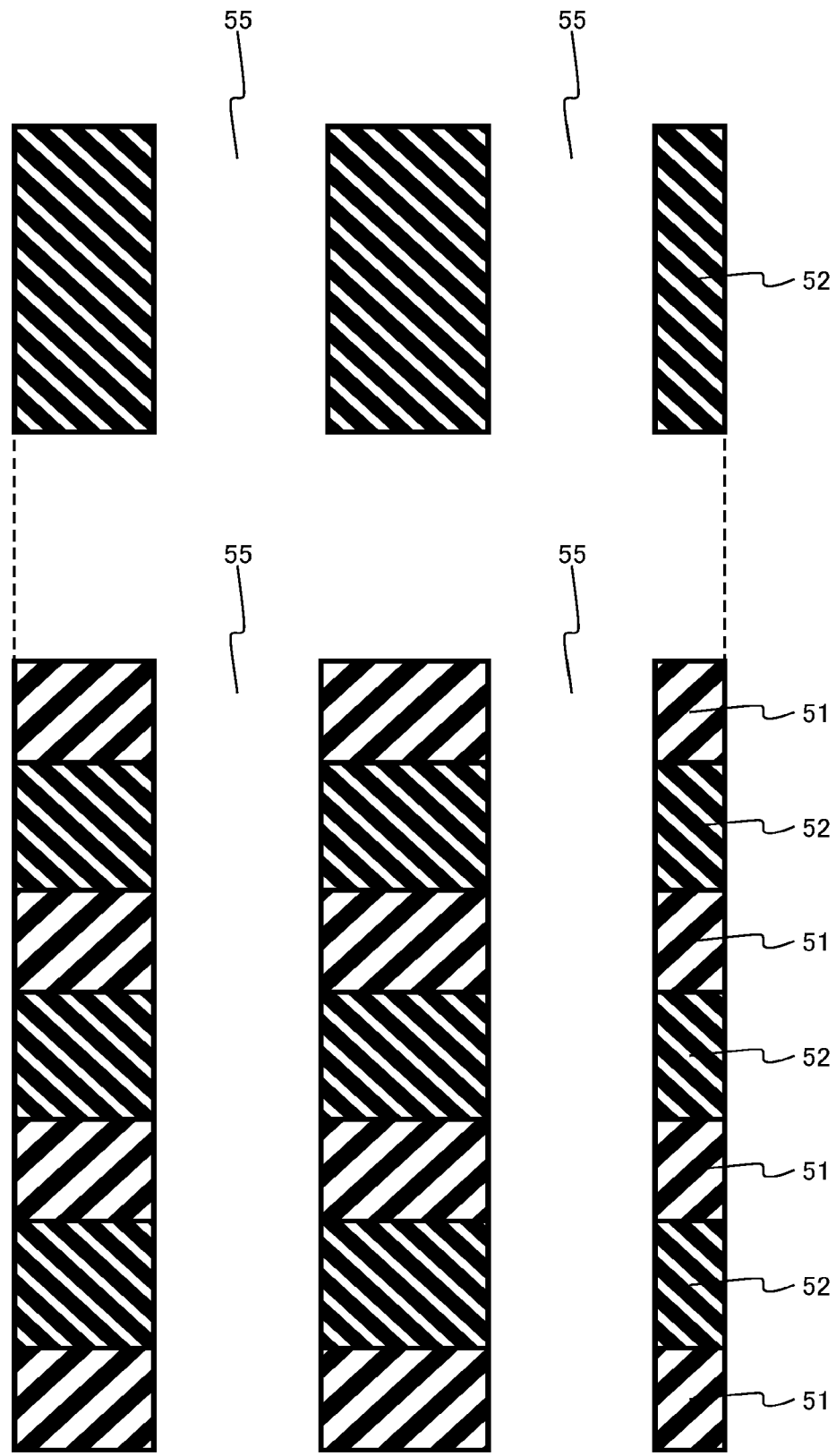
FIG. 32 is a schematic cross-sectional view illustrating the method of manufacturing the semiconductor memory device of the fourth embodiment.

Next, a memory trench 55 is formed in a plurality of silicon oxide layers 51 and a plurality of silicon nitride layers 52 (FIG. 32). The memory trench 55 penetrates a plurality of silicon oxide layers 51 and a plurality of silicon nitride layers 52.

The memory trench 55 is formed by, for example, a lithography method and a RIE method.

Figure 33:
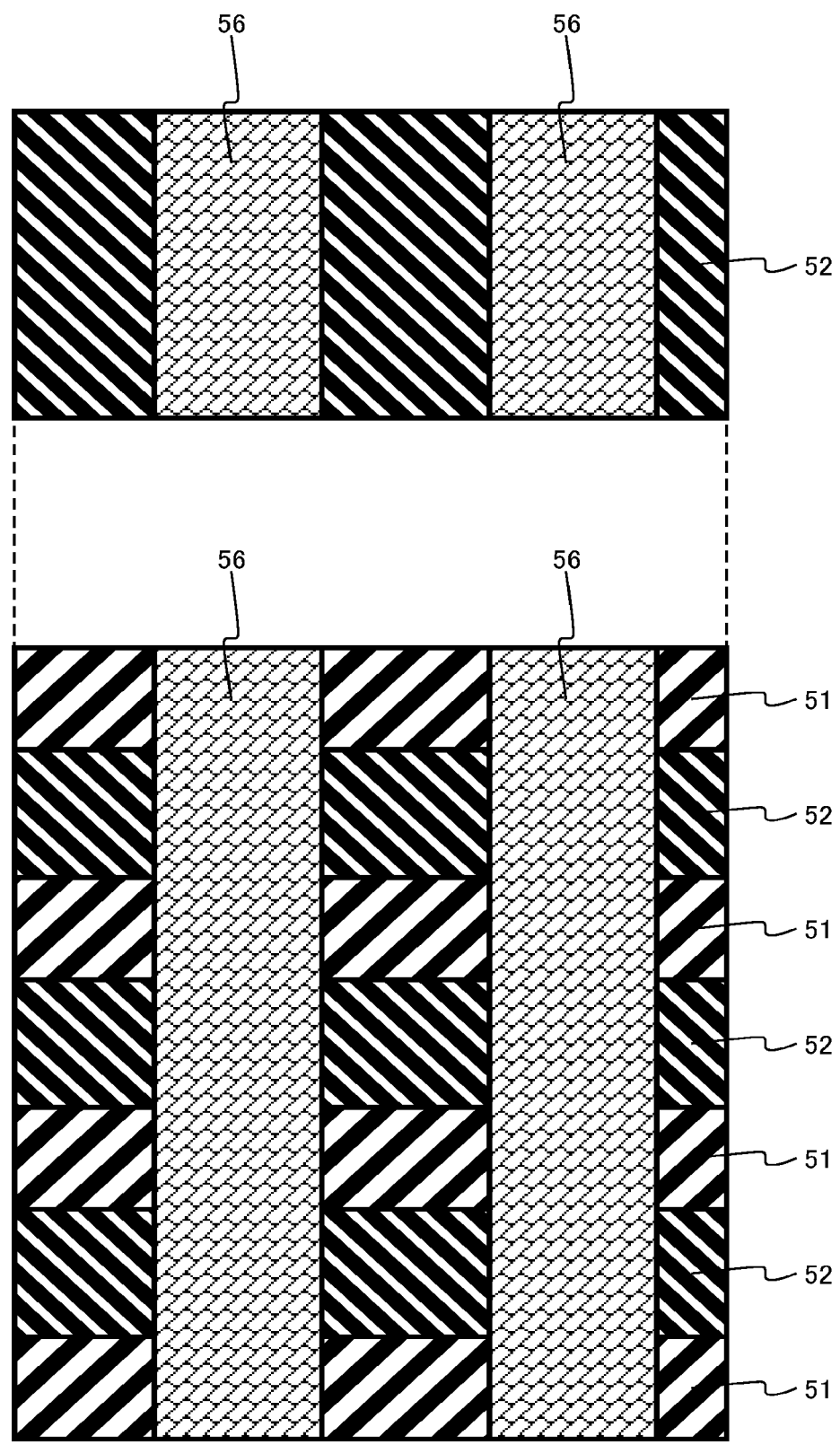
FIG. 33 is a schematic cross-sectional view illustrating the method of manufacturing the semiconductor memory device of the fourth embodiment.

Next, an SOG layer 56 is buried in the memory trench 55 (FIG. 33). The SOG layer 56 is formed by a coating method.

Figure 34:
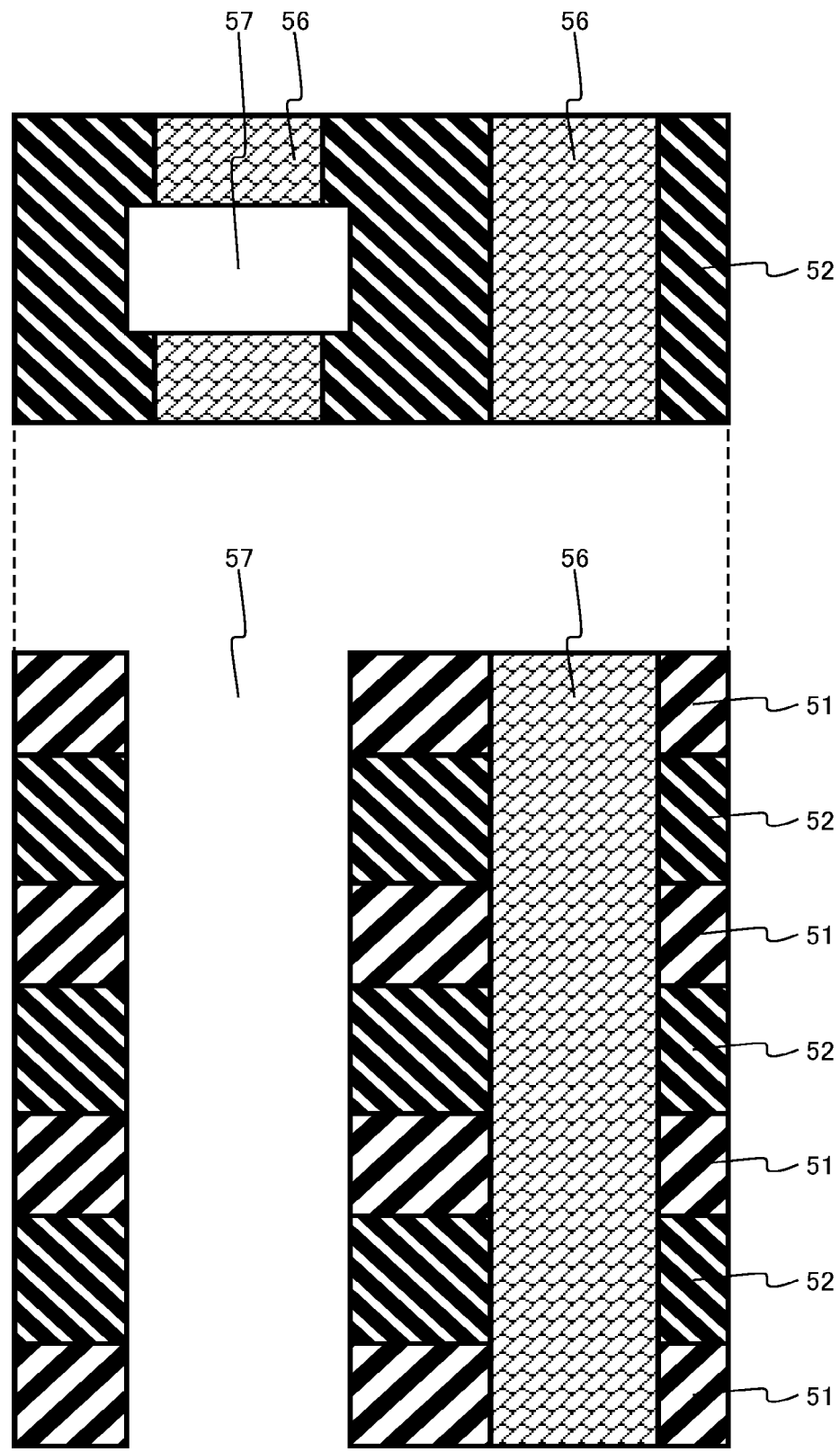
FIG. 34 is a schematic cross-sectional view illustrating the method of manufacturing the semiconductor memory device of the fourth embodiment.

Next, a memory hole 57 is formed in a part of the SOG layer 56, a plurality of silicon oxide layers 51, and a plurality of silicon nitride layers 52 (FIG. 34). The memory hole 57 is formed by, for example, the lithography method and the RIE method.

Figure 35:
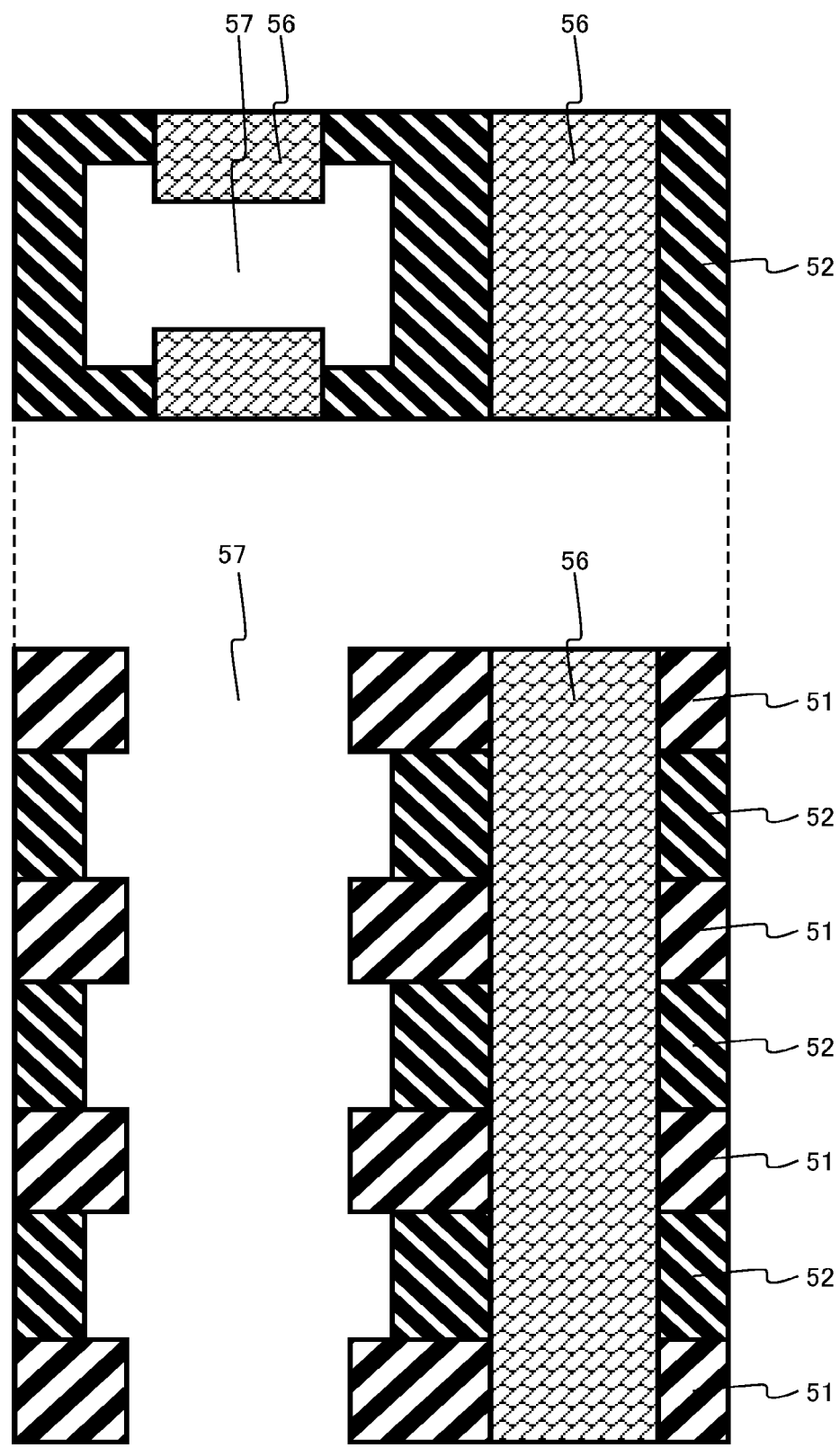
FIG. 35 is a schematic cross-sectional view illustrating the method of manufacturing the semiconductor memory device of the fourth embodiment.

Next, the silicon nitride layer 52 is etched from the inside of the memory hole 57 to form a recess region (FIG. 35). The etching of the silicon nitride layer 52 is performed by, for example, wet etching.

Figure 36:
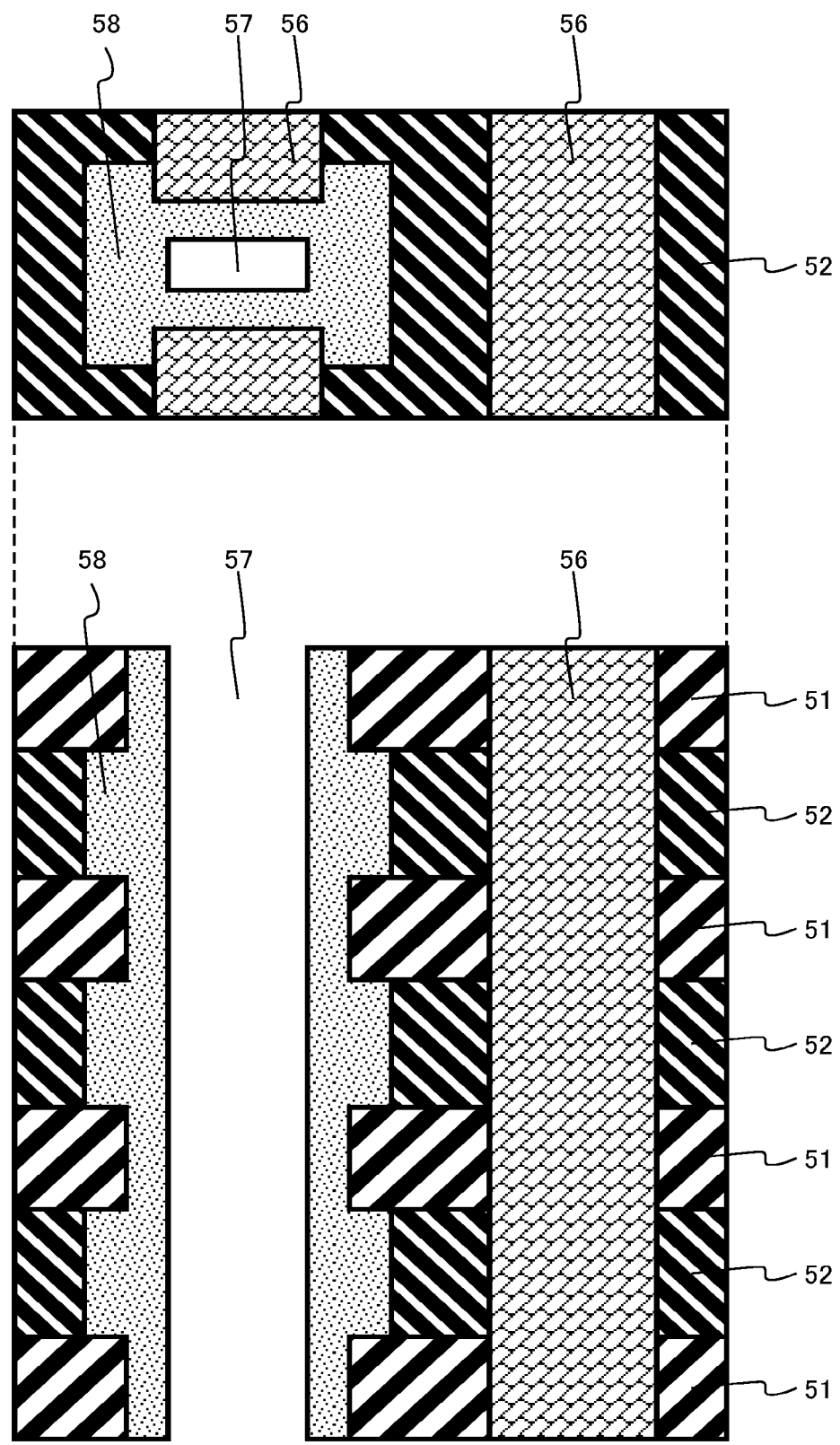
FIG. 36 is a schematic cross-sectional view illustrating the method of manufacturing the semiconductor memory device of the fourth embodiment.

Next, a hafnium oxide layer 58 is formed in the memory hole 57 (FIG. 36). The hafnium oxide layer 58 is formed by, for example, an ALD method.

A part of the hafnium oxide layer 58 finally becomes a first dielectric layer 31, a second dielectric layer 32, a third dielectric layer 33, and a fourth dielectric layer 34.

Figure 37:
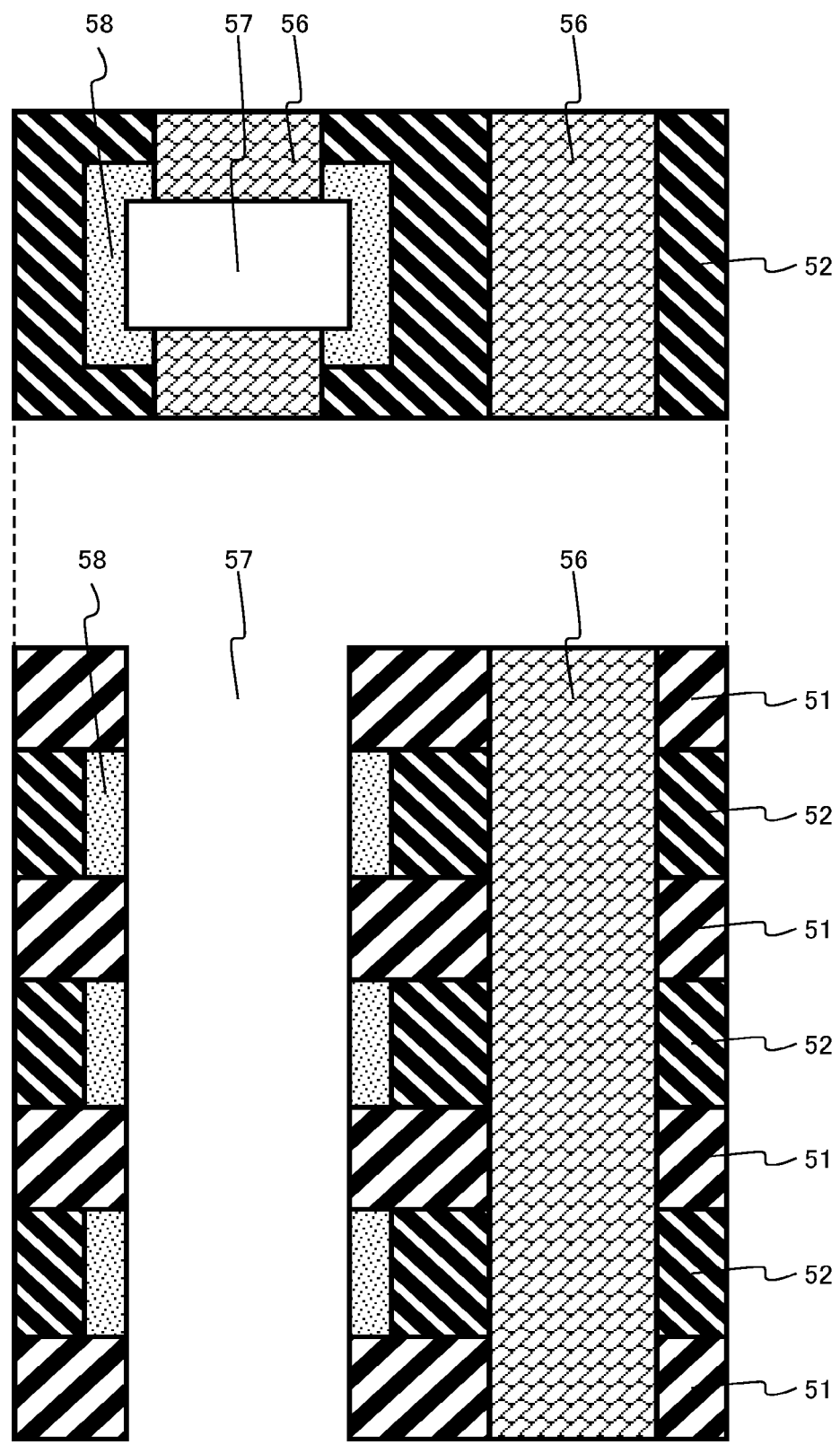
FIG. 37 is a schematic cross-sectional view illustrating the method of manufacturing the semiconductor memory device of the fourth embodiment.

Next, the hafnium oxide layer 58 in the memory hole 57 is etched so as to remain only in the recess region (FIG. 37). Etching of the hafnium oxide layer 58 is performed by, for example, the RIE method.

Figure 38:
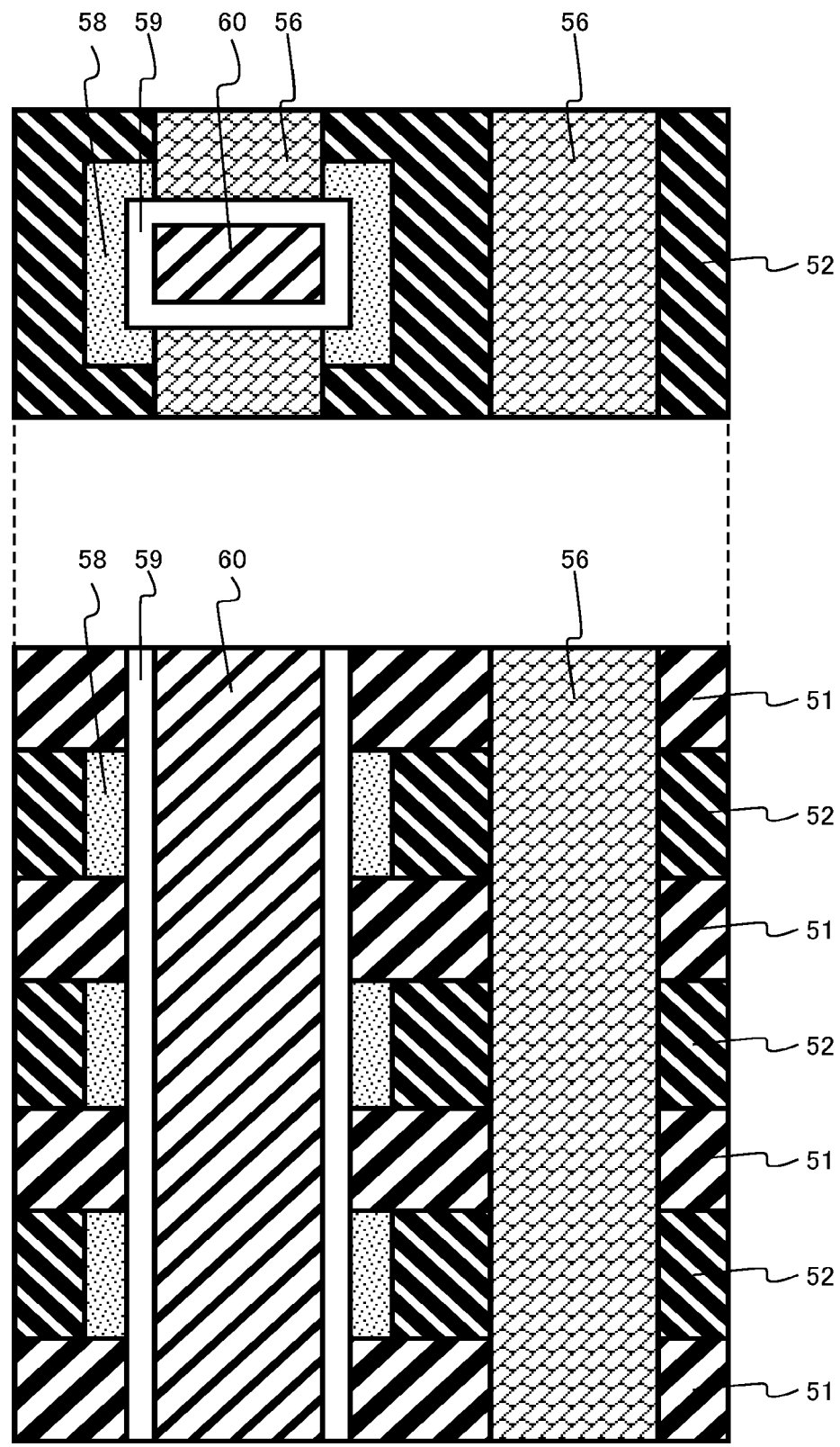
FIG. 38 is a schematic cross-sectional view illustrating the method of manufacturing the semiconductor memory device of the fourth embodiment.

Next, a polycrystalline silicon layer 59 and a silicon oxide layer 60 are formed in the memory hole 57 (FIG. 38). The polycrystalline silicon layer 59 and the silicon oxide layer 60 are formed by, for example, the CVD method.

The polycrystalline silicon layer 59 finally becomes the semiconductor layer 12. The silicon oxide layer 60 finally becomes the core insulating layer 20.

Figure 39:
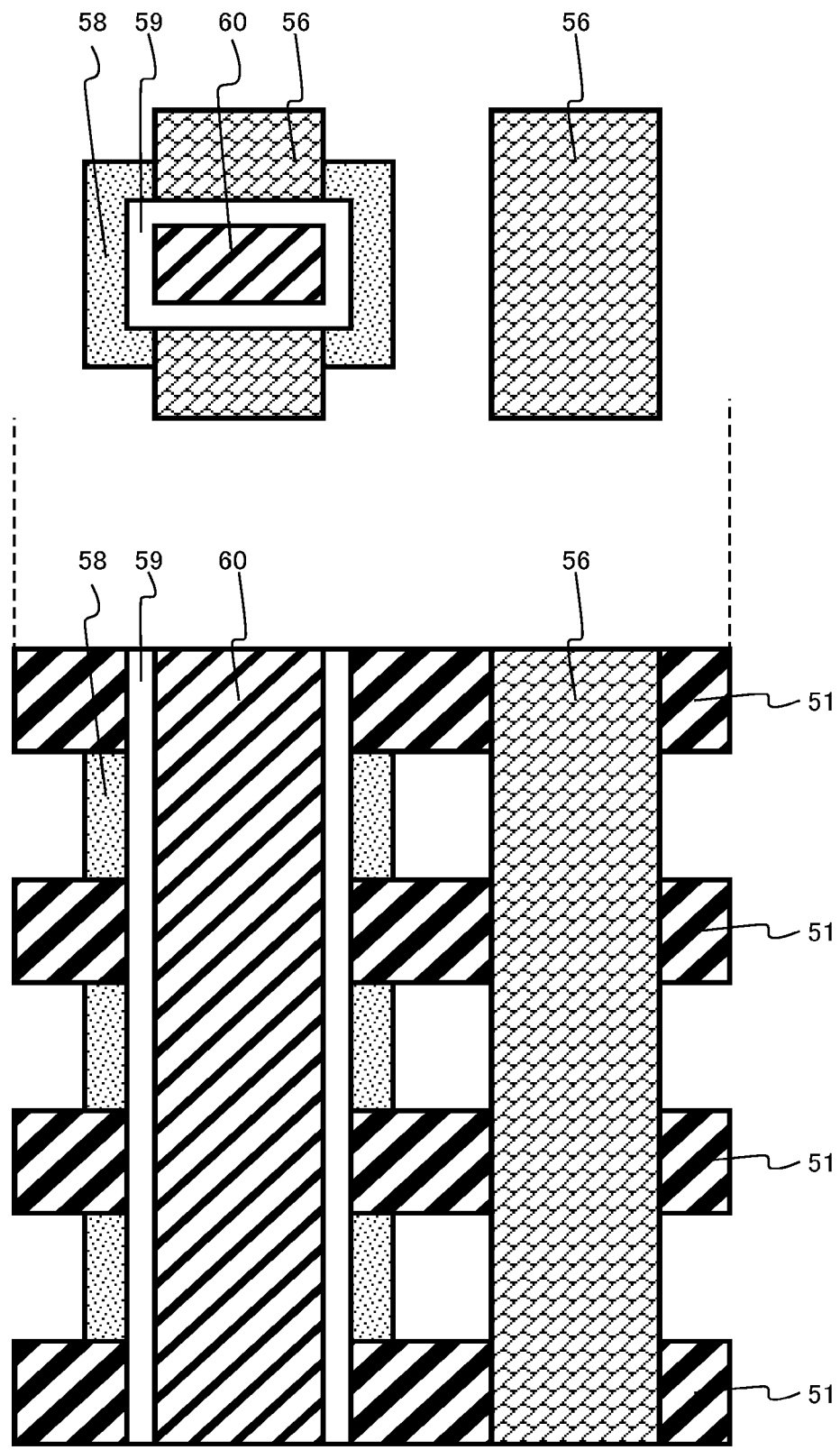
FIG. 39 is a schematic cross-sectional view illustrating the method of manufacturing the semiconductor memory device of the fourth embodiment.

Next, a plurality of silicon nitride layers 52 is removed (FIG. 39). A plurality of silicon nitride layers 52 is removed by a wet etching method using, for example, an opening not illustrated.

Figure 40:
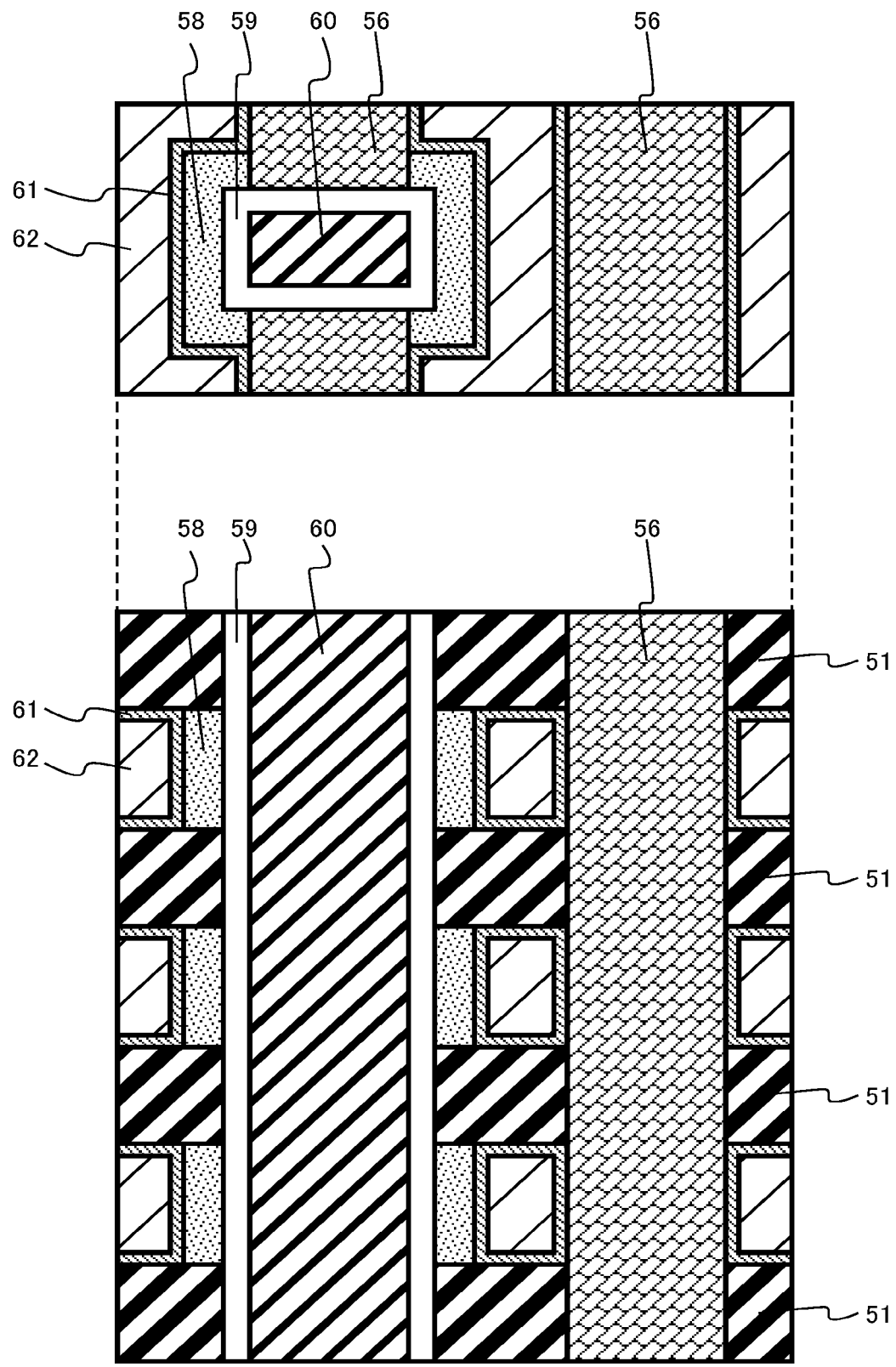
FIG. 40 is a schematic cross-sectional view illustrating the method of manufacturing the semiconductor memory device of the fourth embodiment.

Next, a titanium nitride layer 61 and a tungsten layer 62 are formed (FIG. 40). The titanium nitride layer 61 and the tungsten layer 62 are formed by, for example, the CVD method.

The titanium nitride layer 61 finally becomes the barrier metal layers 10ax, 10bx, 10cx, and 10dx. The tungsten layer 62 finally becomes the metal layer 10ay, the metal layer 10by, the metal layer 10cy, and the metal layer 10dy.

Figure 41:
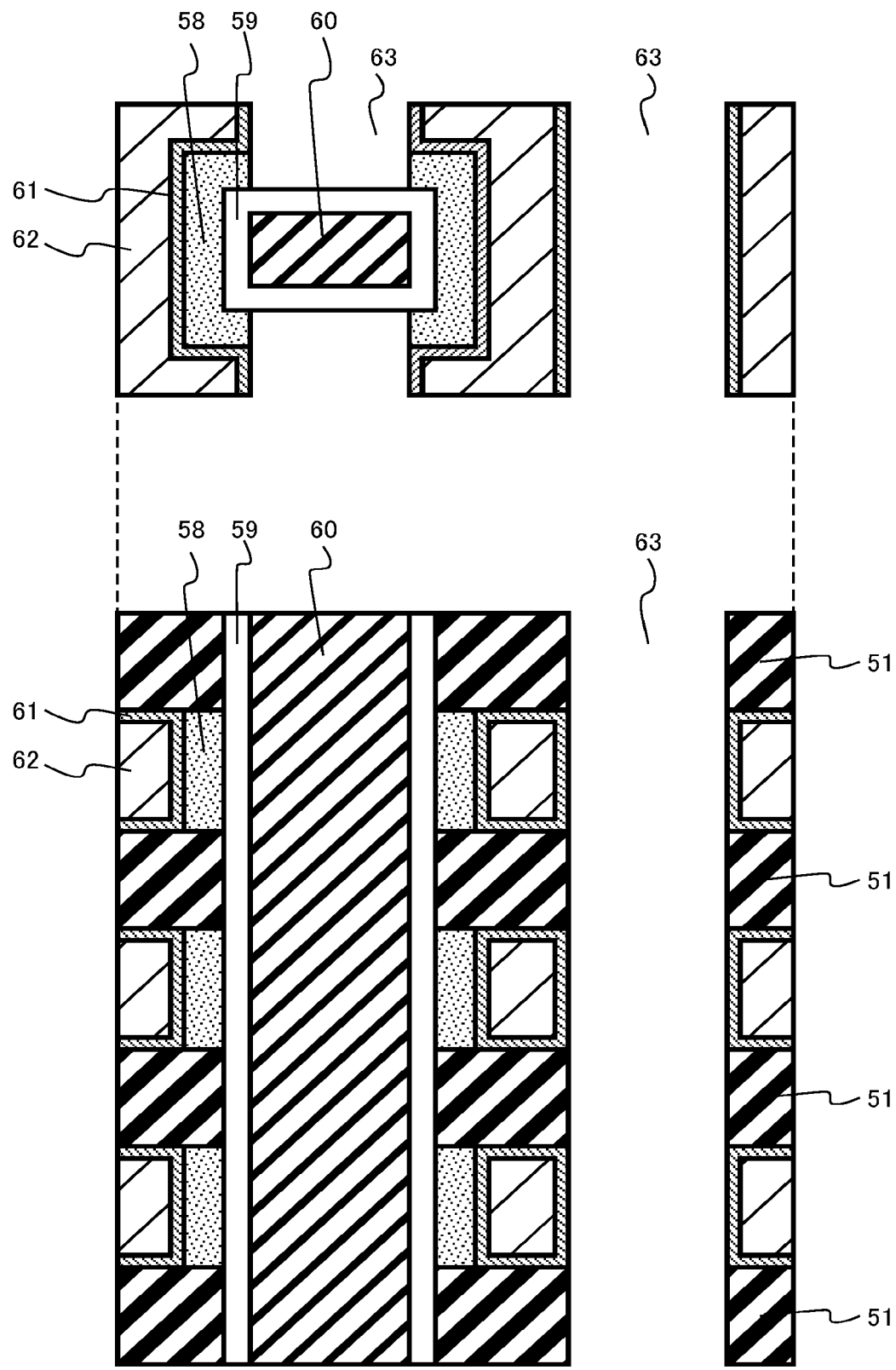
FIG. 41 is a schematic cross-sectional view illustrating the method of manufacturing the semiconductor memory device of the fourth embodiment.

Next, the SOG layer 56 is removed (FIG. 41). The SOG layer 56 is removed by, for example, the wet etching method. By removing the SOG layer 56, a void 63 is formed. When removing the SOG layer 56, a mask material for preventing etching of the silicon oxide layer 60 may be provided on the silicon oxide layer 60.

Figure 42:
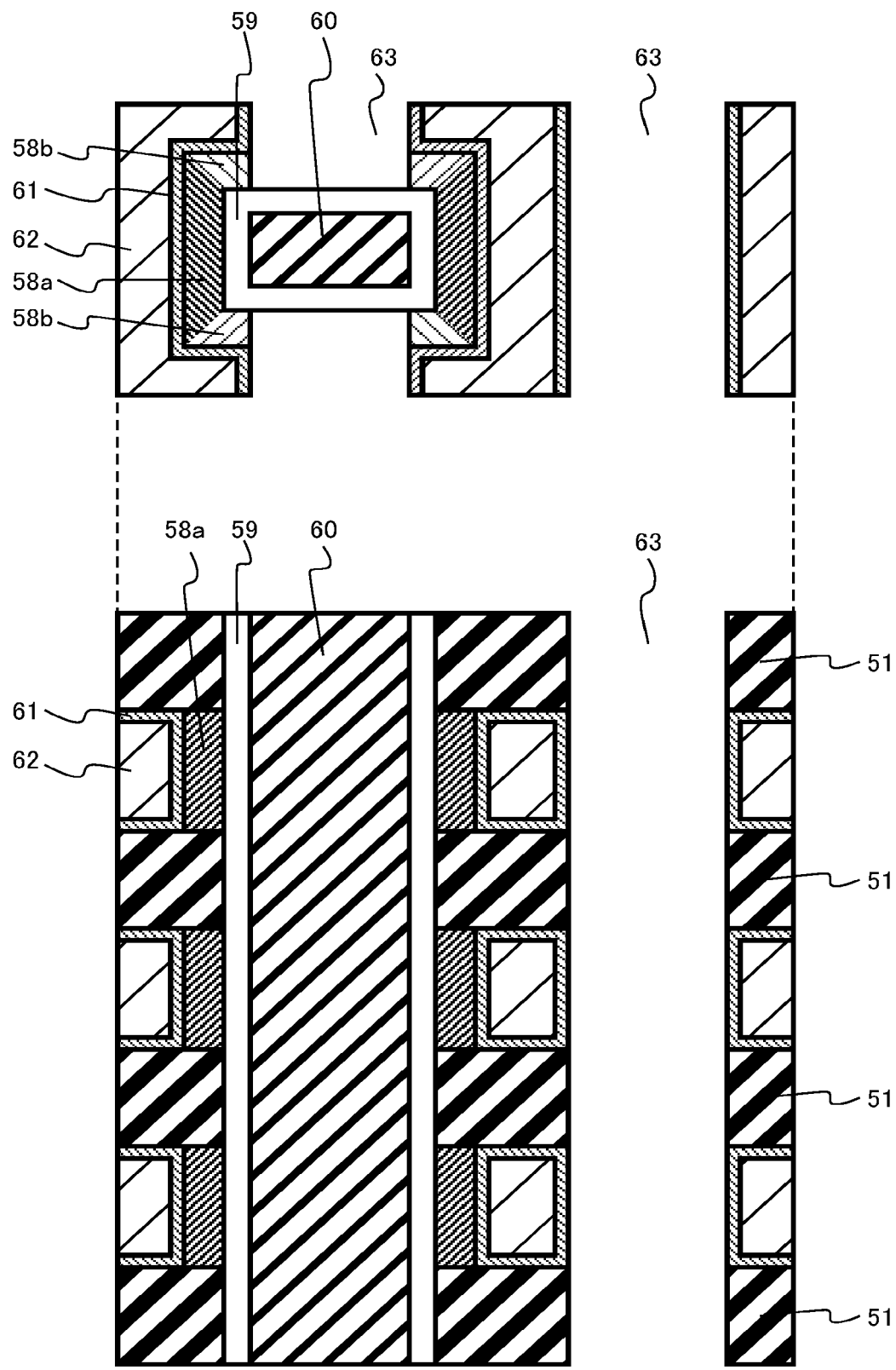
FIG. 42 is a schematic cross-sectional view illustrating the method of manufacturing the semiconductor memory device of the fourth embodiment.

Next, heat treatment is performed to crystallize the hafnium oxide layer 58 (FIG. 42). The heat treatment is performed, for example, in a nitrogen gas atmosphere at temperature of 600° C. or higher and 1050° C. or lower. The heat treatment is so-called crystallization annealing.

By the heat treatment, in the hafnium oxide layer 58, a region 58a interposed between the polycrystalline silicon layer 59 and the titanium nitride layer 61 becomes crystals of an orthorhombic crystal system or a trigonal crystal system by an applied stress. On the other hand, since the stress applied to a region 58b interposed between the region 58a and the void 63 is small, the region becomes crystals other than the crystals of the orthorhombic crystal system or trigonal crystal system or an amorphous phase.

In other words, the region 58a interposed between the polycrystalline silicon layer 59 and the titanium nitride layer 61 becomes a ferroelectric. The region 58b interposed between the region 58a and the void 63 becomes a paraelectric.

The region 58a interposed between the polycrystalline silicon layer 59 and the titanium nitride layer 61 finally becomes the ferroelectric region 31x and the ferroelectric region 32x. The region 58b interposed between the region 58a and the void 63 finally becomes the paraelectric region 31y and the paraelectric region 32y.

Figure 43:
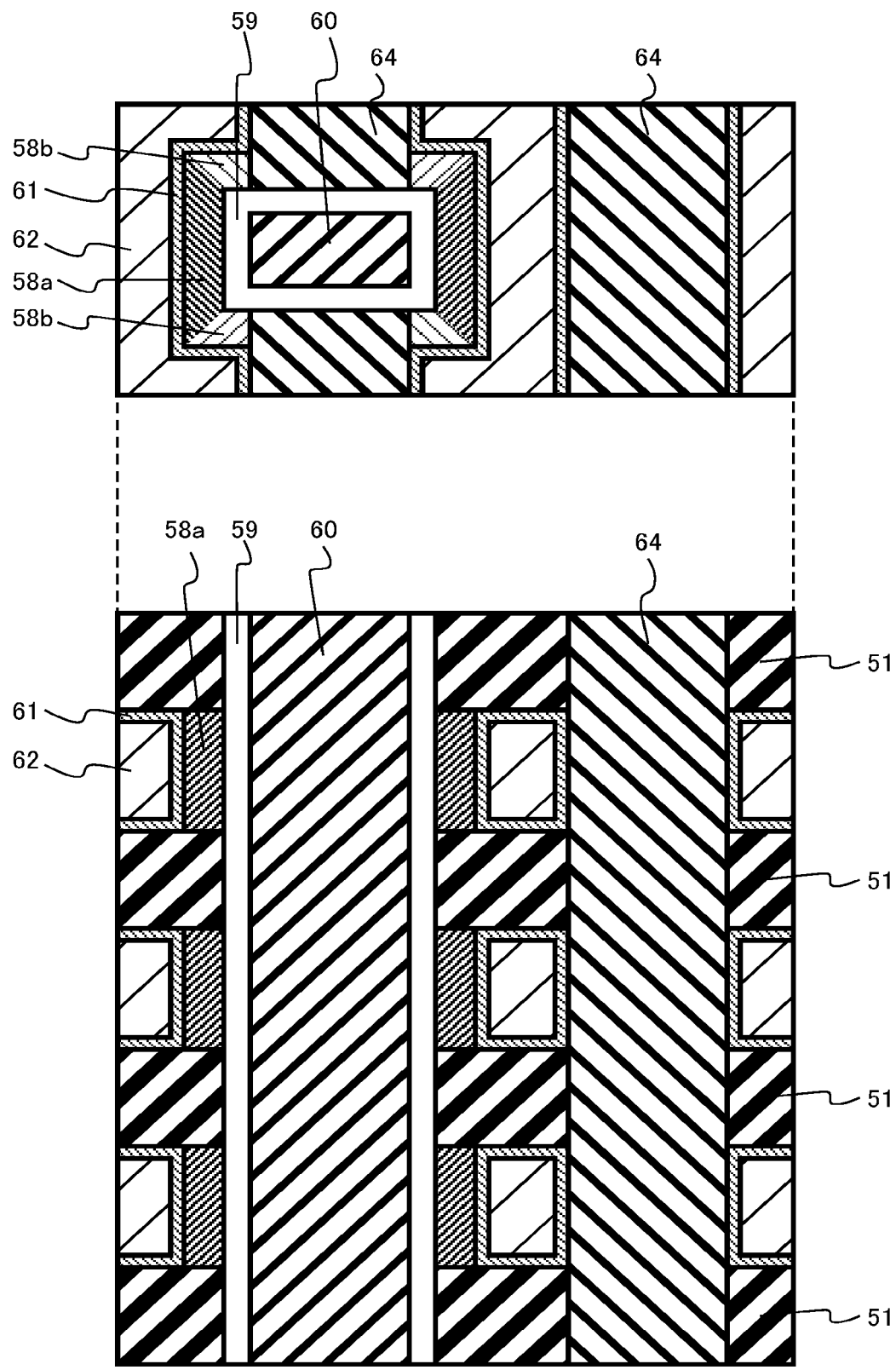
FIG. 43 is a schematic cross-sectional view illustrating the method of manufacturing the semiconductor memory device of the fourth embodiment.

Next, a silicon oxide layer 64 is buried in the void 63 (FIG. 43). The silicon oxide layer 64 finally becomes the trench insulating layer 16.

By the above-described manufacturing method, the memory cell array 401 of the three-dimensional ferroelectric memory 400 of the fourth embodiment is manufactured.

Next, a function and an effect of the semiconductor memory device of the fourth embodiment are described.

A three-dimensional NAND flash memory in which memory cells are disposed three-dimensionally realizes a high degree of integration and a low cost. In the three-dimensional NAND flash memory, for example, a memory hole penetrating a stack is formed in the stack obtained by alternately stacking a plurality of insulating layers and a plurality of gate electrode layers. By applying the FeFET type three-terminal memory as the memory cell of the three-dimensional NAND flash memory, the gate insulating layer may be thinned. Therefore, a hole diameter of the memory hole may be reduced, and the memory cell may be scaled-down. Therefore, by applying the FeFET type three-terminal memory, it becomes possible to further increase the degree of integration of the memory.

As the memory cell is scaled-down, for example, control of a polarization state of the ferroelectric layer serving as the gate insulating layer might become difficult, and an operation of the memory cell might become unstable. Therefore, it is desired to realize a memory provided with the memory cell that operates stably even in a case where the memory cell is scaled-down.

In the memory cell array 401 of the three-dimensional ferroelectric memory 400 of the fourth embodiment, the first dielectric layer 31 includes the ferroelectric region 31x and the paraelectric region 31y. The paraelectric region 31y is provided between the ferroelectric region 31x and the trench insulating layer 16.

A portion between the ferroelectric region 31x and the trench insulating layer 16 is adjacent to a corner of the first gate electrode layer 10a. In the vicinity of the corner of the first gate electrode layer 10a, electric field concentration due to a gate voltage applied to the first gate electrode layer 10a occurs, and electric field intensity increases. Therefore, if the ferroelectric region is provided in this portion, the polarization characteristic might be degraded due to the high electric field intensity. When the polarization characteristic is degraded, controllability of the polarization state of the ferroelectric layer might be degraded, and a characteristic of the memory cell MC might be degraded.

The memory cell array 401 of the fourth embodiment is provided with, for example, the paraelectric region 31y in a portion adjacent to the corner of the first gate electrode layer 10a. Therefore, it becomes possible to suppress the degradation in polarization characteristic. Therefore, the controllability of the polarization state of the ferroelectric layer is improved. Therefore, the semiconductor memory device that operates stably may be realized.

As described above, according to the fourth embodiment, the semiconductor memory device that operates stably with improved controllability of the polarization state of the ferroelectric layer may be realized.

Fifth Embodiment

A semiconductor memory device of a fifth embodiment includes, a first gate electrode layer extending in a first direction; a second gate electrode layer extending in the first direction, the second gate electrode layer spaced from the first gate electrode layer in a second direction intersecting with the first direction; a first semiconductor layer provided between the first gate electrode layer and the second gate electrode layer, the first semiconductor layer extending in a third direction intersecting with the first direction and the second direction; a second semiconductor layer provided between the first gate electrode layer and the second gate electrode layer, the second semiconductor layer extending in the third direction, the second semiconductor layer spaced from the first semiconductor layer in the first direction; a third semiconductor layer provided between the first semiconductor layer and the second gate electrode layer, the third semiconductor layer extending in the third direction; a first dielectric layer provided between the first gate electrode layer and the first semiconductor layer and between the first gate electrode layer and the second semiconductor layer, the first dielectric layer containing oxygen and at least one of hafnium or zirconium, the first dielectric layer including a first region containing at least one crystal of an orthorhombic crystal system or a trigonal crystal system as a main component substance, the first region provided between the first gate electrode layer and the first semiconductor layer, the first dielectric layer including a second region containing at least one crystal of the orthorhombic crystal system or the trigonal crystal system as a main component substance, the second region provided between the first gate electrode layer and the second semiconductor layer, and a third region containing a substance other than at least one crystal of the orthorhombic crystal system or the trigonal crystal system as a main component substance, the third region provided between the first region and the second region; a second dielectric layer provided between the second gate electrode layer and the third semiconductor layer, the second dielectric layer containing oxygen and at least one of hafnium or zirconium; and a first insulating layer provided between the third region and the second gate electrode layer, the first insulating layer being in contact with the third region.

The semiconductor memory device of the fifth embodiment is a three-dimensional ferroelectric memory 500. The three-dimensional ferroelectric memory 500 of the fifth embodiment is a ferroelectric memory to which a FeFET type three-terminal memory is applied as a memory cell MC.

The three-dimensional ferroelectric memory 500 of the fifth embodiment has a circuit configuration similar to the circuit configuration illustrated in FIG. 1 of the first embodiment. A memory cell array 501 of the three-dimensional ferroelectric memory 500 is provided with an equivalent circuit similar to the equivalent circuit illustrated in FIG. 2 of the first embodiment.

Figure 44:
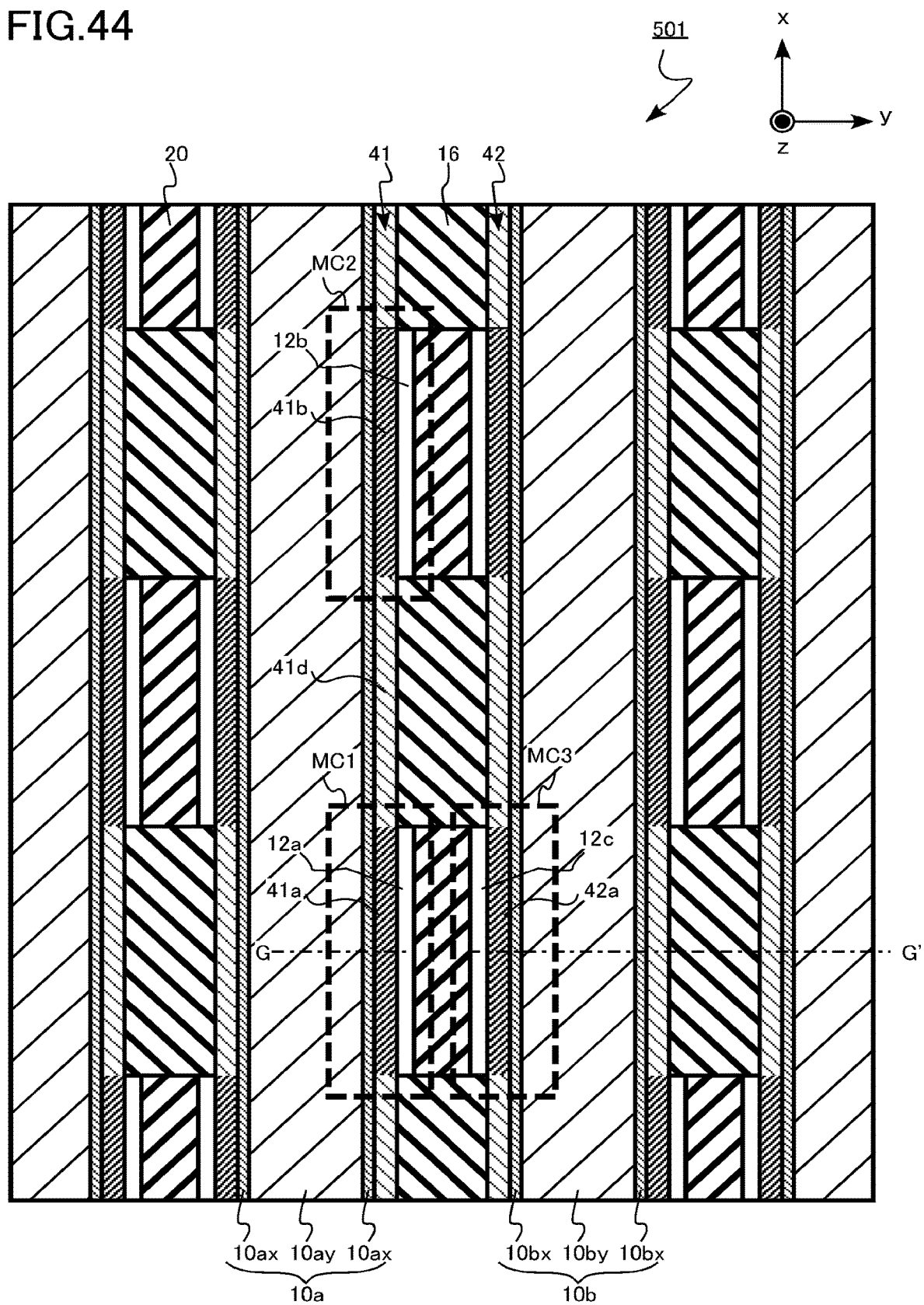
FIG. 44 is a schematic cross-sectional view of a part of a memory cell array of a semiconductor memory device of a fifth embodiment.
Figure 45:
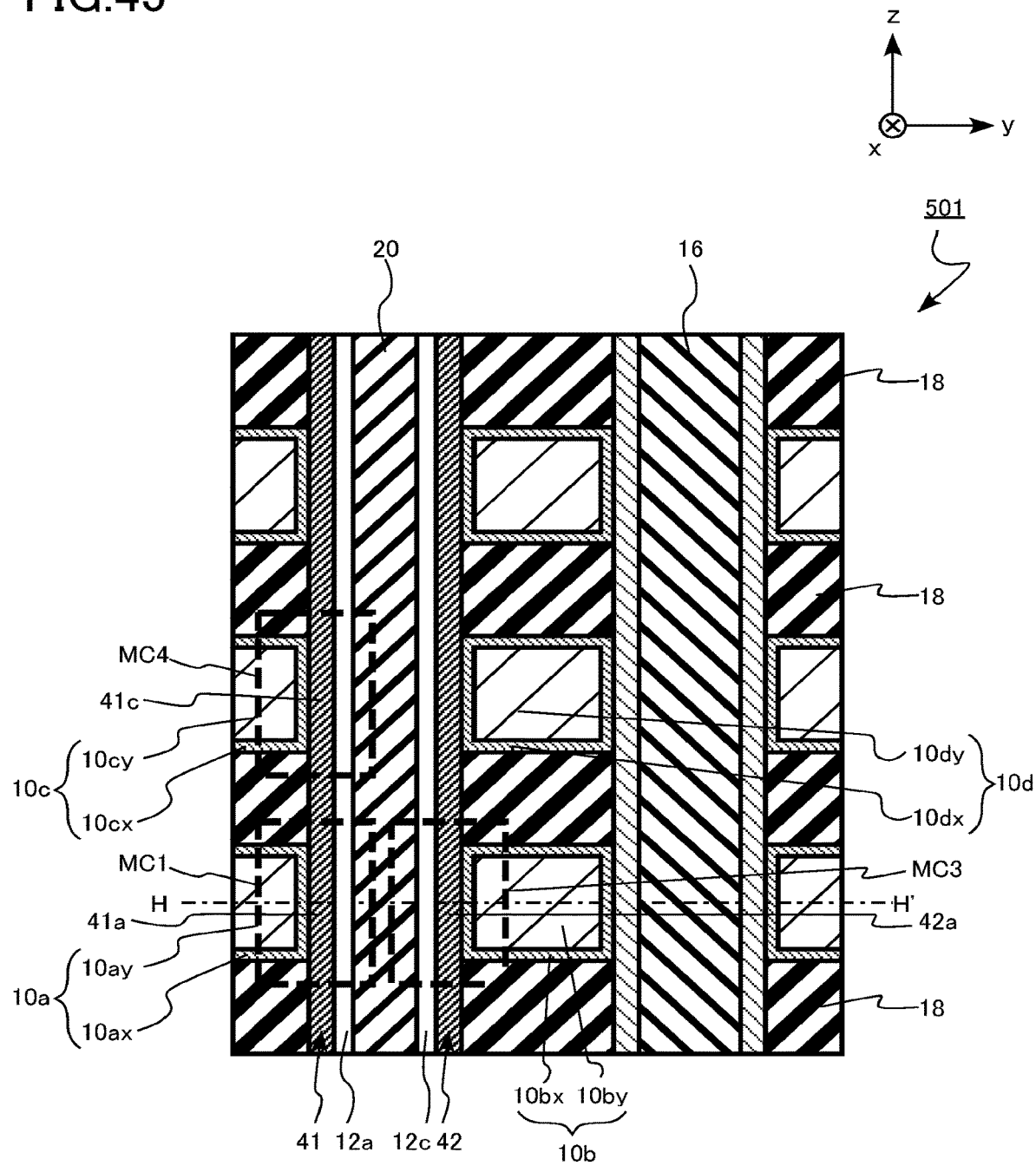
FIG. 45 is a schematic cross-sectional view of a part of the memory cell array of the semiconductor memory device of the fifth embodiment.

FIGS. 44 and 45 are schematic cross-sectional views of a part of the memory cell array of the semiconductor memory device of the fifth embodiment. FIG. 44 is an xy cross-section of the memory cell array 501. FIG. 44 is a cross-section including a HH' plane in FIG. 45. FIG. 45 is a yz cross-section of the memory cell array 501. FIG. 45 is a cross-section taken along line GG' in FIG. 44.

In FIGS. 44 and 45, a region enclosed by a broken line is one memory cell MC. FIG. 44 illustrates memory cells MC1 and MC2 adjacent to each other in an x direction, and a memory cell MC3 adjacent to the memory cell MC1 in a y direction. FIG. 45 illustrates the memory cells MC1 and MC3, and a memory cell MC4 adjacent to the memory cell MC1 in a z direction.

The memory cell array 501 is provided with a first gate electrode layer 10a, a second gate electrode layer 10b, a third gate electrode layer 10c, a fourth gate electrode layer 10d, a first semiconductor layer 12a, a second semiconductor layer 12b, a third semiconductor layer 12c, a trench insulating layer 16, an interlayer insulating layer 18, a core insulating layer 20, a first dielectric layer 41, and a second dielectric layer 42.

The trench insulating layer 16 is an example of a first insulating layer. The interlayer insulating layer 18 is an example of a second insulating layer.

The first gate electrode layer 10a extends in the x direction. The first gate electrode layer 10a corresponds to, for example, the word line WLa illustrated in FIG. 2. The first gate electrode layer 10a serves as gate electrodes of transistors of the memory cells MC1 and MC2.

The first gate electrode layer 10a includes a barrier metal layer 10ax and a metal layer 10ay.

The barrier metal layer 10ax is, for example, metal nitride or metal carbide. The barrier metal layer 10ax contains, for example, titanium nitride. The barrier metal layer 10ax is, for example, a titanium nitride layer.

The metal layer 10ay is, for example, metal. The metal layer 10ay contains, for example, tungsten (W). The metal layer 10ay is, for example, a tungsten layer.

The second gate electrode layer 10b extends in the x direction. The second gate electrode layer 10b is provided so as to be spaced apart from the first gate electrode layer 10a in the y direction. The second gate electrode layer 10b is adjacent to the first gate electrode layer 10a in the y direction. The second gate electrode layer 10b corresponds to, for example, the word line WLb illustrated in FIG. 2. The second gate electrode layer 10b serves as a gate electrode of a transistor of the memory cell MC3.

The second gate electrode layer 10b includes a barrier metal layer 10bx and a metal layer 10by.

The barrier metal layer 10bx is, for example, metal nitride or metal carbide. The barrier metal layer 10bx contains, for example, titanium nitride. The barrier metal layer 10bx is, for example, a titanium nitride layer.

The metal layer 10by is, for example, metal. The metal layer 10by contains, for example, tungsten (W). The metal layer 10by is, for example, a tungsten layer.

The third gate electrode layer 10c extends in the x direction. The third gate electrode layer 10c is provided so as to be spaced apart from the first gate electrode layer 10a in the z direction. The third gate electrode layer 10c is adjacent to the first gate electrode layer 10a in the z direction. The third gate electrode layer 10c corresponds to, for example, the word line WLa illustrated in FIG. 2. The third gate electrode layer 10c serves as a gate electrode of a transistor of the memory cell MC4.

The third gate electrode layer 10c includes a barrier metal layer 10cx and a metal layer 10cy.

The barrier metal layer 10cx is, for example, metal nitride or metal carbide. The barrier metal layer 10cx contains, for example, titanium nitride. The barrier metal layer 10cx is, for example, a titanium nitride layer.

The metal layer 10cy is, for example, metal. The metal layer 10cy contains, for example, tungsten (W). The metal layer 10cy is, for example, a tungsten layer.

The fourth gate electrode layer 10d extends in the x direction. The fourth gate electrode layer 10d is provided so as to be spaced apart from the third gate electrode layer 10c in the y direction. The fourth gate electrode layer 10d is adjacent to the third gate electrode layer 10c in the y direction. The fourth gate electrode layer 10d is also adjacent to the second gate electrode layer 10b in the z direction. The fourth gate electrode layer 10d corresponds to, for example, the word line WLb illustrated in FIG. 2. The fourth gate electrode layer 10d serves as the gate electrode of the transistor of the memory cell MC.

The fourth gate electrode layer 10d includes a barrier metal layer 10dx and a metal layer 10dy.

The barrier metal layer $10dx$ is, for example, metal nitride or metal carbide. The barrier metal layer $10dx$ contains, for example, titanium nitride. The barrier metal layer $10dx$ is, for example, a titanium nitride layer.

The metal layer $10dy$ is, for example, metal. The metal layer $10dy$ contains, for example, tungsten (W). The metal layer $10dy$ is, for example, a tungsten layer.

The first semiconductor layer $12a$ is provided between the first gate electrode layer $10a$ and the second gate electrode layer $10b$. The first semiconductor layer $12a$ is provided between the first gate electrode layer $10a$ and the second gate electrode layer $10b$ in a position closer to the first gate electrode layer $10a$ than the second gate electrode layer $10b$. The first semiconductor layer $12a$ is provided between the third gate electrode layer $10c$ and the fourth gate electrode layer $10d$. The first semiconductor layer $12a$ extends in the z direction. The first semiconductor layer $12a$ has, for example, a plate shape.

The first semiconductor layer $12a$ serves as a channel of the transistors of the memory cells MC1 and MC4.

The first semiconductor layer $12a$ is, for example, a polycrystalline semiconductor. The first semiconductor layer $12a$ contains, for example, polycrystalline silicon. The first semiconductor layer $12a$ is, for example, a polycrystalline silicon layer. A thickness of the first semiconductor layer $12a$ in the y direction is, for example, 5 nm or more and 30 nm or less.

The second semiconductor layer $12b$ is provided between the first gate electrode layer $10a$ and the second gate electrode layer $10b$. The second semiconductor layer $12b$ is provided between the third gate electrode layer $10c$ and the fourth gate electrode layer $10d$. The second semiconductor layer $12b$ extends in the z direction. The second semiconductor layer $12b$ is adjacent to the first semiconductor layer $12a$ in the x direction. The second semiconductor layer $12b$ has, for example, a plate shape.

The second semiconductor layer $12b$ serves as a channel of the transistor of the memory cell MC2.

The second semiconductor layer $12b$ is, for example, a polycrystalline semiconductor. The second semiconductor layer $12b$ contains, for example, polycrystalline silicon. The second semiconductor layer $12b$ is, for example, a polycrystalline silicon layer. A thickness of the second semiconductor layer $12b$ in the y direction is, for example, 5 nm or more and 30 nm or less.

The third semiconductor layer $12c$ is provided between the first gate electrode layer $10a$ and the second gate electrode layer $10b$. The third semiconductor layer $12c$ is provided between the first gate electrode layer $10a$ and the second gate electrode layer $10b$ in a position closer to the second gate electrode layer $10b$ than the first gate electrode layer $10a$. The third semiconductor layer $12c$ is provided between the third gate electrode layer $10c$ and the fourth gate electrode layer $10d$. The third semiconductor layer $12c$ is provided between the first semiconductor layer $12a$ and the second gate electrode layer $10b$. The third semiconductor layer $12c$ extends in the z direction. The third semiconductor layer $12c$ is adjacent to the first semiconductor layer $12a$ in the y direction. The third semiconductor layer $12c$ has, for example, a plate shape.

The third semiconductor layer $12c$ serves as a channel of the transistor of the memory cell MC3.

The third semiconductor layer $12c$ is, for example, a polycrystalline semiconductor. The third semiconductor layer $12c$ contains, for example, polycrystalline silicon. The third semiconductor layer $12c$ is, for example, a polycrys-talline silicon layer. A thickness of the third semiconductor layer $12c$ in the y direction is, for example, 5 nm or more and 30 nm or less.

The first dielectric layer 41 is provided between the first gate electrode layer $10a$ and the first semiconductor layer $12a$. The first dielectric layer 41 is provided between the first gate electrode layer $10a$ and the second semiconductor layer $12b$. The first dielectric layer 41 is provided between the first gate electrode layer $10a$ and the trench insulating layer 16.

A part of the first dielectric layer 41 is a ferroelectric. A part of the first dielectric layer 41 serves as gate insulating layers of the transistors of the memory cells MC1 and MC2.

The second dielectric layer 42 is provided between the second gate electrode layer $10b$ and the third semiconductor layer $12c$. The second dielectric layer 42 is provided between the second gate electrode layer $10b$ and the trench insulating layer 16.

A part of the second dielectric layer 42 is a ferroelectric. A part of the second dielectric layer 42 serves as a gate insulating layer of the transistor of the memory cell MC3.

The first dielectric layer 41 and the second dielectric layer 42 are spaced apart from each other in the y direction.

The first dielectric layer 41 and the second dielectric layer 42 contain oxygen (O) and at least one of hafnium (Hf) and zirconium (Zr). The first dielectric layer 41 and the second dielectric layer 42 contain an oxide containing at least one of hafnium oxide or zirconium oxide. The first dielectric layer 41 and the second dielectric layer 42 are, for example, hafnium oxide layers. The first dielectric layer 41 and the second dielectric layer 42 are, for example, zirconium oxide layers. Thicknesses of the first dielectric layer 41 and the second dielectric layer 42 in the y direction are, for example, 5 nm or more and 40 nm or less.

The trench insulating layer 16 is provided between the first gate electrode layer $10a$ and the second gate electrode layer $10b$. The trench insulating layer 16 is provided between the third gate electrode layer $10c$ and the fourth gate electrode layer $10d$. The trench insulating layer 16 is provided between the first dielectric layer 41 and the second dielectric layer 42.

The trench insulating layer 16 is, for example, an oxide, an oxynitride, or a nitride. The trench insulating layer 16 contains, for example, silicon oxide or aluminum oxide. The trench insulating layer 16 is, for example, a silicon oxide layer or an aluminum oxide layer.

The interlayer insulating layer 18 is provided between the first gate electrode layer $10a$ and the third gate electrode layer $10c$, and between the second gate electrode layer $10b$ and the fourth gate electrode layer $10d$.

The interlayer insulating layer 18 is, for example, an oxide, an oxynitride, or a nitride. The interlayer insulating layer 18 contains, for example, silicon oxide. The interlayer insulating layer 18 is, for example, a silicon oxide layer. A thickness of the interlayer insulating layer 18 in the z direction is, for example, 5 nm or more and 30 nm or less.

The core insulating layer 20 is provided between the first semiconductor layer $12a$ and the third semiconductor layer $12c$.

The core insulating layer 20 is, for example, an oxide, an oxynitride, or a nitride. The core insulating layer 20 contains, for example, silicon oxide. The core insulating layer 20 contains, for example, silicon oxide or aluminum oxide. The core insulating layer 20 is, for example, a silicon oxide layer or an aluminum oxide layer. A material of the core insulating layer 20 is different from a material of the trench insulating layer 16, for example. Chemical composition of the core insulating layer 20 is different from the chemical composition of the trench insulating layer 16, for example.

The first dielectric layer 41 and the second dielectric layer 42 contain an oxide containing at least any one of hafnium oxide and zirconium oxide. A part of the first dielectric layer 41 and the second dielectric layer 42 is a ferroelectric and another part is a paraelectric.

The first dielectric layer 41 and the second dielectric layer 42 contain, for example, hafnium oxide as a main component. The fact that the hafnium oxide is the main component means that a mole fraction of hafnium oxide is the highest among substances contained in the first dielectric layer 41 and the second dielectric layer 42. The mole fraction of hafnium oxide is, for example, equal to or more than 90%.

The first dielectric layer 41 and the second dielectric layer 42 contain, for example, zirconium oxide as a main component. The fact that zirconium oxide is the main component means that a mole fraction of zirconium oxide is the highest among substances contained in the first dielectric layer 41 and the second dielectric layer 42.

The mole fraction of zirconium oxide contained in the first dielectric layer 41 and the second dielectric layer 42 is, for example, 40% or more and 60% or less. An oxide contained in the first dielectric layer 41 and the second dielectric layer 42 is, for example, a mixed crystal of hafnium oxide and zirconium oxide.

Hafnium oxide has ferroelectricity in a case where this is crystals of an orthorhombic crystal system or a trigonal crystal system. Hafnium oxide is a ferroelectric in a case where this is the crystals of the orthorhombic crystal system or trigonal crystal system.

Hafnium oxide having ferroelectricity has ferroelectricity in a case where this is, for example, crystals of a third orthorhombic crystal system (orthorhombic III; space group Pbc2$_1$, and space group number 29), or a trigonal crystal system (trigonal; space group R3m, P3, or R3, and space group number 160, 143, or 146).

Hafnium oxide does not have ferroelectricity in a case where this is crystals other than the crystals of the orthorhombic crystal system or trigonal crystal system, or this is an amorphous substance. Hafnium oxide is a paraelectric in a case where this is the crystals other than the crystals of the orthorhombic crystal system or trigonal crystal system, or this is the amorphous substance. The crystals other than the orthorhombic crystal system or trigonal crystal system is crystals of a cubic crystal system, a hexagonal crystal system, a tetragonal crystal system, a monoclinic crystal system, or a triclinic crystal system.

Zirconium oxide has ferroelectricity in a case where this is crystals of an orthorhombic crystal system or a trigonal crystal system. Zirconium oxide is a ferroelectric in a case where this is the crystals of the orthorhombic crystal system or trigonal crystal system.

Zirconium oxide having ferroelectricity has ferroelectricity in a case where this is, for example, crystals of a third orthorhombic crystal system (orthorhombic III; space group Pbc2$_1$, and space group number 29), or a trigonal crystal system (trigonal; space group R3m, P3, or R3, and space group number 160, 143, or 146).

Zirconium oxide does not have ferroelectricity in a case where this is crystals other than the crystals of the orthorhombic crystal system or trigonal crystal system, or this is an amorphous substance. Zirconium oxide is a paraelectric in a case where this is the crystals other than the crystals of the orthorhombic crystal system or trigonal crystal system, or this is the amorphous substance.

The first dielectric layer 41 and the second dielectric layer 42 contain at least one additive element selected from the group consisting of, for example, silicon (Si), zirconium (Zr), aluminum (Al), yttrium (Y), strontium (Sr), lanthanum (La), samarium (Sm), gadolinium (Gd), terbium (Tb), dysprosium (Dy), holmium (Ho), erbium (Er), ytterbium (Yb), lutetium (Lu), and barium (Ba). An oxide contained in the first dielectric layer 41 and the second dielectric layer 42 contains the above-described additive element. In a case where the oxide is hafnium oxide, hafnium oxide easily displays ferroelectricity when this contains the above-described additive element.

The first dielectric layer 41 includes a ferroelectric region 41$a$, a ferroelectric region 41$b$, a ferroelectric region 41$c$, and a paraelectric region 41$d$.

The ferroelectric region 41$a$ is an example of a first region. The ferroelectric region 41$b$ is an example of a second region. The paraelectric region 41$d$ is an example of a third region.

The ferroelectric region 41$a$ is provided between the first gate electrode layer 10$a$ and the first semiconductor layer 12$a$. The ferroelectric region 41$b$ is provided between the first gate electrode layer 10$a$ and the second semiconductor layer 12$b$. The ferroelectric region 41$c$ is provided between the third gate electrode layer 10$c$ and the first semiconductor layer 12$a$.

The paraelectric region 41$d$ is provided between the ferroelectric region 41$a$ and the ferroelectric region 41$b$. The paraelectric region 41$d$ is provided between the first gate electrode layer 10$a$ and the trench insulating layer 16. The trench insulating layer 16 is provided between the paraelectric region 41$d$ and the second gate electrode layer 10$b$. The trench insulating layer 16 is in contact with the paraelectric region 41$d$.

The second dielectric layer 42 includes a ferroelectric region 42$a$. The ferroelectric region 42$a$ is an example of a fourth region.

The ferroelectric region 42$a$ is provided between the second gate electrode layer 10$b$ and the third semiconductor layer 12$c$.

The ferroelectric region 41$a$, the ferroelectric region 41$b$, the ferroelectric region 41$c$, and the ferroelectric region 42$a$ have crystals of an orthorhombic crystal system or a trigonal crystal system as a main component substance. The fact that the crystals of the orthorhombic crystal system or trigonal crystal system is the main component substance means that the crystals of the orthorhombic crystal system or trigonal crystal system has the highest existence ratio among substances forming the ferroelectric region 41$a$, the ferroelectric region 41$b$, the ferroelectric region 41$c$, and the ferroelectric region 42$a$.

In the ferroelectric region 41$a$, the ferroelectric region 41$b$, the ferroelectric region 41$c$, and the ferroelectric region 42$a$, the existence ratio of the crystals of the orthorhombic crystal system or trigonal crystal system is larger than that of the crystals other than the crystals of the orthorhombic crystal system or trigonal crystal system or an amorphous phase. The ferroelectric region 41$a$, the ferroelectric region 41$b$, the ferroelectric region 41$c$, and the ferroelectric region 42$a$ are crystalline substances.

The ferroelectric region 41$a$, the ferroelectric region 41$b$, the ferroelectric region 41$c$, and the ferroelectric region 42$a$ are ferroelectric. An oxide contained in the ferroelectric region 41$a$, the ferroelectric region 41$b$, the ferroelectric region 41$c$, and the ferroelectric region 42$a$ is a ferroelectric.

Each of the ferroelectric region 41$a$, the ferroelectric region 41$b$, the ferroelectric region 41$c$, and the ferroelectric region 42a having ferroelectricity serves as the gate insulating layer of the FeFET of the memory cell MC.

The paraelectric region 41d has a substance other than the crystals of the orthorhombic crystal system or trigonal crystal system as a main component substance. The fact that the substance other than the crystals of the orthorhombic crystal system or trigonal crystal system is the main component substance means that the substance other than the crystals of the orthorhombic crystal system or trigonal crystal system has the highest existence ratio among the substances forming the paraelectric region 41d.

In the paraelectric region 41d, the existence ratio of the crystals other than the crystals of the orthorhombic crystal system or trigonal crystal system or an amorphous phase is larger than that of the crystals of the orthorhombic crystal system or trigonal crystal system. The paraelectric region 41d is a crystalline substance or an amorphous substance.

The paraelectric region 41d is a paraelectric. An oxide contained in the paraelectric region 41d is a paraelectric.

Next, an example of a method of manufacturing the semiconductor memory device of the fifth embodiment is described.

FIGS. 46, 47, 48, 49, 50, 51, 52, 53, and 54 are schematic cross-sectional views illustrating the method of manufacturing the semiconductor memory device of the fifth embodiment. FIGS. 46 to 54 are views illustrating an example of a method of manufacturing the memory cell array 501 of the three-dimensional ferroelectric memory 500.

Upper views in FIGS. 46 to 54 are xy cross-sections of the memory cell array 501. The upper views in FIGS. 46 to 54 are views corresponding to a part of FIG. 44. Lower views in FIGS. 46 to 54 are yz cross-sections of the memory cell array 501. The lower views in FIGS. 46 to 54 are views corresponding to FIG. 45.

Figure 46:
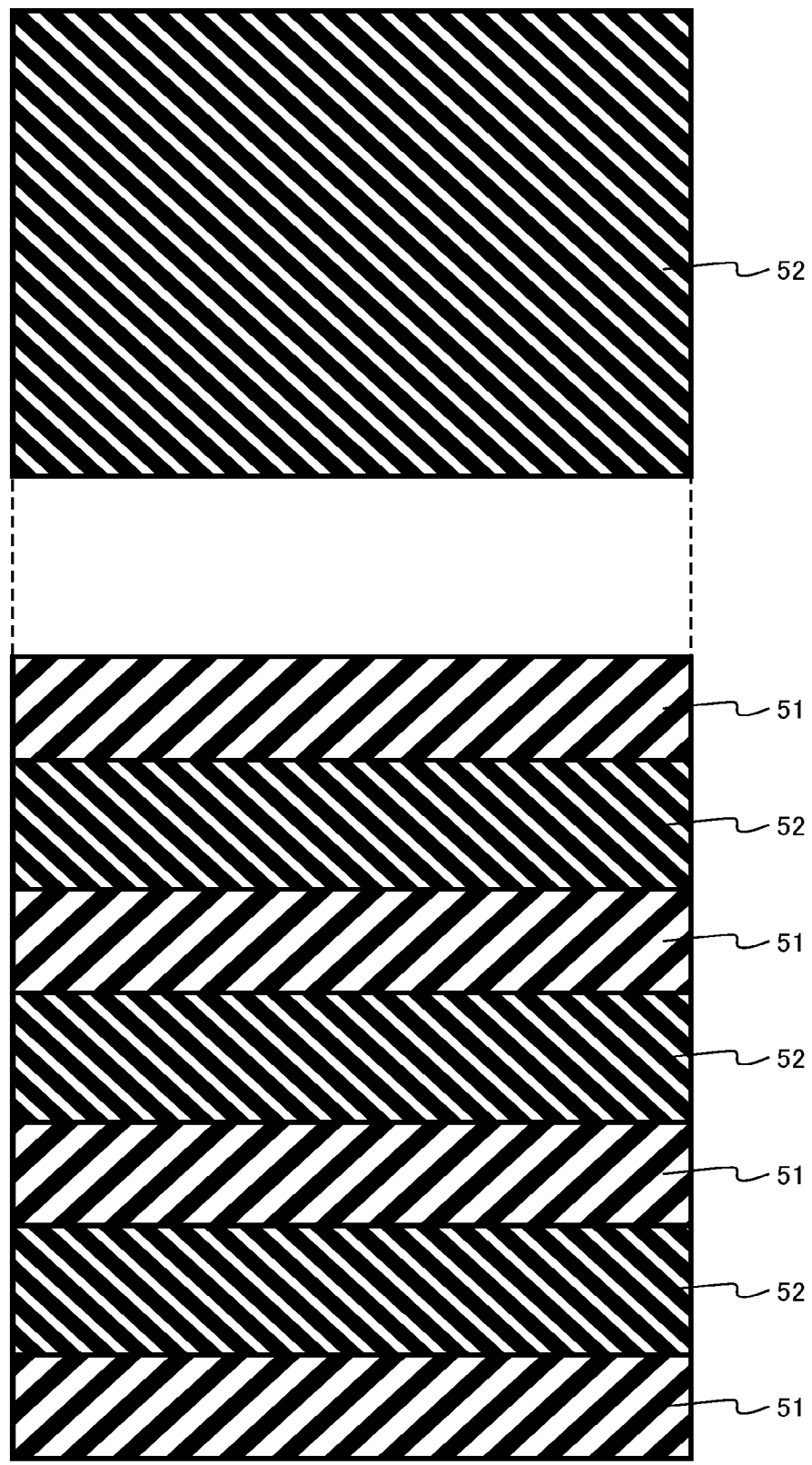
FIG. 46 is a schematic cross-sectional view illustrating a method of manufacturing the semiconductor memory device of the fifth embodiment.

First, a plurality of silicon oxide layers 51 and a plurality of silicon nitride layers 52 are alternately stacked on a semiconductor substrate not illustrated (FIG. 46).

The silicon oxide layer 51 and the silicon nitride layer 52 are formed by, for example, a CVD method.

A part of the silicon oxide layer 51 finally becomes the interlayer insulating layer 18.

Figure 47:
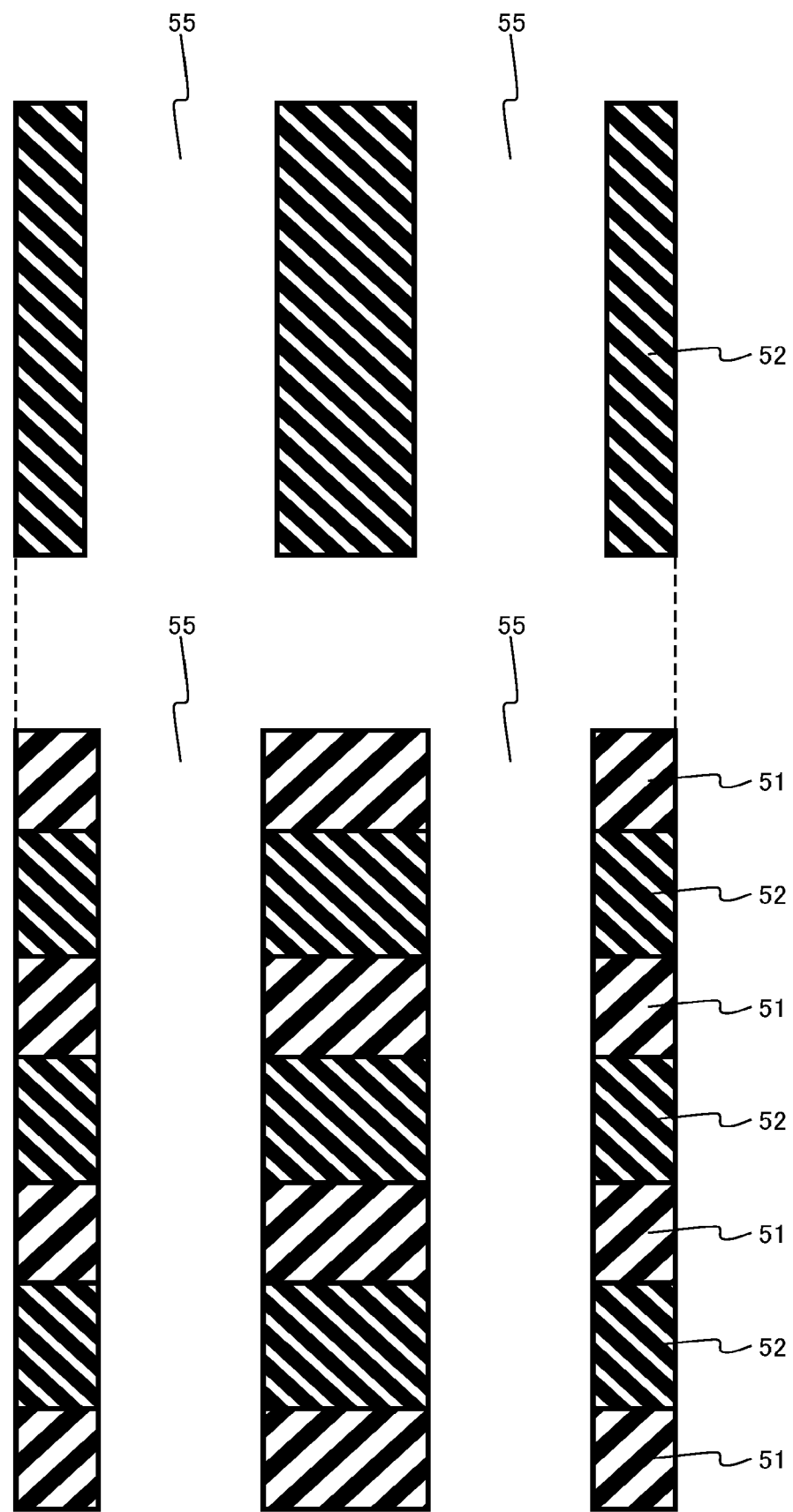
FIG. 47 is a schematic cross-sectional view illustrating the method of manufacturing the semiconductor memory device of the fifth embodiment.

Next, a memory trench 55 is formed in a plurality of silicon oxide layers 51 and a plurality of silicon nitride layers 52 (FIG. 47). The memory trench 55 penetrates a plurality of silicon oxide layers 51 and a plurality of silicon nitride layers 52.

The memory trench 55 is formed by, for example, a lithography method and a RIE method.

Figure 48:
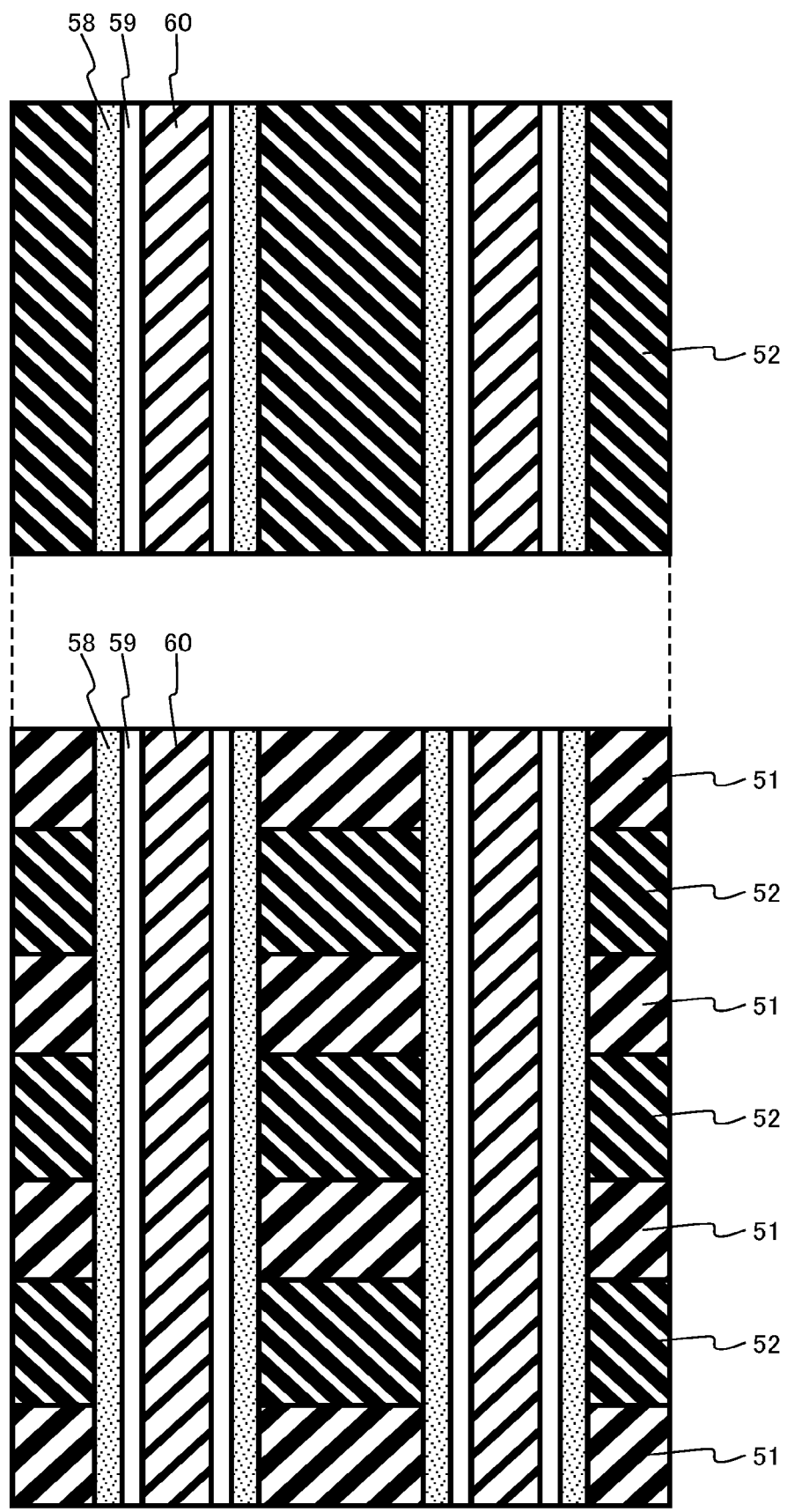
FIG. 48 is a schematic cross-sectional view illustrating the method of manufacturing the semiconductor memory device of the fifth embodiment.

Next, a hafnium oxide layer 58, a polycrystalline silicon layer 59, and a silicon oxide layer 60 are formed in the memory trench 55 (FIG. 48). The hafnium oxide layer 58 is formed by, for example, an ALD method. The polycrystalline silicon layer 59 and the silicon oxide layer 60 are formed by, for example, the CVD method.

A part of the hafnium oxide layer 58 finally becomes the first dielectric layer 41 and the second dielectric layer 42. A part of the polycrystalline silicon layer 59 finally becomes a first semiconductor layer 12a, a second semiconductor layer 12b, and a third semiconductor layer 12c. A part of the silicon oxide layer 60 finally becomes the core insulating layer 20.

Figure 49:
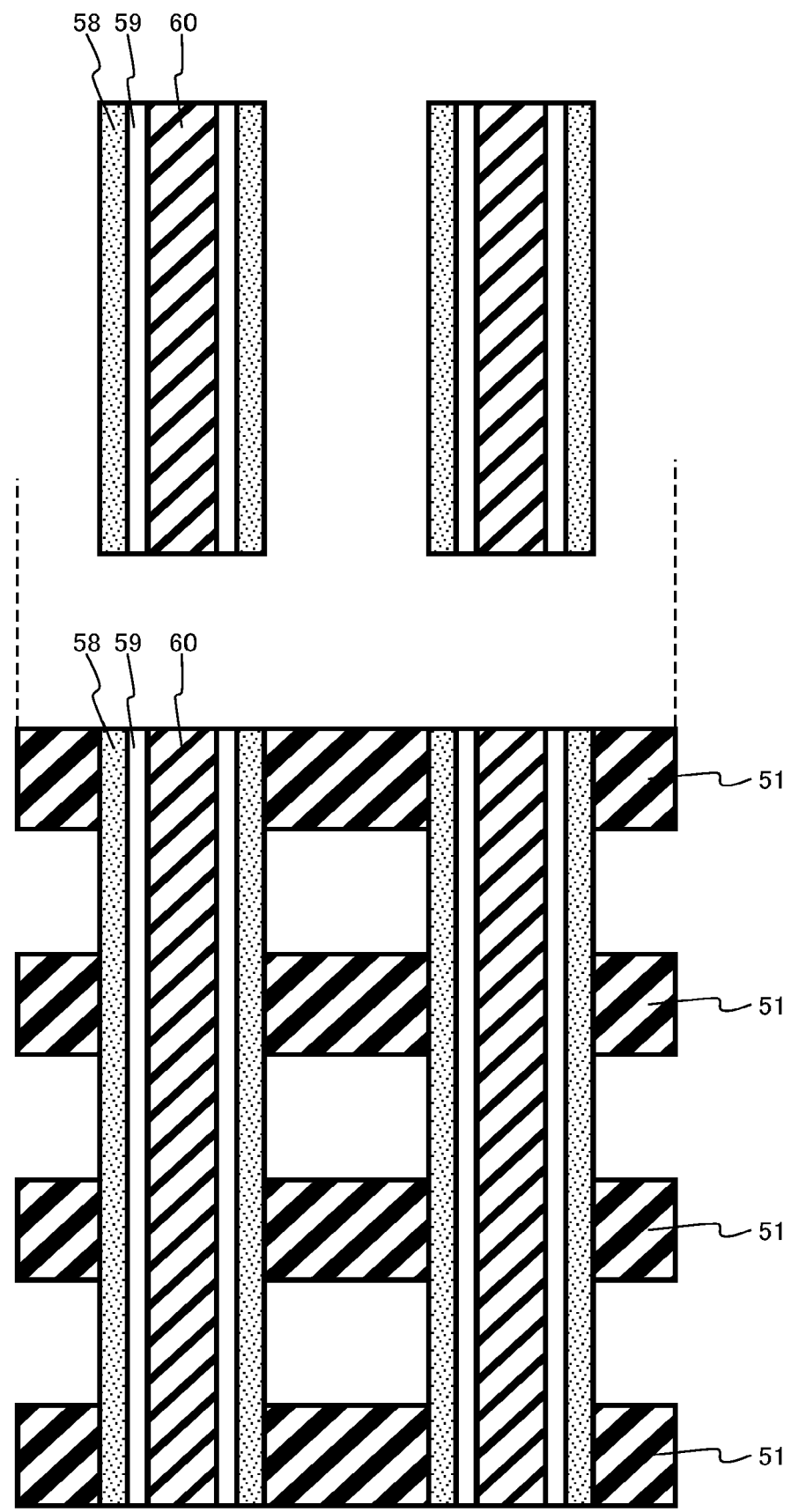
FIG. 49 is a schematic cross-sectional view illustrating the method of manufacturing the semiconductor memory device of the fifth embodiment.

Next, a plurality of silicon nitride layers 52 is removed (FIG. 49). A plurality of silicon nitride layers 52 is removed by a wet etching method using, for example, an opening not illustrated.

Figure 50:
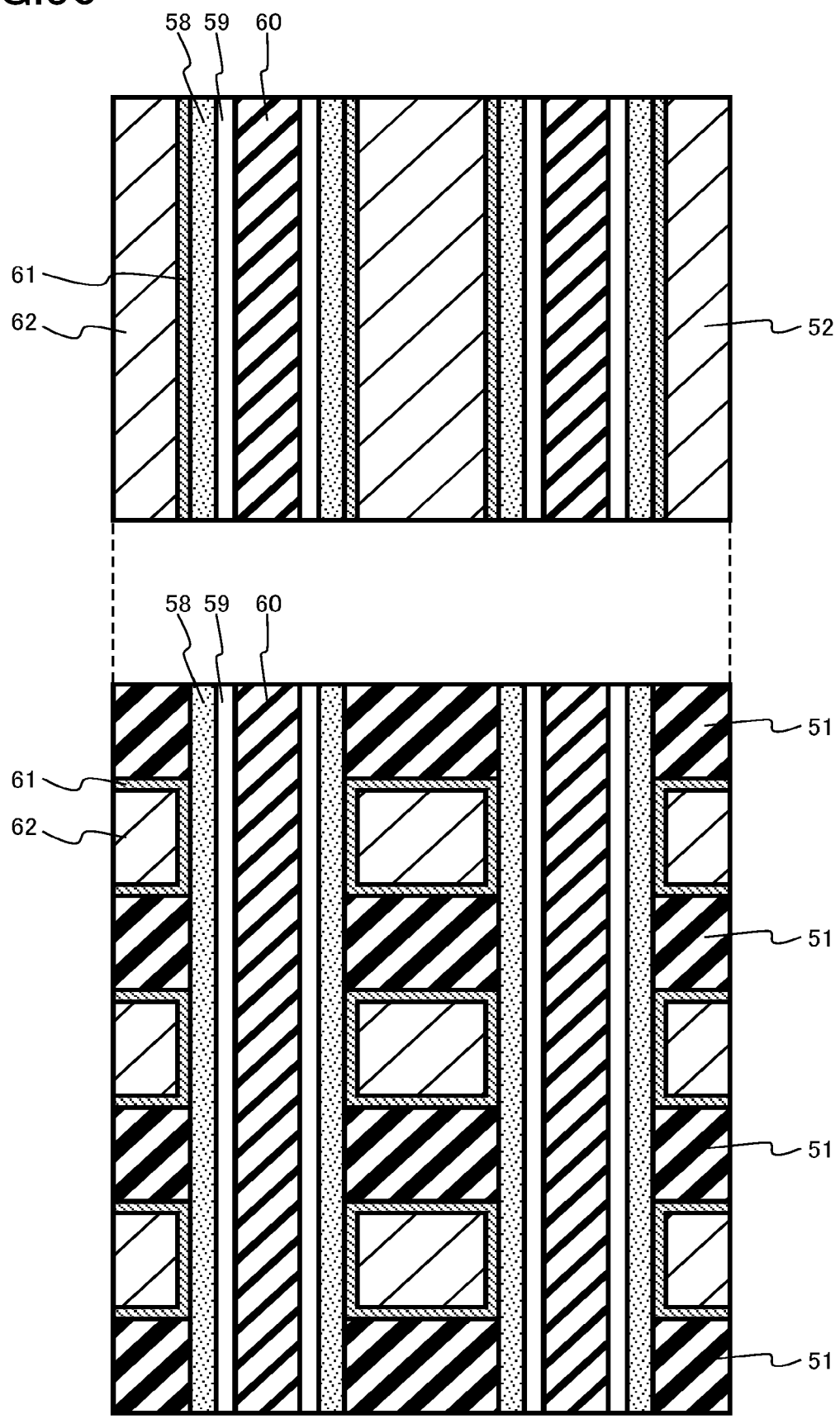
FIG. 50 is a schematic cross-sectional view illustrating the method of manufacturing the semiconductor memory device of the fifth embodiment.

Next, a titanium nitride layer 61 and a tungsten layer 62 are formed (FIG. 50). The titanium nitride layer 61 and the tungsten layer 62 are formed by, for example, the CVD method.

The titanium nitride layer 61 finally becomes the barrier metal layers 10ax, 10bx, 10cx, and 10dx. The tungsten layer 62 finally becomes the metal layer 10ay, the metal layer 10by, the metal layer 10cy, and the metal layer 10dy.

Figure 51:
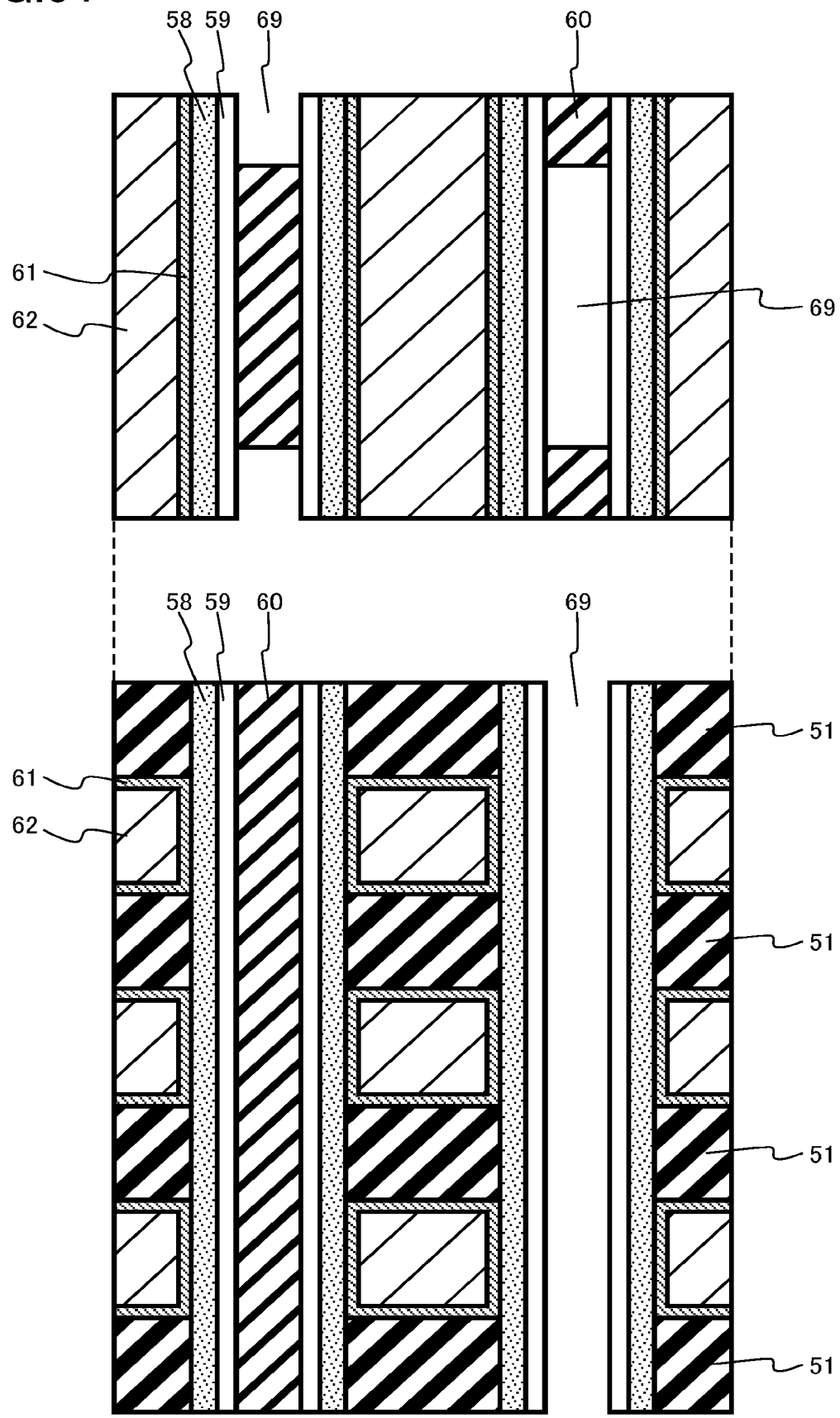
FIG. 51 is a schematic cross-sectional view illustrating the method of manufacturing the semiconductor memory device of the fifth embodiment.

Next, a part of the silicon oxide layer 60 is removed to form an opening 69 (FIG. 51). The opening 69 is formed, for example, by the RIE method using a patterned hard mask layer not illustrated as a mask.

Figure 52:
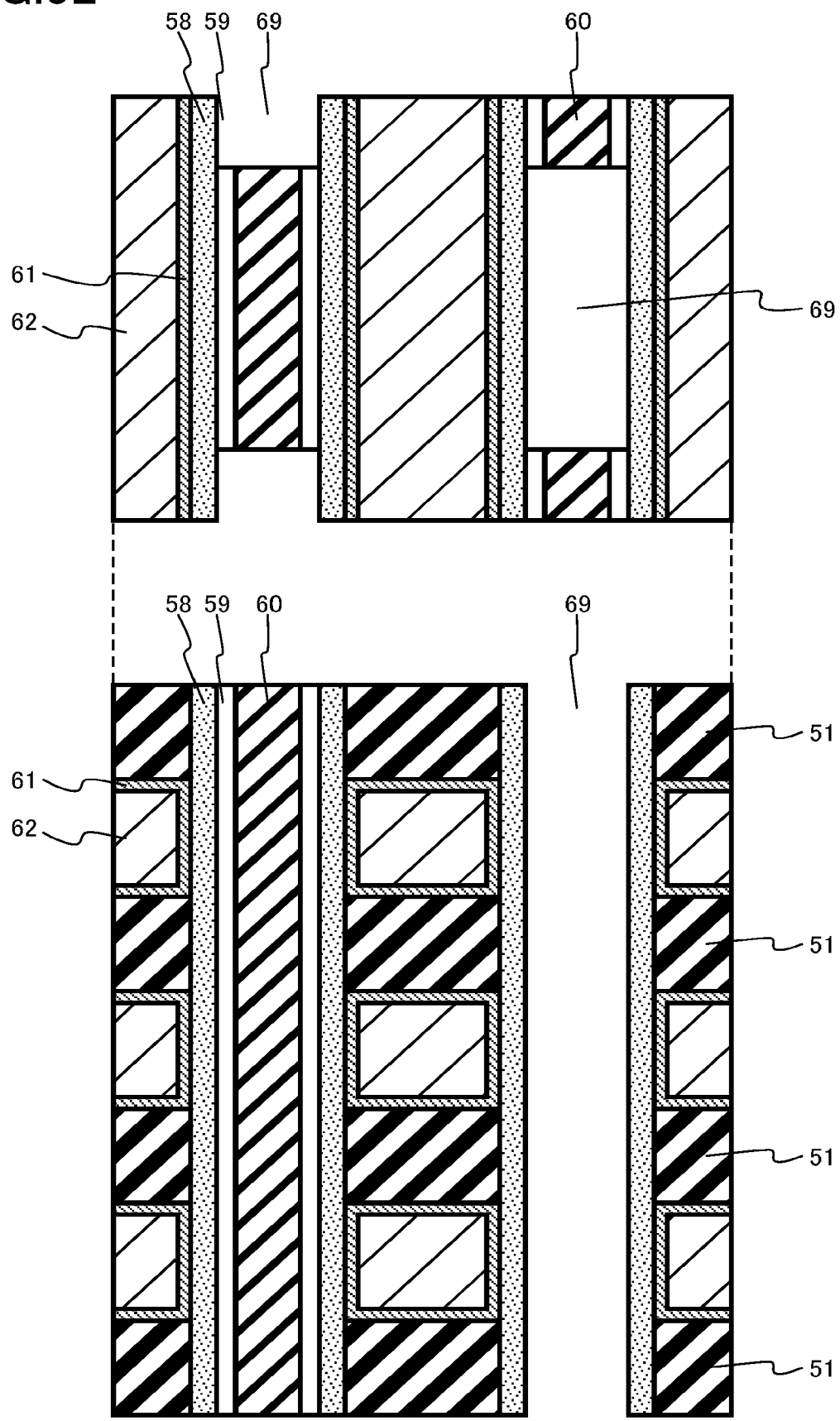
FIG. 52 is a schematic cross-sectional view illustrating the method of manufacturing the semiconductor memory device of the fifth embodiment.

Next, a part of the polycrystalline silicon layer 59 exposed to the opening 69 is removed (FIG. 52). The polycrystalline silicon layer 59 is removed by, for example, wet etching.

Figure 53:
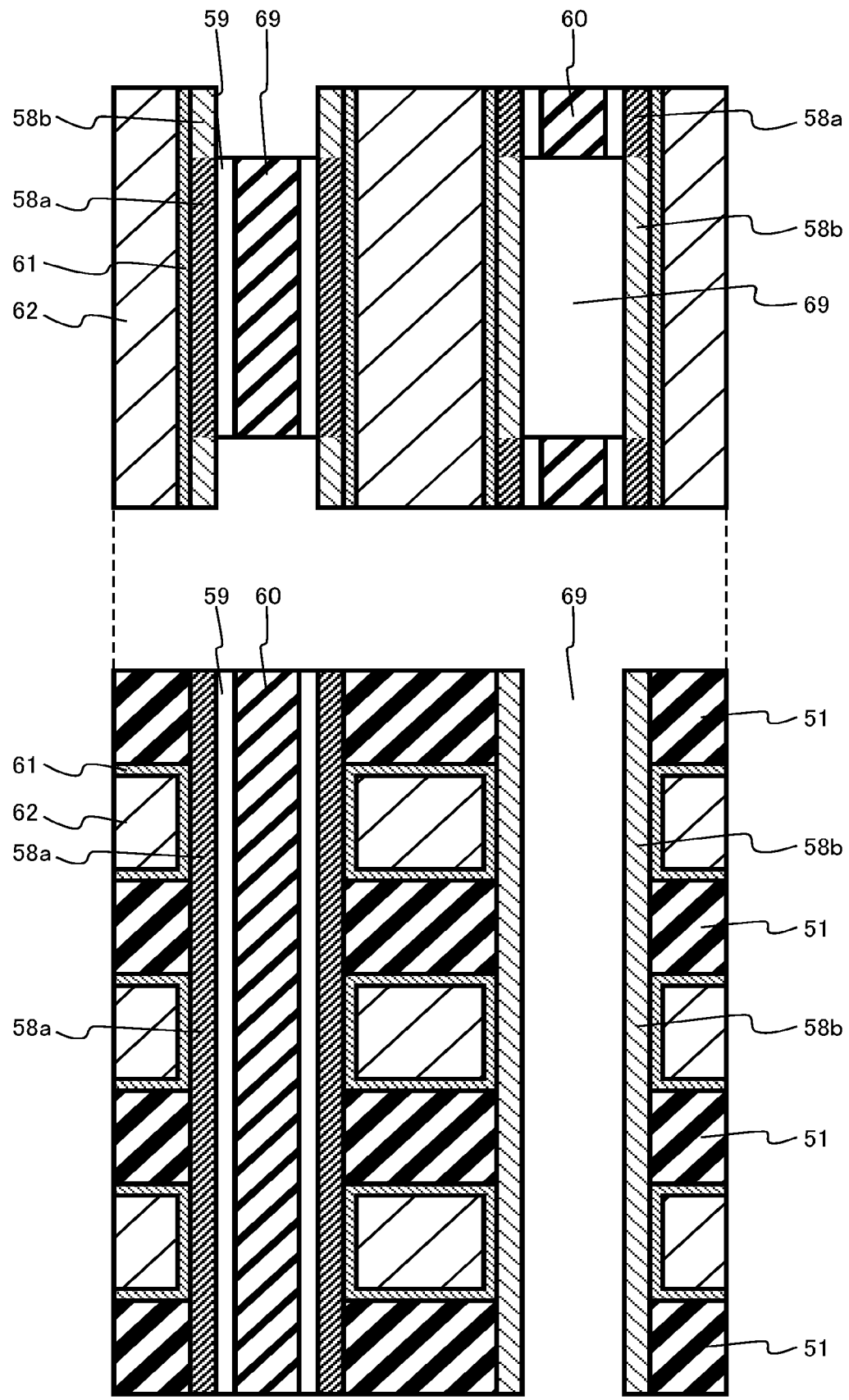
FIG. 53 is a schematic cross-sectional view illustrating the method of manufacturing the semiconductor memory device of the fifth embodiment.

Next, heat treatment is performed to crystallize the hafnium oxide layer 58 (FIG. 53). The heat treatment is performed, for example, in a nitrogen gas atmosphere at temperature of 600° C. or higher and 1050° C. or lower. The heat treatment is so-called crystallization annealing.

By the heat treatment, in the hafnium oxide layer 58, a region 58a interposed between the polycrystalline silicon layer 59 and the titanium nitride layer 61 becomes crystals of an orthorhombic crystal system or a trigonal crystal system by an applied stress. On the other hand, since the stress applied to a region 58b interposed between the titanium nitride layer 61 and the opening 69 is small, the region becomes crystals other than the crystals of the orthorhombic crystal system or trigonal crystal system or an amorphous phase.

In other words, the region 58a interposed between the polycrystalline silicon layer 59 and the titanium nitride layer 61 becomes a ferroelectric. The region 58b interposed between the titanium nitride layer 61 and the opening 69 becomes a paraelectric.

The region 58a interposed between the polycrystalline silicon layer 59 and the titanium nitride layer 61 finally becomes the ferroelectric region 41a, the ferroelectric region 41b, the ferroelectric region 41c, and the ferroelectric region 42a. The region 58b interposed between the titanium nitride layer 61 and the opening 69 finally becomes the paraelectric region 41d.

Figure 54:
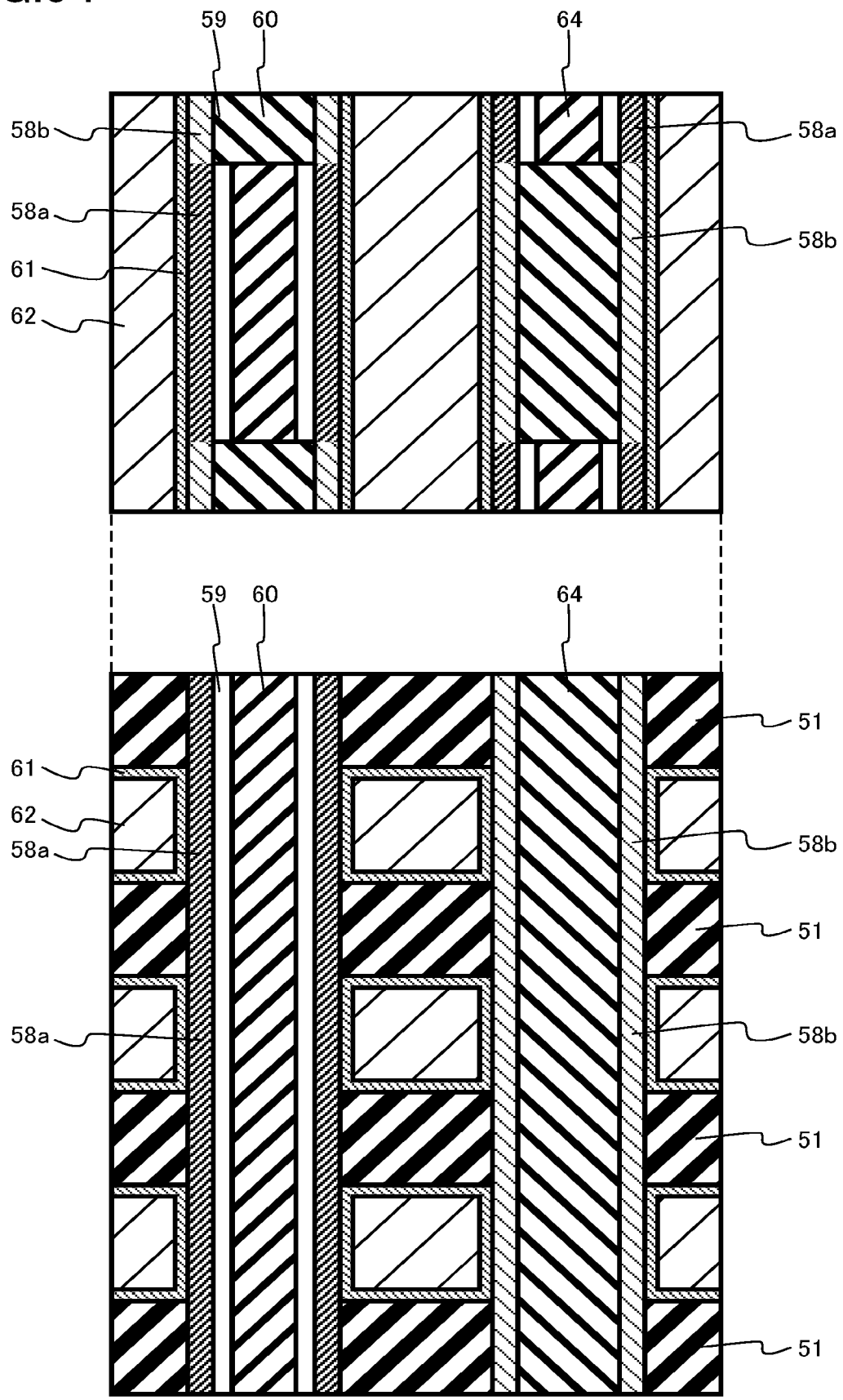
FIG. 54 is a schematic cross-sectional view illustrating the method of manufacturing the semiconductor memory device of the fifth embodiment.

Next, a silicon oxide layer 64 is buried in the opening 69 (FIG. 54). The silicon oxide layer 64 finally becomes the trench insulating layer 16.

By the above-described manufacturing method, the memory cell array 501 of the three-dimensional ferroelectric memory 500 of the fifth embodiment is manufactured.

Note that it is also possible to form an aluminum oxide layer in the opening 69 before the heat treatment, and then perform the heat treatment. By this method also, a region interposed between the titanium nitride layer 61 and the aluminum oxide layer becomes a paraelectric.

Next, a function and an effect of the semiconductor memory device of the fifth embodiment are described.

A three-dimensional NAND flash memory in which memory cells are disposed three-dimensionally realizes a high degree of integration and a low cost. In the three-dimensional NAND flash memory, for example, a memory hole penetrating a stack is formed in the stack obtained by alternately stacking a plurality of insulating layers and a plurality of gate electrode layers. By applying the FeFET type three-terminal memory as the memory cell of the three-dimensional NAND flash memory, the gate insulating layer may be thinned. Therefore, a hole diameter of the memory hole may be reduced, and the memory cell may be scaled-down. Therefore, by applying the FeFET type three-terminal memory, it becomes possible to further increase the degree of integration of the memory.

As the memory cell is scaled-down, for example, control of a polarization state of the ferroelectric layer serving as the gate insulating layer might become difficult, and an operation of the memory cell might become unstable. Therefore, it is desired to realize a memory provided with the memory cell that operates stably even in a case where the memory cell is scaled-down.

In the memory cell array 501 of the three-dimensional ferroelectric memory 500 of the fifth embodiment, the first dielectric layer 41 is divided into the ferroelectric region 41a, the ferroelectric region 41b, and the paraelectric region 41d, for example. The ferroelectric region 41a serving as the gate insulating layer of the memory cell MC1 and the ferroelectric region 41b serving as the gate insulating layer of the memory cell MC2 are divided by the paraelectric region 41d.

Therefore, for example, at the time of write operation to the memory cell MC1, the polarization inversion of the first dielectric layer 41 is suppressed from unintentionally proceeding to a side of the memory cell MC2. That is, controllability of the polarization state of the first dielectric layer 41 is improved. Therefore, for example, erroneous write to the memory cell MC2 is suppressed. Therefore, interference between the memory cell MC1 and the memory cell MC2 is suppressed.

As described above, according to the fifth embodiment, the semiconductor memory device that operates stably with improved controllability of the polarization state of the ferroelectric layer may be realized.

Sixth Embodiment

A first dielectric layer is different from that of the semiconductor memory device of the fifth embodiment in further including a fifth region adjacent to a first region in a third direction, the fifth region having a substance other than at least one crystal of an orthorhombic crystal system or a trigonal crystal system as a main component substance. Hereinafter, a part of description of contents overlapped with those of the fifth embodiment is not repeated sometimes.

Figure 55:
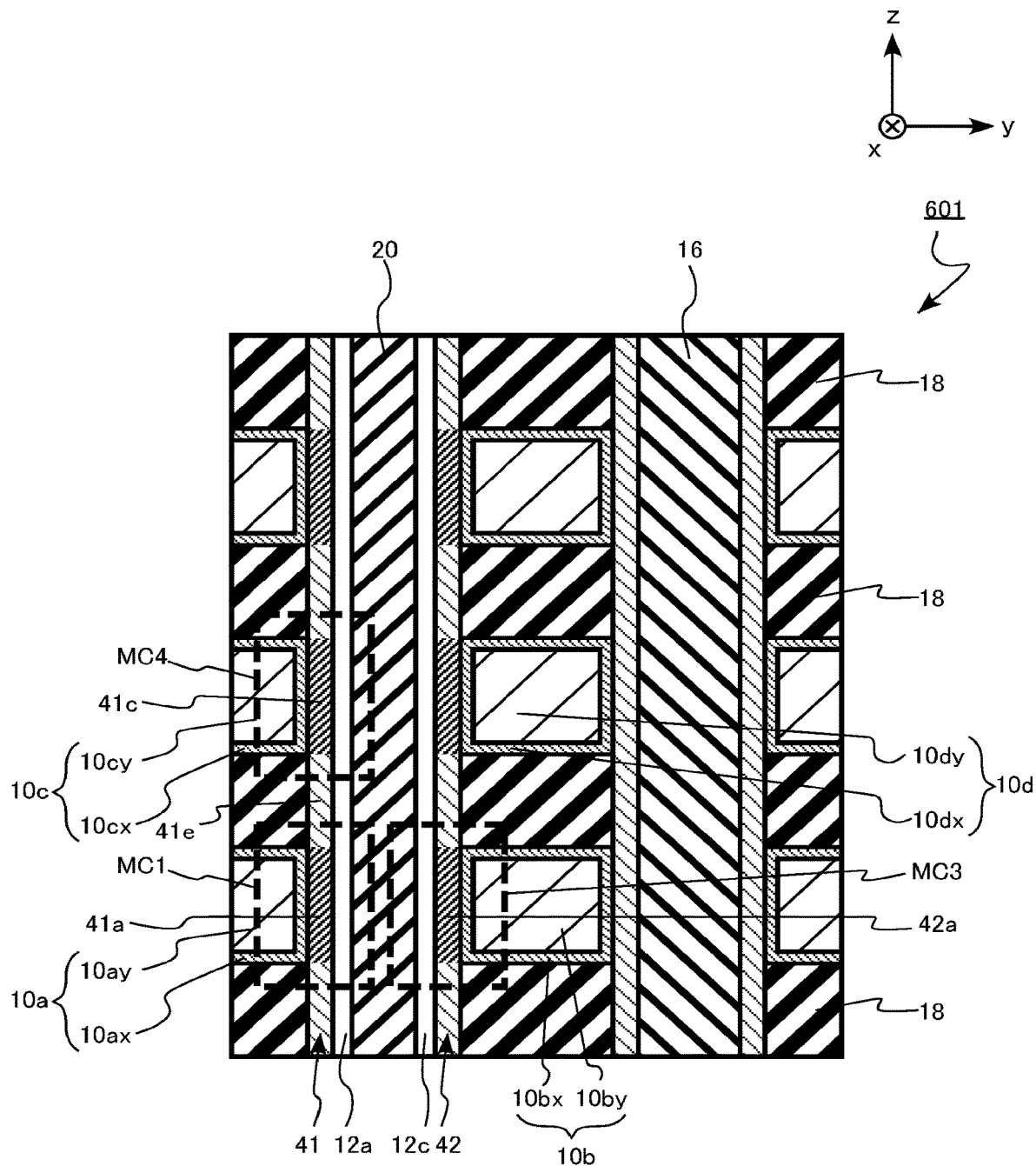
FIG. 55 is a schematic cross-sectional view of a part of a memory cell array of a semiconductor memory device of a sixth embodiment.

FIG. 55 is a schematic cross-sectional view of a part of a memory cell array of the semiconductor memory device of the sixth embodiment. FIG. 55 is a yz cross-section of a memory cell array 601. FIG. 55 is a cross-section corresponding to FIG. 45.

In FIG. 55, a region enclosed by a broken line is one memory cell MC. FIG. 55 illustrates memory cells MC1 and MC3 adjacent to each other in a y direction, and a memory cell MC4 adjacent to the memory cell MC1 in a z direction.

The memory cell array 501 is provided with a first gate electrode layer 10a, a second gate electrode layer 10b, a third gate electrode layer 10c, a fourth gate electrode layer 10d, a first semiconductor layer 12a, a second semiconductor layer 12b, a third semiconductor layer 12c, a trench insulating layer 16, an interlayer insulating layer 18, a core insulating layer 20, a first dielectric layer 41, and a second dielectric layer 42.

The trench insulating layer 16 is an example of a first insulating layer. The interlayer insulating layer 18 is an example of a second insulating layer.

The interlayer insulating layer 18 is provided between the first gate electrode layer 10a and the third gate electrode layer 10c, and between the second gate electrode layer 10b and the fourth gate electrode layer 10d.

The interlayer insulating layer 18 contains aluminum oxide. The interlayer insulating layer 18 is, for example, an aluminum oxide layer.

The first dielectric layer 41 includes a paraelectric region 41e. The paraelectric region 41e is provided between a ferroelectric region 41a and a ferroelectric region 41c. The paraelectric region 41e is provided between the interlayer insulating layer 18 and the first semiconductor layer 12a.

The paraelectric region 41e is an example of the fifth region.

The paraelectric region 41e has a substance other than at least one crystal of an orthorhombic crystal system or a trigonal crystal system as a main component substance. In the paraelectric region 41e, an existence ratio of crystals other than the crystals of the orthorhombic crystal system or trigonal crystal system or an amorphous phase is larger than that of the crystals of the orthorhombic crystal system or trigonal crystal system. The paraelectric region 41e is a crystalline substance or an amorphous substance.

The paraelectric region 41d is a paraelectric. An oxide contained in the paraelectric region 41d is a paraelectric.

The memory cell array 601 of the sixth embodiment may be formed by alternately stacking a plurality of aluminum oxide layers in place of silicon oxide layers 51 and a plurality of silicon nitride layers 52 on a semiconductor substrate at a step illustrated in FIG. 46 of the method of manufacturing the semiconductor memory device of the fifth embodiment, for example. When a hafnium oxide layer is in contact with the aluminum oxide layer at the time of crystallization annealing of crystallizing the hafnium oxide layer, growth of the crystals of the orthorhombic crystal system or trigonal crystal system in the hafnium oxide layer is suppressed.

In the memory cell array 601 of a three-dimensional ferroelectric memory 600 of the sixth embodiment, the first dielectric layer 41 is divided into the ferroelectric region 41a, the paraelectric region 41e, and the ferroelectric region 41c in the z direction. The ferroelectric region 41a of the memory cell MC1 and the ferroelectric region 41c of the memory cell MC4 adjacent to the memory cell MC1 in the z direction are divided by the paraelectric region 41e.

Therefore, for example, at the time of write operation to the memory cell MC1, polarization inversion of the first dielectric layer 41 is suppressed from unintentionally proceeding to a side of the memory cell MC4. That is, controllability of the polarization state of the first dielectric layer 41 is improved. Therefore, for example, erroneous write to the memory cell MC4 is suppressed. Therefore, interference between the memory cells MCs is further suppressed as compared to that in the semiconductor memory device of the fifth embodiment.

As described above, according to the sixth embodiment, the semiconductor memory device that operates further stably with further improved controllability of the polarization state of the ferroelectric layer as compared to that of the fifth embodiment may be realized.

While certain embodiments have been described, these embodiments have been presented by way of example only, and are not intended to limit the scope of the inventions. Indeed, the semiconductor device and the semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a first gate electrode layer extending in a first direction;
a second gate electrode layer extending in the first direction, and the second gate electrode layer spaced from the first gate electrode layer in a second direction orthogonal to the first direction;
a semiconductor layer provided between the first gate electrode layer and the second gate electrode layer, a longitudinal direction of the semiconductor layer extending in a third direction orthogonal to the first direction and the second direction; and
a dielectric layer surrounding the semiconductor layer, the dielectric layer containing oxygen and at least one of hafnium or zirconium, the dielectric layer including a first region containing at least one crystal of an orthorhombic crystal system or a trigonal crystal system as a main component substance, the first region provided between the first gate electrode layer and the semiconductor layer, the dielectric layer including a second region containing at least one crystal of the orthorhombic crystal system or the trigonal crystal system as a main component substance, the second region provided between the second gate electrode layer and the semiconductor layer, and the dielectric layer including a third region containing a substance other than the at least one crystal of the orthorhombic crystal system or the trigonal crystal system as a main component substance, the third region provided between the first region and the second region.

2. The semiconductor memory device according to claim 1, further comprising:
a first insulating layer provided between the first gate electrode layer and the second gate electrode layer, the first insulating layer being in contact with the third region.

3. The semiconductor memory device according to claim 2, wherein the first insulating layer contains aluminum oxide.

4. The semiconductor memory device according to claim 2, further comprising: a metal oxide layer provided between the first gate electrode layer and the dielectric layer and between the first gate electrode layer and the first insulating layer, the metal oxide layer containing metal oxide containing a metal element different from both of hafnium and zirconium.

5. The semiconductor memory device according to claim 4, wherein the first gate electrode layer contains the metal element.

6. The semiconductor memory device according to claim 4, wherein the metal oxide layer contains titanium oxide.

7. The semiconductor memory device according to claim 1, wherein the first gate electrode layer contains titanium nitride.

8. The semiconductor memory device according to claim 1, wherein a first thickness of the first region in the second direction is thicker than a second thickness of the third region in the first direction.

9. The semiconductor memory device according to claim 1, wherein the first region and the second region are ferroelectric, and the third region is paraelectric.

10. The semiconductor memory device according to claim 1, further comprising:
a third gate electrode layer extending in the first direction, the third gate electrode layer spaced from the first gate electrode layer in the third direction;
a fourth gate electrode layer extending in the first direction, the fourth gate electrode layer spaced from the third gate electrode layer in the second direction, the semiconductor layer provided between the fourth gate electrode layer and the third gate electrode layer; and
a second insulating layer provided between the first gate electrode layer and the third gate electrode layer,
wherein the dielectric layer is provided between the third gate electrode layer and the semiconductor layer, and the dielectric layer is provided between the fourth gate electrode layer and the semiconductor layer.

11. The semiconductor memory device according to claim 10, wherein the second insulating layer contains aluminum oxide.

12. The semiconductor memory device according to claim 10, wherein the dielectric layer further includes a fourth region containing a substance other than the at least one crystal of the orthorhombic crystal system or the trigonal crystal system as a main component substance, the fourth region provided between the second insulating layer and the semiconductor layer.

13. The semiconductor memory device according to claim 1, wherein the dielectric layer contains at least one element selected from the group consisting of silicon (Si), zirconium (Zr), aluminum (Al), yttrium (Y), strontium (Sr), lanthanum (La), samarium (Sm), gadolinium (Gd), terbium (Tb), dysprosium (Dy), holmium (Ho), erbium (Er), ytterbium (Yb), lutetium (Lu), and barium (Ba).

14. The semiconductor memory device according to claim 2, wherein a first distance between the first gate electrode layer and the second gate electrode layer in a first portion is larger than a second distance between the first gate electrode layer and the second gate electrode layer in a second portion,
the semiconductor layer is provided between the first gate electrode layer and the second gate electrode layer in the first portion, and
the first insulating layer is provided between the first gate electrode layer and the second gate electrode layer in the second portion.

15. The semiconductor memory device according to claim 1, further comprising: a third insulating layer extending in the third direction, the third insulating layer surrounded by the semiconductor layer.

16. The semiconductor memory device according to claim 2, further comprising: a third insulating layer extending in the third direction, the third insulating layer surrounded by the semiconductor layer, wherein a material of the first insulating layer is different from a material of the third insulating layer.

* * * * *